(12) United States Patent
Land et al.

(10) Patent No.: US 11,365,124 B2
(45) Date of Patent: *Jun. 21, 2022

(54) HIGH PURITY SIOC AND SIC, METHODS COMPOSITIONS AND APPLICATIONS

(71) Applicant: Pallidus, Inc., Albany, NY (US)

(72) Inventors: Mark S. Land, Houston, TX (US); Ashish P. Diwanji, New Albany, NY (US); Andrew R. Hopkins, Sylvania, OH (US); Walter J. Sherwood, Glenville, NY (US); Douglas M. Dukes, Troy, NY (US); Glenn Sandgren, Boston, MA (US); Brian L. Benac, Hadley, NY (US)

(73) Assignee: Pallidus, Inc., Albany, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/825,162

(22) Filed: Mar. 20, 2020

(65) Prior Publication Data

US 2021/0009430 A1    Jan. 14, 2021

Related U.S. Application Data

(63) Continuation of application No. 15/593,938, filed on May 12, 2017, now Pat. No. 10,597,794, which is a
(Continued)

(51) Int. Cl.
*C01B 32/977* (2017.01)
*C01B 32/956* (2017.01)
(Continued)

(52) U.S. Cl.
CPC .......... *C01B 32/956* (2017.08); *C01B 32/977* (2017.08); *C04B 35/56* (2013.01); *C04B 35/5603* (2013.01); *C04B 35/571* (2013.01); *C04B 35/80* (2013.01); *C08G 77/20* (2013.01); *C08G 77/50* (2013.01); *C08L 83/00* (2013.01); *C08L 83/04* (2013.01); *C30B 23/00* (2013.01); *C30B 23/025* (2013.01); *C30B 29/06* (2013.01); *C30B 29/36* (2013.01); *H01L 21/0262* (2013.01); *H01L 21/02378* (2013.01); *H01L 21/02381* (2013.01); *H01L 21/02529* (2013.01);
(Continued)

(58) Field of Classification Search
None
See application file for complete search history.

(56) References Cited

U.S. PATENT DOCUMENTS 9,657,409 B2 *  5/2017  Sandgren ................ C30B 29/06
2013/0280466 A1 * 10/2013  Zwieback ............... C30B 29/36
                                                            428/64.1

OTHER PUBLICATIONS

Masri, Pierre. "Silicon carbide and silicon carbide-based structures: The physics of epitaxy." Surface science reports 48, No. 1-4 (2002): 1-51. (Year: 2002).*

(Continued)

*Primary Examiner* — Robert S Loewe
(74) *Attorney, Agent, or Firm* — Glen P. Belvis; Belvis Law, LLC.

(57) ABSTRACT

Organosilicon chemistry, polymer derived ceramic materials, and methods. Such materials and methods for making polysilocarb (SiOC) and Silicon Carbide (SiC) materials having 3-nines, 4-nines, 6-nines and greater purity. Processes and articles utilizing such high purity SiOC and SiC.

24 Claims, 9 Drawing Sheets

Related U.S. Application Data continuation of application No. 14/864,539, filed on Sep. 24, 2015, now Pat. No. 9,657,409, and a continuation-in-part of application No. 14/634,814, filed on Feb. 28, 2015, now Pat. No. 10,167,366, and a continuation-in-part of application No. 14/268,150, filed on May 2, 2014, now Pat. No. 9,815,943, and a continuation-in-part of application No. 14/212,896, filed on Mar. 14, 2014, now Pat. No. 9,815,952.

(60) Provisional application No. 62/112,025, filed on Feb. 4, 2015, provisional application No. 62/055,461, filed on Sep. 25, 2014, provisional application No. 62/055,397, filed on Sep. 25, 2014, provisional application No. 62/055,497, filed on Sep. 25, 2014, provisional application No. 61/946,598, filed on Feb. 28, 2014, provisional application No. 61/818,981, filed on May 3, 2013, provisional application No. 61/818,906, filed on May 2, 2013.

(51) Int. Cl.

| | | |
|---|---|---|
| *C30B 23/00* | (2006.01) | |
| *C30B 23/02* | (2006.01) | |
| *C30B 29/36* | (2006.01) | |
| *C30B 29/06* | (2006.01) | |
| *H01L 29/16* | (2006.01) | |
| *H01L 29/66* | (2006.01) | |
| *H01L 21/02* | (2006.01) | |
| *C04B 35/56* | (2006.01) | |
| *C04B 35/571* | (2006.01) | |
| *C08G 77/20* | (2006.01) | |
| *C08G 77/50* | (2006.01) | |
| *C08L 83/04* | (2006.01) | |
| *C04B 35/80* | (2006.01) | |
| *C08L 83/00* | (2006.01) | |
| *C08G 77/12* | (2006.01) | |
| *C08G 77/00* | (2006.01) | |

(52) U.S. Cl.
CPC .... *H01L 29/1608* (2013.01); *H01L 29/66068* (2013.01); *H01L 29/66893* (2013.01); *C04B 2235/3418* (2013.01); *C04B 2235/3826* (2013.01); *C04B 2235/44* (2013.01); *C04B 2235/48* (2013.01); *C04B 2235/483* (2013.01); *C04B 2235/528* (2013.01); *C04B 2235/5427* (2013.01); *C04B 2235/5436* (2013.01); *C04B 2235/6581* (2013.01); *C04B 2235/72* (2013.01); *C04B 2235/77* (2013.01); *C04B 2235/96* (2013.01); *C08G 77/12* (2013.01); *C08G 77/80* (2013.01)

(56) References Cited

OTHER PUBLICATIONS

Zolper, John C., and Marek Skowronski. "Advances in silicon carbide electronics." MRS bulletin 30, No. 4 (2005): 273-278. (Year: 2005).*

Vlaskina, S. I. "Silicon carbide LED." Semiconductor Physics Quantum Electronics & Optoelectronics (2002). (Year: 2002).*

Yang, Yintang, Baoxing Duan, and Xianjun Zhang. "Silicon Carbide Power MESFET." Physics and Technology of Silicon Carbide Devices (2012): 291. (Year: 2012).*

* cited by examiner

HIGH PURITY SIOC AND SIC, METHODS COMPOSITIONS AND APPLICATIONS

This application is a continuation of U.S. patent application Ser. No. 15/593,938 filed Mar. 24, 2020, which is a continuation of U.S. patent application Ser. No. 14/864,539 filed Sep. 24, 2015, which: (i) claims under 35 U.S.C. § 119(e)(1) the benefit of the filing date of Sep. 25, 2014 of U.S. provisional application Ser. No. 62/055,397; (ii) claims under 35 U.S.C. § 119(e)(1) the benefit of the filing date of Sep. 25, 2014 of U.S. provisional application Ser. No. 62/055,461; (iii) claims under 35 U.S.C. § 119(e)(1) the benefit of the filing date of Sep. 25, 2014 of U.S. provisional application Ser. No. 62/055,497; (iv) claims under 35 U.S.C. § 119(e)(1) the benefit of the filing date of Feb. 4, 2015 of U.S. provisional application Ser. No. 62/112,025; (v) is a continuation in part of U.S. patent application Ser. No. 14/268,150 filed May 2, 2014, which claims, under 35 U.S.C. § 119(e)(1), the benefit of the filing date of May 2, 2013 of U.S. provisional application Ser. No. 61/818,906 and the benefit of the filing date of May 3, 2013 of U.S. provisional application Ser. No. 61/818,981; (vi) is a continuation-in-part of U.S. patent application Ser. No. 14/634,814 filed Feb. 28, 2015, which claims under 35 U.S.C. § 119(e)(1) the benefit of the filing date of Feb. 28, 2014 of U.S. provisional application Ser. No. 61/946,598; and (vii) is a continuation in part of U.S. patent application Ser. No. 14/212,896, filed Mar. 14, 2014, the entire disclosures of each of which are incorporated herein by reference.

BACKGROUND OF THE INVENTION

Field of the Invention

The present inventions relate to polyorganic compositions, methods, structures and materials; polymer derived preceramic and ceramic materials and methods; and in particular polysilocarb compositions, methods, structures and materials. The present inventions further relate to methods for making Silicon Carbide (SiC) and SiC compositions, structures, components, materials and apparatus for making these items; methods for making Silicon Carbide (SiC) and SiOC compositions, structures, components, materials and apparatus for making these items; and in particular, to SiC that is made from polysilocarb materials. Polysilocarb materials and methods of making those materials are disclosed and taught in U.S. patent application Ser. Nos. 14/212,896, 14/324,056, 14/268,150 and 14/634,819, the entire disclosures of each of which are incorporated herein by reference.

Materials made of, or derived from, carbosilane or polycarbosilane (Si—C), silane or polysilane (Si—Si), silazane or polysilazane (Si—N—Si), silicon carbide (SiC), carbosilazane or polycarbosilazane (Si—N—Si—C—Si), siloxane or polysiloxanes (Si—O) are known. These general types of materials have great, but unrealized promise; and have failed to find large-scale applications or market acceptance. Instead, their use has been relegated to very narrow, limited, low volume, high priced and highly specific applications, such as a ceramic component in a rocket nozzle, or a patch for the space shuttle. Thus, they have failed to obtain wide spread use as ceramics, and it is believed they have obtained even less acceptance and use for other applications.

To a greater or lesser extent all of these materials and the process used to make them suffer from one or more failings, including for example: they are exceptionally expensive and difficult to make, having costs in the thousands and tens-of-thousands of dollars per pound; they require high and very high purity starting materials; the process in general fails to produce materials having high purity; the process requires hazardous organic solvents such as toluene, tetrahydrofuran (THF), and hexane; the materials are incapable of making non-reinforced structures having any usable strength; the process produces undesirable and hazardous byproducts, such as hydrochloric acid and sludge, which may contain magnesium; the process requires multiple solvent and reagent based reaction steps coupled with curing and pyrolizing steps; the materials are incapable of forming a useful prepreg; and their overall physical properties are mixed, e.g., good temperature properties but highly brittle.

As a result, although believed to have great promise, these types of materials have failed to find large-scale applications or market acceptance and have remained essentially scientific curiosities.

Silicon carbide (SiC), is a compound of silicon (Si) and carbon (C) that has wide ranging uses, applications and potential for future uses. Eugene Acheson is generally credited with developing the first commercial processes for making silicon carbide, which are taught and disclosed in U.S. Pat. No. 492,767 and 560,291, the entire disclosures of each of which are incorporated herein by reference. Silicon carbide is a highly versatile material. Silicon carbide can have several forms, e.g., amorphous, crystalline having many different polytypes, and forming single (or mono-) and polycrystalline structures. Silicon carbide finds applications in among other things, abrasives, friction members, and electronics. Silicon carbide powder, fines, pellets, or other smaller sized and shaped forms, can be joined together by way of a sintering operation to form component parts and structures.

Generally, silicon carbide can function as a semiconductor. As a material it very stable. Silicon carbide is a very hard material. It is essentially chemically inert, and will not react with any materials at room temperature.

In recent years the demand for high purity silicon carbide, and in particular high purity single crystalline carbide materials for use in end products, such as a semiconductor, has been increasing, but is believe to be unmet. For example, "single crystals are gaining more and more importance as substrate[s] for high frequency and high power silicon carbide electronic devices." Wang, et. al, *Synthesis of High Power Sic Powder for High-resistivity SiC Single crystals Growth*, p. 118 (J. Mater. Sic. Technol. Vol. 23, No 1, 2007)(hereinafter Wang). To obtain these high purity silicon carbide end products, silicon carbide powder as a starting or raw material must be exceedingly pure. However, "[c]ommercially available SiC powder is usually synthesized by carbothermal reduction of silica. Unfortunately, it is typically contaminated to the level that makes it unsuitable for SiC growth." Wang, at p. 118.

The longstanding need for, and problem of obtaining high purity silicon carbide, and the failing of the art to provide a viable (both from a technical and economical standpoint) method of obtaining this material was also recognized in Zwieback et al., 2013/0309496 ("Zwieback"), which provides that the "[a]vailability of high-purity SiC source material is important for the growth of SiC single crystals in general, and it is critical for semi-insulating SiC crystals" (Zwieback at ¶ 0007). Zwieback goes on to state that the prior methods including liquid based methods have consistently failed to meet this need: "While numerous modifications of the Acheson process have been developed over the years, the produced SiC material always contain high concentrations of boron, nitrogen aluminum and other metals, and is unsuitable as a source material for the growth of semiconductor-quality SiC crystals" (Zwieback at ¶ 0009); "commercial grade bulk SiC produced by CVD is not pure enough for the use as a source in SiC crystal growth" (Zwieback at ¶ 0010); the liquid process "produced SiC material contains large concentrations of contaminates and is unsuitable for the growth of semiconductor-quality SiC crystals" (Zwieback at ¶ 0011); and, the direct synthesis of SiC provides an impure material that "precludes the use of such material" (Zwieback at ¶ 0015). Zwieback itself seeks to address this long-standing need with a complex, multi-step version of what appears to be the direct process in a stated attempt to provide high purity SiC. It is believed that this process is neither technically or economically viable; and therefor that it cannot solve the longstanding need to provide commercial levels of high purity SiC.

Thus, although there are other known methods of obtaining silicon carbide, it is believed that none of these methods provide the requisite technical, capacity, and economical viability to provide the purity levels, amounts, and low cost required for commercial utilization and applications; and in particular to meet the ever increasing demands for semiconductor grade material, and other developing commercial utilizations and applications. "Among these synthesis methods, only CVD has been successfully used to produce high purity SiC powder, it is not suitable for mass production because of high costs associated with CVD technology." Wang, at p. 118.

CVD generally refers to Chemical Vapor Deposition. CVD is a type of vapor deposition technology. In addition to CVD, vapor deposition technologies would include PVD (Physcial Vapor Deposition), plasma enhanced CVD, Physical Vapor Transport (PVT) and others.

Thus, for these end products, and uses, among others that require high purity materials, there is an ever increasing need for low cost silicon carbide raw material that has a purity of at least about 99.9%, at least about 99.99%, at least about 99.999%, and least about 99.9999% and at least about 99.99999% or greater. However, it is believe that prior to embodiments of the present inventions, for all practical purposes, this need has gone unmet.

Further, prior to embodiments of the present inventions, it is believed that high purity and ultrahigh purity SiOC materials, and in particular in quantities larger than small laboratory batches of a few ounces, have never been obtained, and thus their importance, benefits, and the need for such material, has gone largely unrecognized and unappreciated.

High purity single crystalline silicon carbide material has many desirable features and characteristics. For example, it is very hard having a Young's modulus of about 424 GPa. Polycrystalline silicon carbide may also have very high hardness, depending upon its grain structure and other factors.

As used herein, unless specified otherwise, the terms specific gravity, which is also called apparent density, should given their broadest possible meanings, and generally mean weight per until volume of a structure, e.g., volumetric shape of material. This property would include internal porosity of a particle as part of its volume. It can be measured with a low viscosity fluid that wets the particle surface, among other techniques.

As used herein, unless specified otherwise, the terms actual density, which may also be called true density, should be given their broadest possible meanings, and general mean weight per unit volume of a material, when there are no voids present in that material. This measurement and property essentially eliminates any internal porosity from the material, e.g., it does not include any voids in the material.

Thus, a collection of porous foam balls (e.g., Nerf® balls) can be used to illustrate the relationship between the three density properties. The weight of the balls filling a container would be the bulk density for the balls:

$$\text{Bulk Density} = \frac{\text{weight of balls}}{\text{volume of container filled}}$$

The weight of a single ball per the ball's spherical volume would be its apparent density:

$$\text{Apparent Density} = \frac{\text{weight of one ball}}{\text{volume of that ball}}$$

The weight of the material making up the skeleton of the ball, i.e., the ball with all void volume removed, per the remaining volume of that material would be the actual density:

$$\text{Actual Density} = \frac{\text{weight of material}}{\text{volume of void free material}}$$

As used herein, unless stated otherwise, room temperature is 25° C. And, standard ambient temperature and pressure is 25° C. and 1 atmosphere.

Generally, the term "about" as used herein unless specified otherwise is meant to encompass a variance or range of ±10%, the experimental or instrument error associated with obtaining the stated value, and preferably the larger of these.

SUMMARY

There has been a long-standing and unfulfilled need for, among other things, methods of making SiC, cost effective and reduced cost method of making higher purity SiC, and devices, apparatus and equipment that utilize SiC, and higher purity SiC. There has also been an unrecognized, but long-standing and unfulfilled need for, among other things, ultra high purity, e.g., 5-nines and greater SiOC ceramics, and for methods of making these.

The present inventions, among other things, solve these needs by providing the compositions, materials, articles of manufacture, devices and processes taught, disclosed and claimed herein.

Accordingly there is provided a method of making an article comprising ultra pure silicon carbide, the method comprising: combining a first liquid comprising silicon, carbon and oxygen with a second liquid comprising carbon; curing the combination of the first and second liquids to provided a cured SiOC solid material, consisting essentially of silicon, carbon and oxygen; transforming the SiOC solid material to an ultra pure polymer derived SiC having less that 99.9999% impurities; and, forming a singe crystal SiC structure by vapor deposition of the ultra pure polymer derived SiC; wherein the vapor deposed structure is defect free and has less than 99.9999% impurities.

Further there are provided methods, compositions and articles having one or more of the following features: wherein the ultra pure polymer derived SiC has excess carbon; wherein the ultra pure polymer derived SiC has no excess carbon; wherein the ultra pure polymer derived SiC is carbon starved; wherein the ultra pure polymer derived SiC has less than a total of 1 ppm of the impurities selected from the group of elements consisting of Al, Fe, B, P, Pt, Ca, Mg, Li, Na, Ni, V, Ti, Ce, Cr, S and As; wherein liquid is a polysilocarb precursor formulation having a molar ratio of about 30% to 85% carbon, about 5% to 40% oxygen, and about 5% to 35% silicon; wherein the single crystal SiC structure is a boule; wherein the single crystal SiC is a layer; wherein the single crystal SiC structure is a layer on a substrate; wherein the single crystal SiC structure is a layer on a substrate, wherein the substrate is comprised of Si; wherein the single crystal SiC structure is a layer on a substrate, wherein the substrate is comprised of SiC; wherein the single crystal SiC is manufactured into a wafer; wherein the single crystal SiC is manufactured into a semiconductor; wherein the single crystal SiC is a boule consisting essentially of alpha type SiC and is essentially free from micropipes; wherein the single crystal SiC is manufactured into a metal-semiconductor field effect transistor (MESFET); wherein the MESFET is incorporated into compound semiconductor device, operating in the 45 GHz frequency range; wherein the MESFET is incorporated into a component of a cellular base station; wherein the component is a power transformer; and wherein the single crystal SiC is manufactured into a metal-semiconductor field effect transistor (MESFET); wherein the MESFET is a component of a power transformer.

Further there is provided a SiC wafer for use as a semiconductor, the SiC wafer formed by the vapor deposition of an ultrapure SiOC derived SiC, wherein the SiC is oxide layer free and has less than 99.9999% impurities; and wherein the SiC is formed by the conversion of a solid SiOC composition having less than 99.9999% impurities.

Yet further there is provided a method of making a SiC, the method comprising: placing polymer derived SiC particles in a vapor deposition apparatus, wherein the SiC particles have less than 99.9999% impurities, and wherein the SiC particles are free from an oxide layer; and, directly vaporizing the SiC particles and depositing the vapors on a target to form crystalline SiC; wherein the vaporization occurs without the need for a preheating step of the SiC.

Further there are provided methods, compositions and articles having one or more of the following features: wherein the SiC crystal is a single crystal SiC boule; wherein the SiC crystal is a single crystal SiC layer; wherein the target is a substrate; wherein the substrate is comprised of Si; wherein the substrate is comprised of SiC; wherein the SiC crystal is manufactured into a wafer; wherein the SiC crystal is manufactured into a semiconductor; wherein the SiC crystal is a boule consisting essentially of alpha type SiC and is essentially free from micropipes; wherein the SiC crystal is manufactured into a metal-semiconductor field effect transistor (MESFET); wherein the MESFET is incorporated into compound semiconductor device, operating in the 45 GHz frequency range; wherein the MESFET is incorporated into a component of a cellular base station; wherein the ultra pure polymer derived SiC has less than a total of 1 ppm of the impurities selected from the group of elements consisting of Al, Fe, B, and P; wherein the ultra pure polymer derived SiC has less than a total of 1 ppm of the impurities selected from the group of elements consisting of Al, Fe, B, P, Na and Ti; wherein the component is a power transformer; wherein the single crystal SiC is manufactured into a metal-semiconductor field effect transistor (MESFET); wherein the MESFET is a component of a power transformer.

DESCRIPTION OF THE PREFERRED EMBODIMENTS

Figure 1:
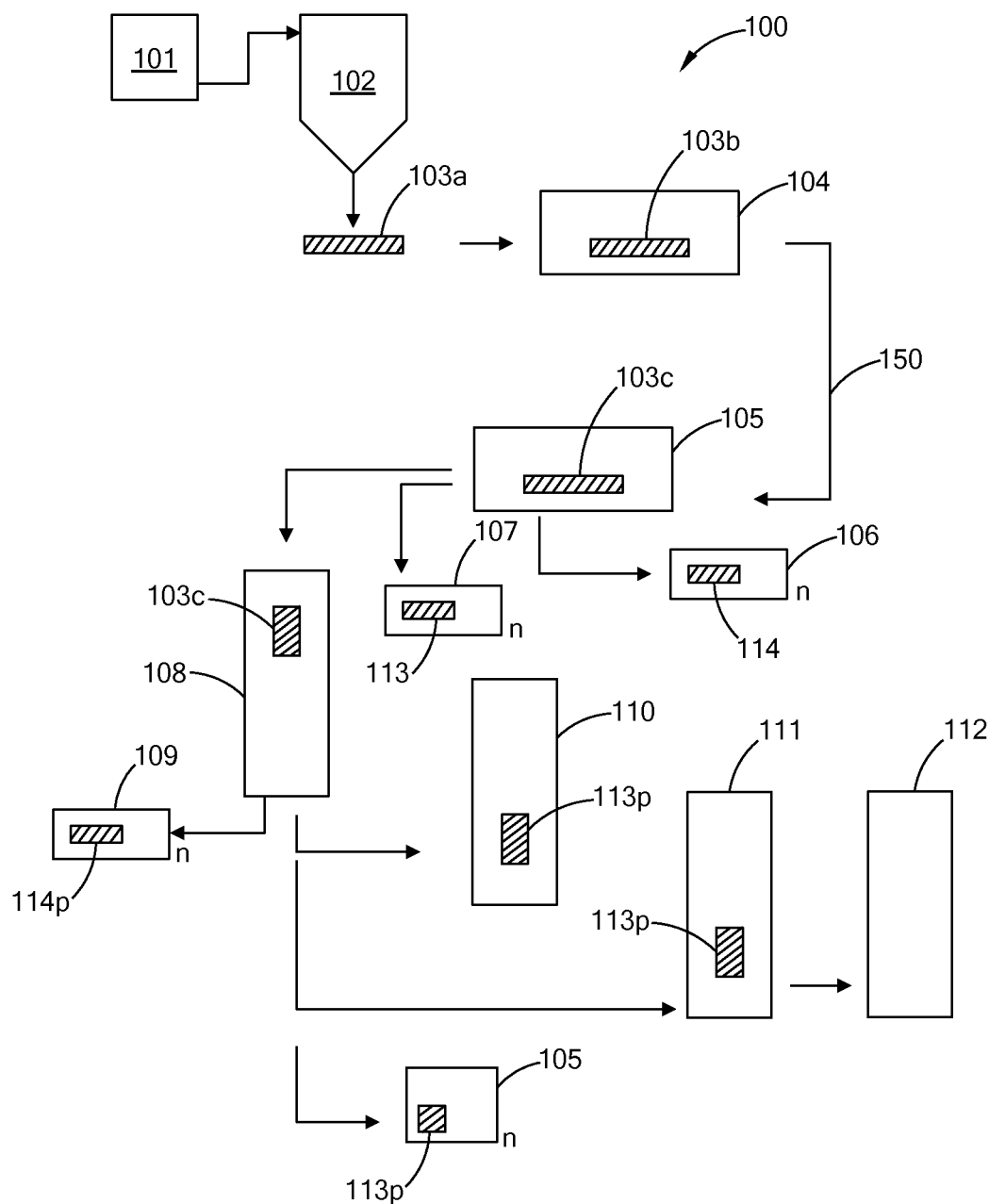
FIG. 1 is an embodiment of a process flow diagram in accordance with the present inventions.
Figure 2A:
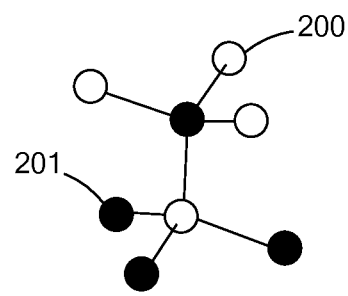
FIG. 2A is a side perspective view of a single cube structure polymer derived SiC in accordance with the present inventions.
Figure 2B:
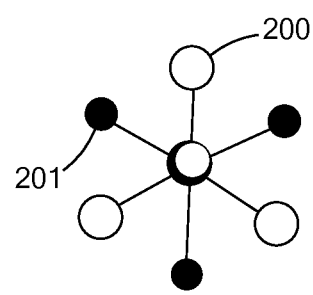
FIG. 2B is a top view of the SiC cubic structure of FIG. 2A.

In general, the present inventions relate to organosilicon chemistry, polymer derived ceramic materials, and methods; and, in particular to such materials and methods for making polysilocarb (SiOC) and Silicon Carbide (SiC) materials having good, high, and exceedingly high purity; and of making SiOC and SiC components, structures and apparatus. Further, and in particular, embodiments of the present inventions relate to the production of high purity SiC, SiC devices, and SiC containing apparatus and equipment, from polysilocarb materials.

Thus, the present inventions provide a new material system and platform having many varied formulations, applications and uses, which could not be obtained with prior silicon based products, and in particular, could not have been obtained with prior silicon based products at acceptable costs, volumes, manufacturing conditions, purity levels, handling requirements, and processing conditions, among other things.

Generally, the present inventions are directed toward "polysilocarb" materials, e.g., material containing silicon (Si), oxygen (O) and carbon (C), and materials that have been converted to various forms of SiC from such materials. Polysilocarb materials may also contain other elements. Polysilocarb materials are made from one or more polysilocarb precursor formulation or precursor formulation. The polysilocarb precursor formulation contains one or more functionalized silicon polymers, or monomers, as well as, potentially other ingredients, such as for example, inhibitors, catalysts, initiators, modifiers, dopants, and combinations and variations of these and other materials and additives. Silicon oxycarbide materials, or SiOC compositions and similar terms, unless specifically stated otherwise, refer to polysilocarb materials that have been cured into a plastic, or solid material containing Si, O and C, and polysilocarb materials that have been pyrolized into a ceramic material containing Si, O and C.

Typically, and preferably, the polysilocarb precursor formulation is initially a liquid. This liquid polysilocarb precursor formulation is then cured to form a solid or semi-sold material, e.g., a plastic. The polysilocarb precursor formulation may be processed through an initial cure, to provide a partially cured material, which may also be referred to, for example, as a preform, green material, or green cure (not implying anything about the material's color). The green material may then be further cured. Thus, one or more curing steps may be used. The material may be "end cured," i.e., being cured to that point at which the material has the necessary physical strength and other properties for its intended purpose. The amount of curing may be to a final cure (or "hard cure"), i.e., that point at which all, or essentially all, of the chemical reaction has stopped (as measured, for example, by the absence of reactive groups in the material, or the leveling off of the decrease in reactive groups over time). Thus, the material may be cured to varying degrees, depending upon its intended use and purpose. For example, in some situations the end cure and the hard cure may be the same.

The curing may be done at standard ambient temperature and pressure ("SATP", 1 atmosphere, 25° C.), at temperatures above or below that temperature, at pressures above or below that pressure, and over varying time periods (both continuous and cycled, e.g., heating followed by cooling and reheating), from less than a minute, to minutes, to hours, to days (or potentially longer), and in air, in liquid, or in a preselected atmosphere, e.g., Argon (Ar) or nitrogen ($N_2$).

The polysilocarb precursor formulations can be made into non-reinforced, non-filled, composite, reinforced, and filled structures, intermediates and end products, and combinations and variations of these and other types of materials. Further, these structures, intermediates and end products can be cured (e.g., green cured, end cured, or hard cured), uncured, pyrolized to a ceramic, and combinations and variations of these (e.g., a cured material may be filled with pyrolized beads derived from the same polysilocarb as the cured material).

The precursor formulations may be used to form a "neat" material, (by "neat" material it is meant that all, and essentially all of the structure is made from the precursor material or unfilled formulation; and thus, there are no fillers or reinforcements). They may be used to form composite materials, e.g., reinforced products. They may be used to form non-reinforced materials, which are materials that are made of primarily, essentially, and preferably only from the precursor materials, for example a pigmented polysiloxane structure having only precursor material and a colorant would be considered non-reinforced material.

In making the polysilocarb precursor formulation into a structure, part, intermediate, or end product, the polysilocarb formulation can be, for example, sprayed, flowed, polymer emulsion processed, thermal sprayed, painted, molded, formed, extruded, spun, dropped, injected or otherwise manipulated into essentially any volumetric shape, including planar shape (which still has a volume, but is more akin to a coating, skin, film, or even a counter top, where the thickness is significantly smaller, if not orders of magnitude smaller, than the other dimensions), and combinations and variations of these.

The polysilocarb precursor formulations may be used with reinforcing materials to form a composite material. Thus, for example, the formulation may be flowed into, impregnated into, absorbed by or otherwise combined with a reinforcing material, such as carbon fibers, glass fiber, woven fabric, non-woven fabric, chopped fibers, metal powder, metal foams, ceramic foams, fibers, rope, braided structures, ceramic powders, glass powders, carbon powders, graphite powders, ceramic fibers, metal powders, carbide pellets or components, staple fibers, tow, nanostructures of the above, polymer derived ceramics, any other material that meets the temperature requirements of the process and end product, and combinations and variations of these. Thus, for example, the reinforcing materials may be any of the high temperature resistant reinforcing materials currently used, or capable of being used with, existing plastics and ceramic composite materials. Additionally, because the polysilocarb precursor formulation may be formulated for a lower temperature cure (e.g., SATP) or a cure temperature of for example about 100° F. to about 400° F., the reinforcing material may be polymers, organic polymers, such as nylons, polypropylene, and polyethylene, as well as aramid fibers, such as NOMEX or KEVLAR.

The reinforcing material may also be made from, or derived from the same material as the formulation that has been formed into a fiber and pyrolized into a ceramic, or it may be made from a different precursor formulation material, which has been formed into a fiber and pyrolized into a ceramic. In addition to ceramic fibers derived from the precursor formulation materials that may be used as reinforcing material, other porous, substantially porous, and non-porous ceramic structures derived from a precursor formulation material may be used.

The polysilocarb precursor formulation may be used to form a filled material. A filled material would be any material having other solid, or semi-solid, materials added to the polysilocarb precursor formulation. The filler material may be selected to provide certain features to the cured product, the ceramic product or both. These features may relate to or be aesthetic, tactile, thermal, density, radiation, chemical, magnetic, electric, and combinations and variations of these and other features. These features may be in addition to strength. Thus, the filler material may not affect the strength of the cured or ceramic material, it may add strength, or could even reduce strength in some situations.

The filler material could impart, regulate or enhance, for example, electrical resistance, magnetic capabilities, band gap features, p-n junction features, p-type features, n-type features, dopants, electrical conductivity, semiconductor features, anti-static, optical properties (e.g., reflectivity, refractivity and iridescence), chemical resistivity, corrosion resistance, wear resistance, abrasions resistance, thermal insulation, UV stability, UV protective, and other features that may be desirable, necessary, and both, in the end product or material.

Thus, filler materials could include copper lead wires, thermal conductive fillers, electrically conductive fillers, lead, optical fibers, ceramic colorants, pigments, oxides, dyes, powders, ceramic fines, polymer derived ceramic particles, pore-formers, carbosilanes, silanes, silazanes, silicon carbide, carbosilazanes, siloxane, metal powders, ceramic powders, metals, metal complexes, carbon, tow, fibers, staple fibers, boron containing materials, milled fibers, glass, glass fiber, fiber glass, and nanostructures (including nanostructures of the forgoing) to name a few. For example, crushed, polymer derived ceramic particles, e.g., fines or beads, can be added to a polysilocarb formulation and then cured to form a filled cured plastic material, which has significant fire resistant properties as a coating or in a device or component of a device.

The polysilocarb formulation and products derived or made from that formulation may have metals and metal complexes. Thus, metals as oxides, carbides or silicides can be introduced into precursor formulations, and thus into a silica matrix in a controlled fashion. Thus, using organometallic, metal halide (chloride, bromide, iodide), metal alkoxide and metal amide compounds of transition metals and then copolymerizing in the silica matrix, through incorporation into a precursor formulation is contemplated.

For example, Cyclopentadienyl compounds of the transition metals can be utilized. Cyclopentadienyl compounds of the transition metals can be organized into two classes: Bis-cyclopentadienyl complexes; and Mono-cyclopentadienyl complexes. Cyclopentadienyl complexes can include $C_5H_5$, $C_5Me_5$, $C_5H_4Me$, $CH_5R_5$ (where R=Me, Et, Propyl, i-Propyl, butyl, Isobutyl, Sec-butyl). In either of these cases Si can be directly bonded to the Cyclopentadienyl ligand or the Si center can be attached to an alkyl chain, which in turn is attached to the Cyclopentadienyl ligand.

Cyclopentadienyl complexes, that can be utilized with precursor formulations and in products, can include: bis-cyclopentadienyl metal complexes of first row transition metals (Titanium, Vanadium, Chromium, Iron, Cobalt, Nickel); second row transition metals (Zirconium, Molybdenum, Ruthenium, Rhodium, Palladium); third row transition metals (Hafnium, Tantalum, Tungsten, Iridium, Osmium, Platinum); Lanthanide series (La, Ce, Pr, Nd, Pm, Sm, Eu, Gd, Tb, Dy, Ho); and Actinide series (Ac, Th, Pa, U, Np).

Monocyclopentadienyl complexes may also be utilized to provide metal functionality to precursor formulations and would include monocyclopentadienyl complexes of: first row transition metals (Titanium, Vanadium, Chromium, Iron, Cobalt, Nickel); second row transition metals (Zirconium, Molybdenum, Ruthenium, Rhodium, Palladium); third row transition metals (Hafnium, Tantalum, Tungsten, Iridium, Osmium, Platinum) when preferably stabilized with proper ligands, (for instance Chloride or Carbonyl).

Alky complexes of metals may also be used to provide metal functionality to precursor formulations and products. In these alkyl complexes the Si center has an alkyl group (ethyl, propyl, butyl, vinyl, propenyl, butenyl) which can bond to transition metal direct through a sigma bond. Further, this would be more common with later transition metals such as Pd, Rh, Pt, Ir.

Coordination complexes of metals may also be used to provide metal functionality to precursor formulations and products. In these coordination complexes the Si center has an unsaturated alkyl group (vinyl, propenyl, butenyl, acetylene, butadienyl) which can bond to carbonyl complexes or ene complexes of Cr, Mo, W, Mn, Re, Fe, Ru, Os, Co, Rh, Ir, Ni. The Si center may also be attached to a phenyl, substituted phenyl or other aryl compound (pyridine, pyrimidine) and the phenyl or aryl group can displace carbonyls on the metal centers.

Metal alkoxides may also be used to provide metal functionality to precursor formulations and products. Metal alkoxide compounds can be mixed with the Silicon precursor compounds and then treated with water to form the oxides at the same time as the polymer, copolymerize. This can also be done with metal halides and metal amides.

Preferably, this may be done using early transition metals along with Aluminum, Gallium and Indium, later transition metals: Fe, Mn, Cu, and alkaline earth metals: Ca, Sr, Ba, Mg.

Compounds where Si is directly bonded to a metal center which is stabilized by halide or organic groups may also be utilized to provide metal functionality to precursor formulations and products.

Additionally, it should be understood that the metal and metal complexes may be the continuous phase after pyrolysis, or subsequent heat treatment. Formulations can be specifically designed to react with selected metals to in situ form metal carbides, oxides and other metal compounds, generally known as cermets (e.g., ceramic metallic compounds). The formulations can be reacted with selected metals to form in situ compounds such as mullite, alumino silicate, and others. The amount of metal relative to the amount of silica in the formulation or end product can be from about 0.1 mole % to 99.9 mole %, about 1 mole % or greater, about 10 mole % or greater, and about 20 mole percent or greater. The forgoing use of metals with the present precursor formulas can be used to control and provide predetermined stoichiometries.

The polysilocarb batch may also be used a binder in composite structures, such as a binder for metal, ceramic, and inorganic matrices.

Filled materials would include reinforced materials. In many cases, cured, as well as pyrolized polysilocarb filled materials can be viewed as composite materials. Generally, under this view, the polysilocarb would constitute the bulk or matrix phase, (e.g., a continuous, or substantially continuous phase), and the filler would constitute the dispersed (e.g., non-continuous), phase.

It should be noted, however, that by referring to a material as "filled" or "reinforced" it does not imply that the majority (either by weight, volume, or both) of that material is the polysilcocarb. Thus, generally, the ratio (either weight or volume) of polysilocarb to filler material could be from about 0.1:99.9 to 99.9:0.1. Smaller amounts of filler material or polysilocarb could also be present or utilized, but would more typically be viewed as an additive or referred to in other manners. Thus, the terms composite, filled material, polysilocarb filled materials, reinforced materials, polysilocarb reinforced materials, polysilocarb filled materials, polysilocarb reinforced materials and similar such terms should be viewed as non-limiting as to amounts and ratios of the material's constitutes, and thus in this context, be given their broadest possible meaning.

Depending upon the particular application, product or end use, the filler can be evenly distributed in the precursor formulation, unevenly distributed, a predetermined rate of settling, and can have different amounts in different formulations, which can then be formed into a product having a predetermined amounts of filler in predetermined areas, e.g., striated layers having different filler concentration.

As used herein, unless specified otherwise the terms %, weight % and mass % are used interchangeably and refer to the weight of a first component as a percentage of the weight of the total, e.g., formulation, mixture, material or product. As used herein, unless specified otherwise "volume %" and "% volume" and similar such terms refer to the volume of a first component as a percentage of the volume of the total, e.g., formulation, material or product.

At various points during the manufacturing process, the polysilocarb structures, intermediates and end products, and combinations and variations of these, may be machined, milled, molded, shaped, drilled or otherwise mechanically processed and shaped.

The precursor formulations are preferably clear or are essentially colorless and generally transmissive to light in the visible wavelengths. They may, depending upon the formulation have a turbid, milky or clouding appearance. They may also have color bodies, pigments or colorants, as well as color filler (which can survive pyrolysis, for ceramic end products, such as those used in ceramic pottery glazes). The precursor may also have a yellow or amber color or tint, without the need of the addition of a colorant.

The precursor formulations may be packaged, shipped and stored for later use in forming products, e.g., structures or parts, or they may be used directly in these processes, e.g., continuous process to make a product. Thus, a precursor formulation may be stored in 55 gallon drums, tank trucks, rail tack cars, onsite storage tanks having the capable of holding hundreds of gals, and shipping totes holding 1,000 liters, by way of example. Additionally, in manufacturing process the formulations may be made and used in a continuous, and semi-continuous processes.

The present formulations, among other things, provide substantial flexibility in designing processes, systems, ceramics, having processing properties and end product performance features to meet predetermined and specific performance criteria. Thus, for example the viscosity of the precursor formulation may be predetermined by the formulation to match a particular morphology of the reinforcing material, the cure temperature of the precursor formulation may be predetermined by the formulation to enable a prepreg to have an extended shelf life. The viscosity of the of the precursor formulation may be established so that the precursor readily flows into the reinforcing material of the prepreg while at the same time being thick enough to prevent the precursor formulation from draining or running off of the reinforcing material. The formulation of the precursor formulation may also, for example, be such that the strength of a cured preform is sufficient to allow rough or initial machining of the preform, prior to pyrolysis.

Custom and predetermined control of when chemical reactions occur in the various stages of the process from raw material to final end product can provide for reduced costs, increased process control, increased reliability, increased efficiency, enhanced product features, increased purity, and combinations and variation of these and other benefits. The sequencing of when chemical reactions take place can be based primarily upon the processing or making of precursors, and the processing or making of precursor formulations; and may also be based upon cure and pyrolysis conditions. Further, the custom and predetermined selection of these steps, formulations and conditions, can provide enhanced product and processing features through chemical reactions, molecular arrangements and rearrangements, and microstructure arrangements and rearrangements, that preferably have been predetermined and controlled.

Turning to FIG. 1 there is provided a process flow chart 100 for a collective embodiment having several embodiments of the present processes and systems. Thus, there is a precursor make up segment 101, where the polysilocarb precursor formulations are prepared. There is a forming and distribution segment 102, where the liquid precursor formulation 103a is prepared for subsequent segments.

There is a curing segment 104, where the liquid precursor 103a is cured to a cured material 103b, which is substantially solid, and preferably a solid. There is a pyrolysis segment 105 where the cured material 103b is converted to a ceramic 103c, which preferably is SiOC or SiC, and more preferably high, and very high purity SiOC or SiC. There is a post-processing segment 108, where the ceramic 103c is further processed, e.g., washing, pelletizing, extraction, grinding, sieving, etc. The SiOC ceramic 114 can be used in any number ("n" in the figure) of other segments 106, to make intermediate and end products and for various applications. Similarly, the post-processed ceramic SiOC 114p can be used in any number ("n" in the figure) of other segments 109, to make intermediate and end products and for various applications. It being understood that the segments 106 and 109 may be the same or different segments. The ceramic SiC 113 can be used in any number of other segments 107, to make intermediate and end products and for various applications. Similarly, the post-processed ceramic SiC 113p can be used in a segment 110, e.g., a sintering process. The post-processed ceramic SiC 113p can be used in segment 111, e.g., a vapor deposition process to form boules of SiC for segment 112, e.g., processing into SiC wafers for use in, among other things, semiconductors. The post-process ceramic SiC 113p can be used in any number ("n" in the figure) of other segments 115, to make intermediate and end products and for various applications.

One of the many advantages of the present inventions is that segments 106, 107, 109, 110, 111, and 115, generally can be interchangeable. Further, these segments may be processes, methods, applications, and uses that are traditionally for Si. Thus, one of the many advantages of the present inventions is the ability to use the SiOC, SiC, and combinations of the SiOC and SiC, and in particular high purity and ultra high purity SiOC, SiC and combinations thereof in, and for, Si intermediate products, Si end products, Si applications and Si uses; and in particular for Si applications where it was previously believed that SiC was not viable for economic, purity and other rationales. More preferably, and one of the many advantages of the present inventions, is the ability to obtain the requites levels of purity of the SiC to be of equal or better performance, e.g., features, functions, than Si. Further, one of the many advantages of the present inventions is the ability to use the SiOC or the SiC in intermediate products, end products and applications and uses, where Si performed or functioned poorly, or not at all, such as in high temperature sensors and other and new applications and uses.

In high purity and ultra high purity applications, the precursor preparation segments 101 and 102, e.g., its equipment and procedures, should be such as to remove, avoid, prevent, and combinations and variations of these, any contamination (e.g., materials seen as impurities in the end product) of the starting materials. Thus, in an embodiment the segment should be free from (e.g., contain little, essentially none, and entirely none of) the following materials: B, Na, Al, P, Fe, heavy metals, and halogens, to name a few. Distillation, ion exchange filtration and other types of purification techniques can be use to remove impurities from starting materials and raw materials.

In segments 105, 106, 107, 108, 109, 110, (and 104 to the extent that it is combined with another segment), the heating equipment, e.g., furnaces that may be used can be any type of furnace that can reach and maintain the desired temperatures, e.g., for pyrolysis and conversion to SiC, of up to about 2,900° C., up to about 2,800° C., above 2,300° C., and preferably in the range of about 1,200° C. to about 2,800° C. The heating equipment for the curing stage (e.g., segment 104) in the process can be any furnace that can reach the curing temperatures to cure the liquid polymer derived ceramic precursor material, e.g., liquid SiOC formulation, into a solid or semisolid material, e.g., cured material. Thus, one furnace may be used to conduct the entire process from liquid polymer derived ceramic to SiC, or two or three different furnaces may be used. In an embodiment one furnace is used to cure the liquid precursor to a cured SiOC material, and a second, different furnace is used to transform the SiOC material into SiC.

Preferably for high purity and ultra-high purity applications, materials and uses: such as, SiOC production, SiC production, sintering, pressing, optics formation, boule production, signal crystal growth, crystal layer formation, layer formation, coatings, or wafer production, the heating equipment, e.g., furnaces, are substantially free from, and more preferably free from, any materials that are considered impurities in the end product. For example, the heating equipment, and in particular the internal components, and all components in fluid communication with the internal components, can be free from (e.g., contain little, essentially none, and entirely none of) the following materials: B, Na, Al, P, Fe, and heavy metals, to name a few. A cleaning or purging cycle can be run with the furnaces to remove any impurities or contaminants before processing of the polymer derived ceramic materials. Thus, for example, vacuum, a high temperature heating cycle, purging with an inert gas such Argon, and combinations and variations of these steps can preferably be used to make the furnace free from contaminants.

By way of example, these furnaces can include: RF furnaces, Microwave furnaces, box furnaces, tube furnaces, crystal-growth furnaces, arc melt furnaces, induction furnaces, kilns, MoSi2 heating element furnaces, gas-fired furnaces, carbon furnaces, vacuum furnaces. Furnaces may contain spacer materials so as to prevent certain materials to contact one another at high temperature. For example, graphite in contact with alumina at high temperature (>1500° C.) can lead to aluminum contamination in the final product, and thus spacers may be used to minimize, mitigate or prevent this from occurring. Preferably, furnace components are all constructed from high purity graphite. They may also be constructed of, or coated with high purity SiC.

The furnaces, in segments 104, 105, 106, 107, 108, 109, 110 may control, or have equipment and apparatus that control, the environment within the furnace; and in particular, the environment adjacent to the material that is being cured, pyrolized, or converted. Thus, equipment to provide for vacuum conditions, reduced pressure, preselected atmospheres (e.g. Argon), flowing or sweeping gas streams, and combinations and variations of these may be used. These systems and apparatus should be free from, and constructed to minimize and preferably prevent the introduction of contaminates or impurities into the furnace, and in particular into the material being processed.

With many polymer derived ceramic materials, and in particular with some SiOC materials, during pyrolysis and conversion, off-gassing from the materials can take place. In some situations the off-gases produced can be flammable, can have recoverable materials of value (e.g., Si), and combinations of these. Thus, and preferably, the furnaces have off-gas handling apparatus, that can mitigate any flammability issues with the off-gas stream (e.g., an after burner), that can remove and recover any materials of value from the gas stream (e.g., scrubbers) and combinations of these, and other off-gas or gas stream processing and handling equipment and apparatus.

In the various segments of the process of FIG. 1, the material holding equipment for holding the liquid precursor formulations during curing, pyrolysis, conversion, or other transformation, can be for example Alumina, binder-less h-BN, Graphite, halogen-purified graphite, pyrolitic graphite, SiC, CVD—SiC, polymer-derived SiC, PVT—SiC. A variety of coatings can also be employed on these materials, including but not limited to, TaC, SiC, pyrolitic graphite. The container itself can be a crucible, a boat, a machined mold to form any desired geometry (pills, pucks, spheroids, ellipsoids, etc.). It may or may not be fully enclosed, but may have venting holes to allow for gasses to escape. Preferably, a fitted lid to the vessel is used and the vessel is designed to enable venting of gasses during pyrolysis and conversion. Most preferably, inert gas is also purged through the vessel, for example, at a rate from about 0.5 volume exchanges of the vessel per hour to about 20, from about 5 volume exchanges of the vessel per hour to about 15, and preferably at a rate that does not exceed 10 volume exchanges of the vessel per hour.

It further being understood that the process flow arrows, e.g., 150, in the embodiment of FIG. 1 are for the purposes of general illustration, and that: the various segments could be performed in a step wise, or batch process (included where the segments are at different locations, separated by time, e.g., a few hours, a few days, months or longer, and both); the various segments could be performed as a continuous process; one or more of the various segments could be combined, e.g., a single piece of equipment could perform one of more of the operations of different segments; and combinations and variations of these.

In embodiments of the segments of FIG. 1, the liquid precursors are cured to a solid SiOC. The solid SiOC is then pyrolized and converted into SiC. In one of these embodiments the SiOC may be in a volumetric shape, e.g. a puck, pill, or disc, which is then directly converted into a friable mass of SiC, without the need for intermediate processing steps. In one of these embodiments the SiOC is ground into granular SiOC and then converted into granular SiC, which is then formed into a volumetric shape, e.g., a friable mass of SiC. In one of these embodiments the SiOC is formed into SiC of varying size particles. These particles are then ground down to smaller, and preferably more uniform sizes, or granules, and then these granules are formed, e.g., pressed, into a volumetric shape, or mass of SiC. In these, as well as, other embodiments when making high purity, and ultra-high purity, SiC it is preferably to have all components of the system free of substances that are viewed as impurities in the subsequent uses or process for the SiC; or to have these components shielded, encases or otherwise having mitigation steps implemented to avoid the introduction of impurities into the process, and the SiC.

In general, and preferably, embodiments of the precursor formulations have controlled and predetermined amounts, e.g., ratios of O, C and Si. In this manner the starting building bocks for the SiC are in essence preferably built into the liquid polymer and preferably locked into the cured material. With the building starting blocks being predetermined the processing conditions can then be preselected and controlled to obtain the desired end product, e.g., stoichiometric high purity and ultra-high purity SiC. The ratios of starting building blocks can further be predetermined to provide influence over, or to otherwise affect the reactions and rearrangements that are taking place during the processes, for example, an initial excess of one component can be present to drive the process in a particular direction, e.g., to favor the creation of CO over SiO. Thus, and further, it may be possible to control and predetermine the type, features, or form, e.g., polytype, of SiC that is obtained, by predetermining and controlling the ratios of these building blocks, any additives and the processing parameters.

Figure 4:
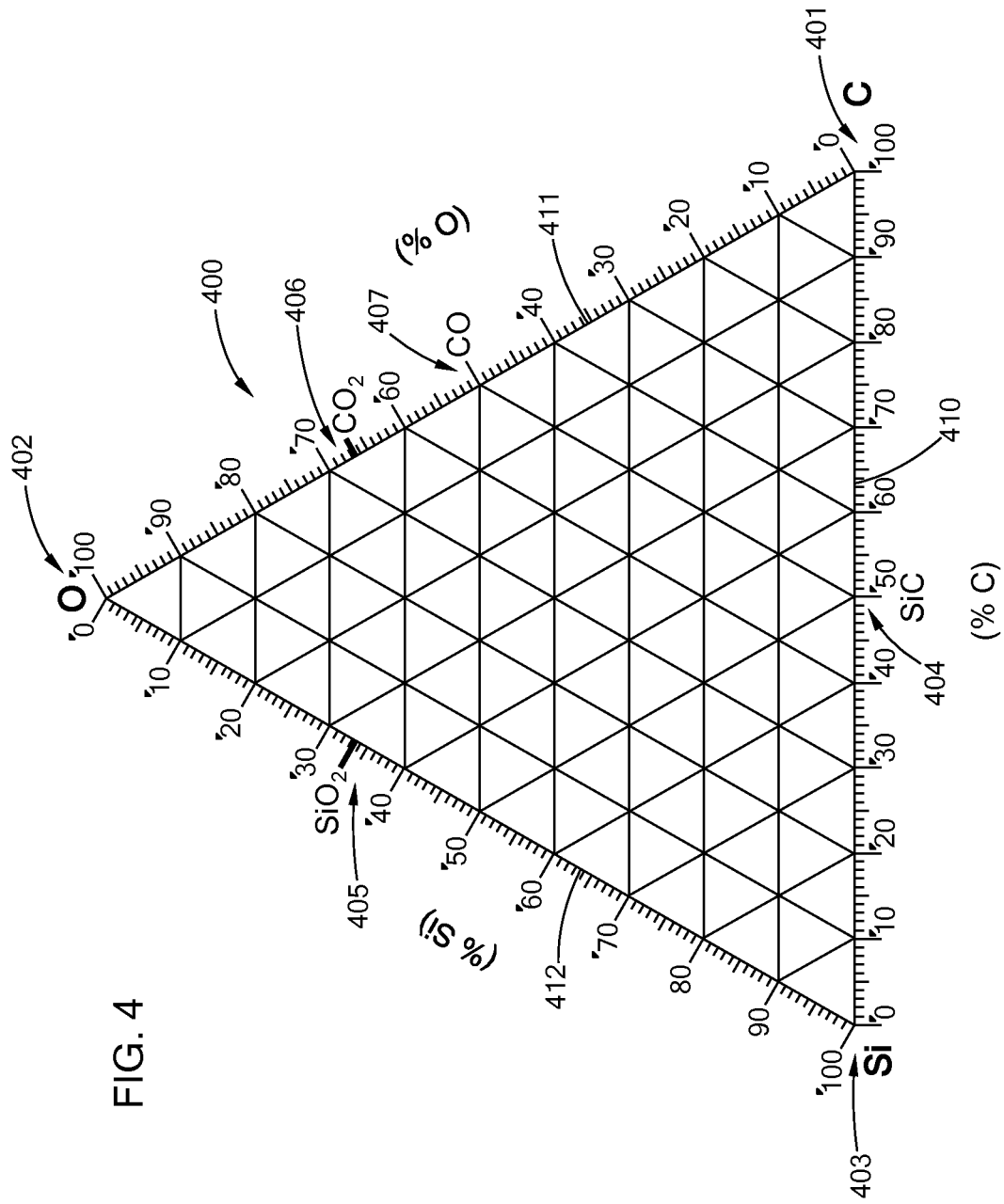
FIG. 4 is a three-phase diagram chart in accordance with the present inventions.
Figure 4A:
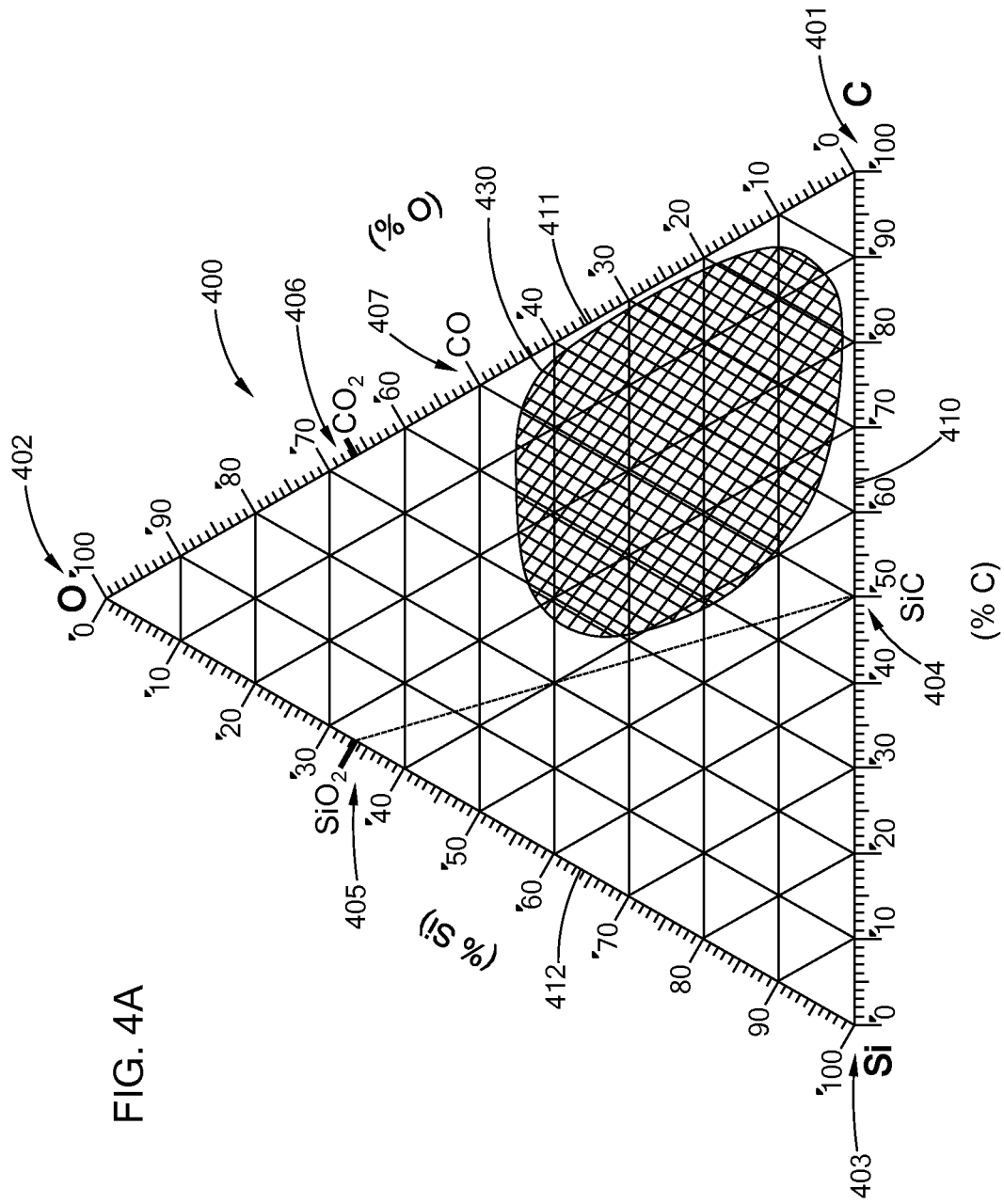
FIG. 4A shows an area of embodiments of formulations in accordance with the present inventions, on the three-phase chart of FIG. 4.

For illustration purposes the relationship of the starting building blocks, process conditions and end product can, in part, be explained by reference to the three-phase diagram 400 of FIG. 4. Each corner of the diagram 400, represents 100% of a building block, thus corner 401 is 100% Carbon, corner 402 is 100% Oxygen, and corner 403 is 100% Silicon. The point 404 on the diagram 400 corresponds to SiC, point 405 on the diagram 400 corresponds to $SO_2$, and point 406 and 407 on the diagram 400 corresponds to $CO_2$ and CO respectively. Further, the base 410 corresponds to the molar % of C, the right side 411 corresponds to the molar % 0, and the left side 412 corresponds to the molar % Si. (By molar % X, it is meant the moles of X to the total moles of O, C, and Si, as a percentage.) Thus, the molar ratios of starting materials in a precursor formulation batch can generally, and without limitation, be from about 30% to about 85% Carbon, from about 5% to about 40% Oxygen, and from about 5% to about 35% Silicon. Preferably, in embodiments of the SiOC starting materials and cured materials, the molar ratio of C, Si and O, can be within about the cross-hatched area 430 of FIG. 4A. Although, ratios outside of that area are contemplated.

Generally, the process for obtaining SiC goes from a liquid precursor formulation to a cured material, to a pyrolized SiOC material, which is converted to a SiC material (alpha, beta, or both). During these processes— curing, pyrolizing and converting, some of the various building blocks are lost, typically C and O. Si may also be lost, but preferably the process and the precursor are such that Si loss is minimal to none. For example, excess C, built into the precursor or from an external source, e.g., in the oven, will drive the formation of CO over SiO resulting in less loss of Si. The greater degree of cross-linking that takes place in the cured material, the lower the Si losses during pyrolizing and converting, and thus, the greater the yield of SiC.

Figure 4B:
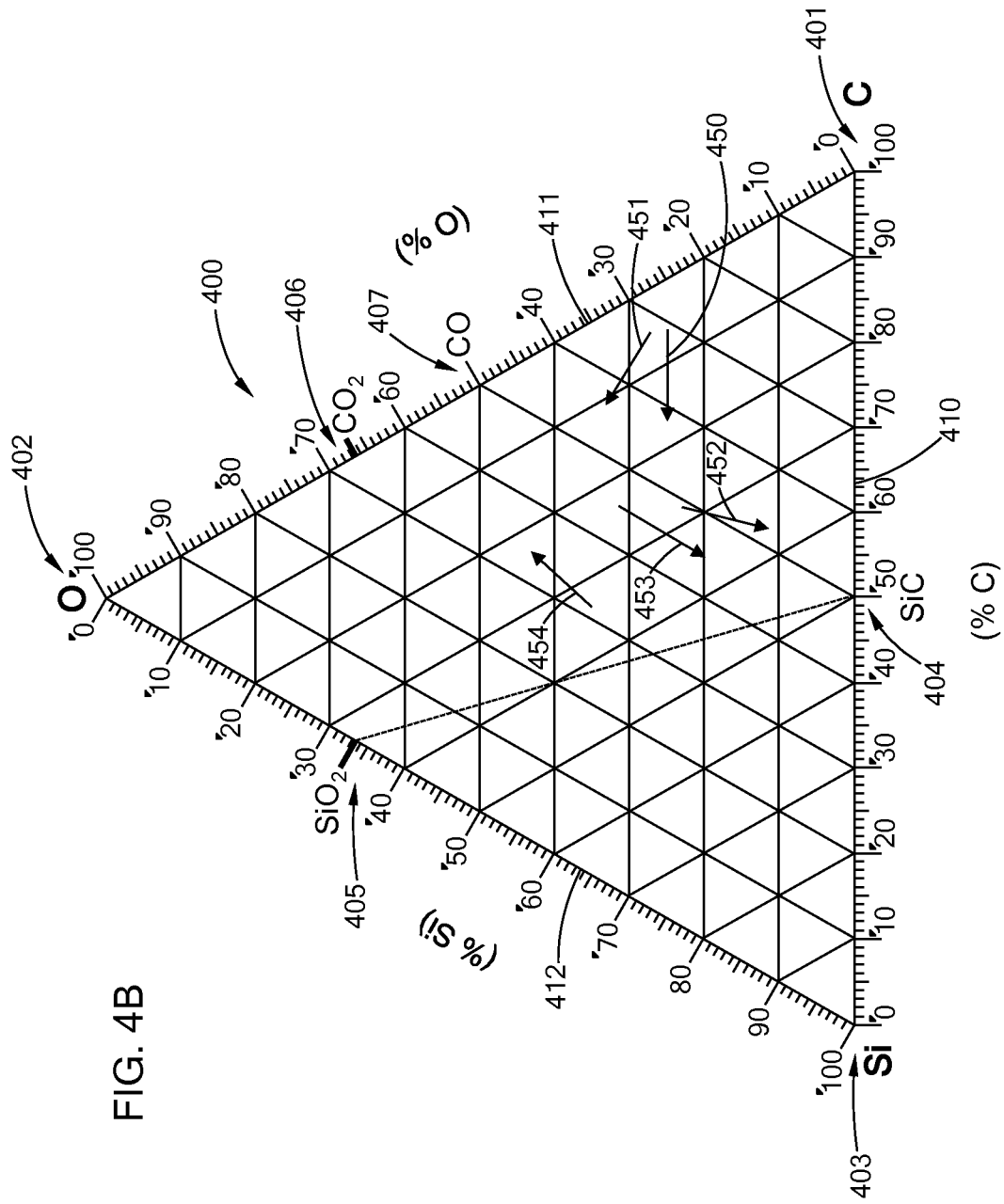
FIG. 4B shows embodiments of transformation taking place during embodiments of the processes in accordance with the present inventions, on the three-phase chart of FIG. 4.

Turning again to the three-phase diagram 400, in FIG. 4B there is shown the general shift in ratio that can be anticipated with various processes. It being understood that the various arrows are only general directions of movements for examples of processing activities; and their slopes may vary, depending upon the actual conditions, for example if hydrocarbons and $CO_2$ are both being given off. Thus, the removal of volatile hydrocarbons will shift the ratio generally in the direction of arrow 450. During curing or storage thereafter the material may pick up some water from the atmosphere, which ratio shift is shown by arrow 451 (combined water pick up and volatile loss). The ratio shift from the generation of SiO is shown by arrow 454. The ratio shift from the generation of CO is shown by arrow 453, and the ratio shift from the generation of $CO_2$ is shown by arrow 452. In being understood that the ultimate goal of the process is to get the ratio of materials from their starting ratio to the base line 410, and in some situations, most preferably to stoichiometric SiC, point 404.

The ability to start with a liquid material, e.g., the precursor batch, having essentially all of the building blocks, e.g., Si and C, needed to make SiC provides a significant advantage in controlling impurities, contamination, and in making high purity SiOC, which in turn can be converted to high purity SiC, or which can be made directly in a single combined process or step. Thus, embodiments of the present inventions provide for the formation of SiOC that is at least about 99.9% (3-nines), at least about 99.99% (4-nines), at least about 99.999% (5-nines), and least about 99.9999% (6-nines) and at least about 99.99999% (7-nines) or greater purity. Similarly, embodiments of the present inventions provide for the formation of SiC that is at least about 99.9% (3-nines), at least about 99.99% (4-nines), at least about 99.999% (5-nines), and least about 99.9999% (6-nines) and at least about 99.99999% (7-nines) or greater purity. These purity values are based upon the amount of SiOC, or SiC, as the case may be, verse all materials that are present or contained within a given sample of SiOC or SiC product.

Embodiments of the present polysilocarb derived SiC and processes, reduce the cost of providing high purity and ultra high purity SiC, while also increasing the purity obtained, e.g., lower cost high purity SiC materials. Thus, among other things, embodiments of the polysilocarb SiC materials and articles have reduced costs and enhanced features, when compared to prior SiC, SiOC and Si materials and products Thus, among other things, embodiments of the polysilocarb SiC materials and articles can replace SiC as well as Si materials and products in many applications, and have to ability to provide for new, additional and enhanced applications that were not obtainable with SiC and Si materials and products for technical, economic, and both, reasons.

Embodiments of polymer derived SiC wafers include, among others, about 2-inch diameter wafers and smaller, about 3-inch diameter wafers, about 4-inch diameter wafers, about 5-inch diameter wafers, about 6-inch diameter wafers, about 7-inch diameter wafers, about 12-inch diameter wafers and potentially larger, wafers having diameters from about 2 inches to about 8 inches, wafers having diameters from about 4 inches to about 6 inches, square shaped, round shaped, and other shapes, surface area per side of about 1 square inch, about 4 square inches, about 10 square inches and larger and smaller, a thickness of about 100 µm, a thickness of about 200 µm, a thickness of about 300 µm, a thickness of about 500 µm, a thickness of about 700 µm, a thickness from about 50 µm to about 800 µm, a thickness from about 100 µm to about 700 µm, a thickness from about 100 µm to about 400 µm, and larger and smaller thickness, and combinations and variations of these.

In embodiments of the present inventions the high purity SiC has low, very and low and below detection limits, amounts of materials that cause significant problems, or are viewed as impurities, in the later processing and manufacture of items, for example, boules, wafers, electronic components, optical components and other SiC based intermediate and end products.

Thus, polymer derived high purity SiC, and in particular polysilocarb derived high purity SiOC, as well as, the high purity SiC that the SiOC is converted into, has a purity of at least about 99.9%, at least about 99.99%, at least about 99.999%, and least about 99.9999% and at least about 99.99999% or greater. Further, it is noted that embodiments of the present invention include polymer derived SiC, and SiOC, of any purity level, including lower levels of purity, such as 99.0%, 95%, 90% and lower. It is believe that these lower, e.g., non-high, purity embodiments have, and will find, substantial uses and applications. Similarly, it is believed that embodiments of the high purity SiC will find applications, uses, and provide new and surprising benefits to applications that prior to the present inventions were restricted to Si or materials other than SiC.

Embodiments of the present inventions include the use of high purity SiC in making wafers for applications in electronics and semiconductor applications. In both the vapor deposition apparatus and processes to create the boules and wafers for later use, high purity SiC is required. In particular, as set forth in Table 3, embodiments of high purity polymer derived SiOC and SiC can preferably have low levels of one, more than one, and all elements in Table 3, which in certain vapor deposition apparatus, electronics applications, and semiconductor applications are considered to be impurities. Thus, embodiments of polysilocarb derived SiC can be free of impurities, substantially free of impurities, and contain some but have no more than the amounts, and combinations of amounts, set out in Table 3.

TABLE 3

| Element | less than ppm | less than ppm | less than ppm | less than ppm | less than ppm |
| --- | --- | --- | --- | --- | --- |
| Al | 1,000 | 100 | 10 | 1 | 0.1 |
| Fe | 1,000 | 100 | 10 | 1 | 0.1 |
| B | 1,000 | 100 | 10 | 1 | 0.1 |
| P | 1,000 | 100 | 10 | 1 | 0.1 |
| Pt | 1,000 | 100 | 10 | 1 | 0.1 |
| Ca | 1,000 | 100 | 10 | 1 | 0.1 |
| Mg | 1,000 | 100 | 10 | 1 | 0.1 |
| Li | 1,000 | 100 | 10 | 1 | 0.1 |
| Na | 1,000 | 100 | 10 | 1 | 0.1 |
| Ni | 1,000 | 100 | 10 | 1 | 0.1 |
| V | 1,000 | 100 | 10 | 1 | 0.1 |
| Ti | 1,000 | 100 | 10 | 1 | 0.1 |
| Ce | 1,000 | 100 | 10 | 1 | 0.1 |
| Cr | 1,000 | 100 | 10 | 1 | 0.1 |
| S | 1,000 | 100 | 10 | 1 | 0.1 |
| As | 1,000 | 100 | 10 | 1 | 0.1 |
| Total of one or more of the above | 3,000 | 500 | 50 | 10 | 1 |

In an embodiment, Pr may also be considered an impurity in some applications and if so consider the limits and amounts of table 3 may be applicable to Pr.

Unless specified otherwise, as used herein, when reference is made to purity levels, high purity, % purity, % impurities, and similar such terms, excess carbon, i.e., beyond stoichiometric SiC, is not included, referenced to, considered, or used in the calculations or characterization of the material. In some applications excess carbon may have little to no effect on the application or product, and thus, would not be considered an impurity. In other applications excess carbon may be beneficial, e.g., carbon can act as a sintering aid; excess carbon can be used to address and compensate for irregularities in vapor deposition apparatus and processes.

In applications where nitrogen is viewed as a contaminate, embodiments of polysilocarb derived SiC and SiOC can have less than about 1000 ppm, less than about 100 ppm, less than about 10 ppm, less than about 1 ppm and less than about 0.1 ppm nitrogen, and lower.

In an embodiment of the polysilocarb derived SiC it is essentially free from, and free from the presence of Oxygen, in any form, either bound to Si or C or as an oxide layer. Thus, embodiments of polysilocarb derived SiC can have less than about 1000 ppm, less than about 100 ppm, less than about 10 ppm, less than about 1 ppm, and less than about 0.1 ppm oxygen, and lower. The polysilocarb derived SiC has the ability to resist, and does not form an oxide layer when exposed to air under standard temperatures and pressures. The absence of an oxide layer, i.e., oxide layer free SiC, under when stored under ambient conditions provides advantages in later manufacturing processes, where oxide layers can be viewed as an impurity, or otherwise a detriment to the manufacturing process.

Embodiments of polysilocarb derived SiC are highly versatile materials. They can have several forms, e.g., amorphous, crystalline having many different polytypes, and forming single (or mono-) and polycrystalline structures. One, more than one, and combinations of these various forms, many be in a single batch, volumetric shape, or sample of polysilocarb derived SiC. Thus, the present polysilocarb derived SiC materials finds applications in among other things, abrasives, friction members, optics, ballistic and impact resistant materials, insulation, and electronics.

Polysilocarb derived SiC powder, fines, pellets, or other smaller sized and shaped forms, can be joined together by way of a sintering operation to form component parts and structures.

The joining together, e.g., pressing, sintering, ready-to-press, of embodiments of the present polymer derived SiC can be done in any conventional process, and can be done with the use of sintering aids and other additives that are presently used in conventional processes. Embodiments of the present ultra pure polymer derived SiC provide unique, and believed to be never before present in an SiC, abilities to have their particles joined together without the need for any sintering aids, or processing additives. Thus, embodiments of the present ultra pure SiC are self-sintering, being that they do not require the presence of any sintering aids or additives in order to be joined or otherwise formed, e.g., sintered or pressed, into a solid and preferably monolithic solid shape. The self-sintered ultra pure SiC shapes can be significantly stronger than a corresponding shape that was made with the use of sintering aids. Thus, the self-sintered SiC shape can be 2×, 3×, 4× or more stronger than a similar SiC shape that used sintering aids. It being theorized that the sintering aids are forming bonds or junctures between the SiC particles and that these sintering aid junctures are substantially weaker than the SiC-to-SiC junctures, e.g., direct junctures, in the self-sintered shape.

Embodiments of the present polymer derived SiC, and in particular ultra pure SiC, through vapor deposition processes, crystalline growth processes, joining processes and other processes, can find applications and utilizations in among other things, broad band amplifiers, military communications, radar, telecom, data link and tactical data links, satcom and point-to-point radio power electronics, LED, lasers, lighting and sensors. Additionally, these embodiments can find applications and uses in transistors, such High-electron-mobility transisitors (HEMT), including HEMT-based monolithic microwave integrated circuit (MMIC). These transistors can employ a distributed (traveling-wave) amplifier design approach, and with SiC's greater band gap, enabling extremely wide bandwidths to be achieved in a small footprint. Thus, embodiments of the present inventions would include these devices and articles that are made from or otherwise based upon polymer derived SiC.

Embodiments of the present polymer derived SiC, and in particular ultra pure SiC, through vapor deposition processes, crystalline growth processes, joining processes and other processes, can also find applications and utilizations in among other things, brake rotors and assemblies, brake disks and pads, to make gemstones and semiprecious stones, jewelry, moissanite, and cutting and abrasive applications. Thus, embodiments of the present inventions would include these devices and articles that are made from or otherwise based upon polymer derived SiC.

Embodiments of the present polymer derived SiC, and in particular ultra pure SiC, can be combined with other ceramic power formulations to provide enhanced benefits, reduced costs and both to processes that uses these other ceramic powers. For example BN/SiC/ZrO2 composites, and blends with other refractory/engineering ceramic powders, e.g., AlN, BC, BN, Al2O3, ZrO2, C, SiC, WC, and SiN, to name a few are contemplated. Thus, embodiments of the present inventions would include these devices and articles that are made from or otherwise based upon polymer derived SiC. They may also be used in metal alloying applications, for example to make cermets, or other metallurgy blend and allows. For example they can be so combined to Ti, Fe, Ni and Co, to name a few. Thus, for example, they can form polymer derived SiC—Ti alloys, polymer derived SiC-ferrous alloys, polymer derived SiC—Ni alloys, and polymer derived SiC—Co alloys.

Embodiments of the present polymer derived SiC ceramic power formulations can be utilized in, for example, as a component of, or in the construction of: kiln furniture, furnace tubes, furnace belt links, furnace rollers, nozzles, bearings, corrosion resistant seals, crucibles, refractories, thermal protection systems, RAM-Jet/SCRAM-Jet or anything that flies above Mach 3, rockets, space shuttles, rocket nose-cones and leading edge impact protection systems, SiC/SiC reinforced composites, SiC/C reinforced composites, DC magnetron sputtering targets, thermocouple sheathing, pump seals, and valve sleeves.

Embodiments of the present polymer derived SiC, SiOC and in particular ultra pure SiC and SiOC, through vapor deposition processes, crystalline growth processes, joining processes and other processes can find application and utilization in multi-layer structures, such as, for example a layer on a substrate. This layer can be crystalline, monocrystalline, polycrystalline, or amorphous. There can be structures that have many varied layers, e.g., substrate layer, tie layer, SiC layer, SiOC layer, and other substances. In an embodiment sapphire can be used as a substrate for an epitaxial SiC layer. GaN can also be an acceptable substrate. A tie layer can be used to moderate the lattice mismatch between dissimilar crystalline lattice parameters. Thus, for example where SiOC is used as a substrate it can have a tie layer to support SiC, or GaN layer growth on it.

In an embodiment of this process, high purity, polymer derived SiC, and preferably very small sized, e.g., less than about 100 µm, less than about 10 µm, having a purity of at about 99.999%, preferably about 99.9999% and more preferably about 99.99999% can be sintered into optical components. These optical components can be transmissive to selected wavelengths, e.g., 360-800 nm. They can have indexes of refraction of about 2.65 in the visible spectrum. They can have good, and high optical properties, being free of aberrations, occlusions, and other optical defects. They posses the toughness (e.g., chemical resistance, abrasion resistance, temperature resistance, hardness, of SiC). Thus, for example, then can provide significant improvements to the windows, or clear members, e.g., screens, on cell phones, tablets, touch screens and the like. They may be used for the bodies of these devices as well. These polymer derived SiC windows can be particularly advantageous in demanding applications, where for example, there are harsh environmental or use conditions present. They can be used in many optical applications, including: the generation of light, e.g., lasers, laser diodes, or other light sources; the shaping and transmitting of light, e.g., optical fibers, windows, prisms, lens, optics, mirrors, and internal reflectance elements (e.g., blocks, prisms that rely upon internal reflection to direct the light).

In addition to UV, visible and IR light, the SiC optical components can find applications in over wavelengths of electromagnetic radiation, such as microwave, millimeter wave, x-ray, and high energy beams.

Embodiments of polysilocarb derived SiC, in particular high purity SiC, have many unique properties that, among other things, make them advantageous and desirable for use in the electronics, solar, and power transmission industries and applications. They can function as a semiconductor material that is very stable, and suitable for several demanding applications, including high power, high-frequency, high-temperature, and corrosive environments and uses. Polymer derived SiC is a very hard material with a Young's modulus of 424 GPa. It is essentially chemically inert, and will not react with any materials at room temperature.

Further, prior to the present inventions, it was believe that it was essentially impossible, from all practical standpoints, to diffuse anything into silicon carbide, thus to the extent that dopants are required to be added to the material, they can be added by way of the precursor and thus be present in a controlled manner and amount for growth into a boule, or other structure. Embodiments of precursor formulations may have dopant, or complexes that carry and bind the dopant into the ceramic and then the converted SiC, so that upon vapor deposition process the dopant is available and in a usable form.

Additionally, dopants or other additives to provide custom or predetermined properties to wafers, layers and structures that are made from embodiments of the polymer derived SiC and SiOC can be used with, as a part of, or in conjunction with the present polymer derived materials. In these embodiments, such property enhancing additives would not be considered impurities, as they are intended to be in, necessary to have in, the end product. The property enhancing additives can be incorporated into the liquid precursor materials. Depending on the nature of the property enhancing additive, it may be a part of the precursor back done, it may be complexed, or part of a complex, to incorporate it into the liquid precursors, or it can be present in other forms that will enable it to survive (e.g., be in a form that lets it function as intended in the final material). The property enhancing additive can also be added as a coating to the SiC or SiOC powdered material, can be added as a vapor or gas during processing, or can be in powder form and mixed with the polymer derived SiC or SiOC particles, to name a few. Further, the form and manner in which the property enhancing additive is present, should preferably be such that it has minimal, and more preferably, no adverse effect on processing conditions, processing time, and quality of the end products. Thus, a polysilocarb derived SiC having greater than 5-nines purity, greater than 6-nines purity and greater than 7-nines purity can have amounts of a property enhancing additive present. These amounts can be from about 0.01% to about 50%, about 0.1% to about 5%, about 1% to about 10%, less than 25%, less than 20%, less than 10% and less than 1%, as well as greater and smaller amounts depending upon the additive and the predetermined properties it is intended to impart.

Figure 10:
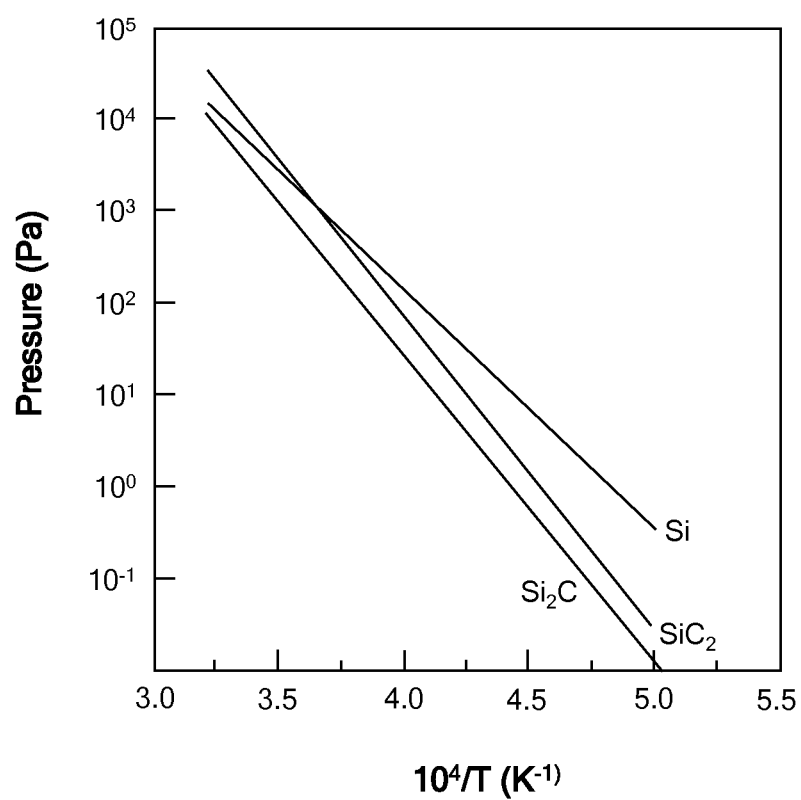
FIG. 10 a partial pressure cure for SiC, $Si_2C$, and $SiC_2$.

Silicon carbide does not generally have a liquid phase, instead it sublimes, under vacuum, at temperatures above about 1,800° C. Turning to FIG. 10 there is provided a chart of a partial pressure curve for SiC. Typically, in industrial and commercial applications conditions are established so that the sublimation takes place at temperatures of about 2,500° C. and above. When Silicon carbide sublimes it typically forms a vapor consisting of Si, SiC, and $SiC_2$. Generally, it was believed that temperature determined the ratio of these different components in the Silicon carbide vapor. The present inventions, however, among other things, provide the capability to preselect and control the ratio of these components of a SiC vapor, for example by controlling the amount of excess carbon present in the polysilocarb derived SiC. Further, by varying, in a controlled manner, the porosity of the polysilocarb derived SiC, the amount of excess carbon present, and both (when used as a starting material in the vapor deposition process), for example, by having layers of SiC material having different predetermined amounts of excess carbon present, the make up of the Si C vapors can be varied in a controlled manner, and varied in a control manner over time.

Figure 3A:
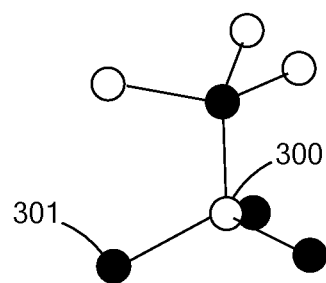
FIG. 3A is a side perspective view of a tetrahedral structure polymer derived SiC in accordance with the present inventions.
Figure 3B:
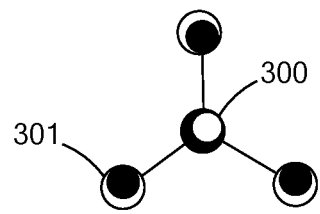
FIG. 3B is a top view of the SiC tetrahedral structure of FIG. 3A.

Polysilocarb derived SiC, and the SiC boules, wafers and other structures that are made from the polysicocarb derived SiC, exhibit polymorphism, and generally a one dimensional polymorphism referred to as polytypism. Thus, polysilocarb derived SiC can be present in many, theoretically infinite, different polytypes. As used herein, unless expressly provided otherwise, the term polytypism, polytypes and similar such terms should be given their broadest possible meaning, and would include the various different frames, structures, or arrangements by which silicon carbide tetrahedrons ($SiC_4$) are configured. Generally, these polytypes fall into two categories—alpha ($\alpha$) and beta ($\beta$). FIGS. 2A and 2B, and 3A and 3B show the side and top view respectively of a single cubic and tetrahedral polymer derived SiC structure. Thus, in FIGS. 2A and B there are shown the single cubic arrangement of SiC, with Si being open circles, e.g., 200 and C being closed circles, e.g., 201. In FIGS. 3A and B there are shown the single tetrahedral arrangement of SiC, with Si being open circles, e.g., 300 and C being closed circles, e.g., 301.

Embodiments of the alpha category of polysilocarb derived SiC typically contains hexagonal (H), rhombohedral (R), trigonal (T) structures and may contain combinations of these. The beta category typically contains a cubic (C) or zincblende structure. Thus, for example, polytypes of polysilocarb derived silicon carbide would include: 3C—SiC ($\beta$—SiC or $\beta$ 3C—SiC), which has a stacking sequence of ABCABC . . . ; 2H—SiC, which has a stacking sequence of ABAB . . . ; 4H—SiC, which has a stacking sequence of ABCBABCB . . . ; and 6H—SiC (a common form of alpha silicon carbide, $\alpha$ 6H—SiC), which has a stacking sequence of ABCACBABCACB . . . . Examples, of other forms of alpha silicon carbide would include 8H, 10H, 16H, 18H, 19H, 15R, 21R, 24H, 33R, 39R, 27R, 48H, and 51R.

Embodiments of polysilocarb derived SiC may be polycrystalline or single (mono-) crystalline. Generally, in polycrystalline materials there are present grain boundaries as the interface between two grains, or crystallites of the materials. These grain boundaries can be between the same polytype having different orientations, or between different polytypes, having the same or different orientations, and combinations and variations of these. Mono-crystalline structures are made up of a single polytype and have essentially no grain boundaries.

Embodiments of the present inventions provide the ability to meet the demand for high purity silicon carbide, and in particular high purity single crystalline carbide materials for use in end products, such as a semiconductors. Thus, for these end products, and uses, which require high purity materials, it is desirable to have a low cost silicon carbide raw material that has a purity of at least about 99.9%, at least about 99.99%, at least about 99.999%, and least about 99.9999% and at least about 99.99999% or greater.

High purity single crystalline silicon carbide material has many desirable features and characteristics. For example, it is very hard having a Young's modulus of 424 GPa. Polycrystalline silicon carbide may also have very high hardness, depending upon its grain structure and other factors.

Embodiments of the present polysilocarb derived SiC would include the ability to provide larger diameter or cross section (e.g., about 5 inches, greater than 5 inches, about 6 inches, greater than 7 inches, about 8 inches, greater than 8 inches, greater than 9 inches, about 12 inches, and greater) seed crystals, boules and other structures. Such larger diameter or cross section structures can preferably have a purity of at least about 99.9%, at least about 99.99%, at least about 99.999%, and least about 99.9999% and at least about 99.99999% or greater.

Embodiments of the present inventions include articles, e.g., semiconductors, of silicon carbide having a band gap that varies by polytype between 2.39 eV for (beta SiC) 3C—SiC to 3.33 eV for 2H—SiC. 4H—SiC has a band gap of 3.265 eV. Alpha silicon carbide (6H—SiC) has a band gap of 3.023 eV. These band gaps are larger than for Si, which has a band gap of 1.11 eV. The high band gap allows silicon carbide materials to work in sensors, e.g., a gas sensor, that are operated in high temperature, e.g., up to about 1,000° C., environments. For example, a silicon carbide based gas sensor can have response times of only a few milliseconds while operating in temperatures of about 1,000° C.

Embodiments of materials made from polymer derived SiC, SiOC, and in particular high purity polymer derived SiC and SiOC, can be utilized in power devices and power device applications. For power device applications, the breakdown electric field strength $E_{max}$ can be an important property. This property quantizes how high the largest field in the material may be before material breakdown occurs (e.g., catastrophic breakdown). The $E_{max}$ is dependent upon doping levels, but in general for a SiC material and a Si material having the same doping levels the SiC $E_{max}$ can be on the order of 4 to 10 times greater. $E_{max}$ and relative $E_{max}$ can also be viewed from the perspective of the relative strengths of a device constructed to have the same blocking voltage. Thus, an Si device constructed for a blocking voltage of I kV would have a critical field strength of about 0.2 MV/cm, and a similar SiC device would have a critical field strength of about 2.49 MV/cm.

Embodiments of materials made from polymer derived SiC, SiOC, and in particular high purity polymer derived SiC and SiOC, can be utilized in high frequency devices and high frequency applications. Saturation drift velocity can be an important property for high frequency devices. Silicon carbide has a saturation drift velocity of $2 \times 10^7$ cm/sec$^2$, while a similar silicon's saturation drift velocity is about half of that. High saturation drift velocities are advantageous, if not necessary, for high-gain solid state devices. Thus, with embodiments of the present inventions providing high purity, low cost (e.g., cost effective) silicon carbide, it now can become a preferred choice from a materials perspective for such devices. However, it is believed that it was a choice that generally the art would not make, prior to the present inventions, because of the costs associated with utilizing silicon carbide; and the difficulty, if not impossibility in obtaining the needed purity.

Embodiments of materials made from polymer derived SiC, SiOC, and in particular high purity polymer derived SiC and SiOC, can be utilized in high thermal conductivity applications. The thermal conductivity of silicon carbide is higher than that of copper at room temperature, and it is believe may be superior to most if not all metals. For example the thermal conductivity of silver is 4.18 W/(cm-K), and of copper is 4.0 W/(cm-K) at room temperature.

High purity silicon carbide can have thermal conductivity of greater than about 4.0 W/(cm-K), greater than about 4.5 W/(cm-K), about 4.9 W/(cm-K), and greater at room temperature.

Embodiments of the present inventions, and the advances in SiC processing and materials provided by the present inventions, can replace silicon materials, in many, the majority, if not essentially all electronics and other applications; as well as additional and new, applications and uses beyond conventional silicon based semiconductor and electrons applications.

Embodiments of polysilocarb derived high purity SiC, e.g., having a purity of at least about 99.9%, at least about 99.99%, at least about 99.999%, and least about 99.9999% and at least about 99.99999% or greater, can have many different polytypes. The polysilocarb derived high purity SiC and SiOC may be present as alpha ($\alpha$), beta ($\beta$) and combinations and variations of these. Embodiments of the alpha category of polysilocarb derived high purity SiC typically contains hexagonal (H), rhombohedral (R), trigonal (T) structures and may contain combinations of these. The beta category of polysilocarb derived high purity SiC typically contains a cubic (C) or zincblende structure. Thus, for example, polytypes of polysilocarb derived high purity silicon carbide would include: 3C—SiC ($\beta$—SiC or $\beta$3C—SiC); 2H—SiC; 4H—SiC; and 6H—SiC (a common form of alpha silicon carbide, $\alpha$ 6H—SiC), which has a stacking sequence of ABCACBABCACB .... Examples, of other forms of alpha silicon carbide would include 8H, 10H, 16H, 18H, 19H, 15R, 21R, 24H, 33R, 39R, 27R, 48H, and 51R. Embodiments of polysilocarb-derived high purity SiC can be polycrystalline or single (mono-) crystalline. High purity SiOC, and SiOC derived SiC may be in an amorphous form.

Embodiments of the present inventions have the ability to provide, and are, high purity SiOC and SiC in the form of volumetric structures, e.g., pucks, briquettes, bricks, blocks, tablets, pills, plates, discs, squares, balls, rods, random shapes, etc. These volumetric shapes have a wide range of sizes, generally from about $\frac{1}{16}$ in$^3$ to about 1 ft$^3$, although larger and smaller volumes are contemplated. Embodiments of the volumetric structures can be very soft, and crumbly, or friable, preferably having the ability to fall apart with average hand pressure. Thus, these friable SiC volumetric structures can have: an elastic modulus of less than about 200 GPa, less than about 150 GPa, less than about 75 GPa, and less than about 10 GPa and smaller; a hardness of less than about 1,400 Kg/mm$^2$ less than about 800 Kg/mm$^2$, less than about 400 Kg/mm$^2$, less than about 100 Kg/mm$^2$ and smaller; and, compressive strength of less than about 1,850 MPa, of less than about 1,000 MPa of less than about 750 MPa, of less than about 200 MPa, of less than about 50 MPa, and smaller. Thus, these friable SiC volumetric shapes are substantially weaker than their underlying SiC material that makes up their structure, and which has reported values of elastic modulus of about 410 GPa, hardness of about 2,800 Kg/mm$^2$ and compressive strength of about 3,900 MPa. The actual density of the SiC, measured by Helium Pycnometry, is from about 3.0 to 3.5 g/cc, or about 3.1 to 3.4 g/cc, or about 3.2 to 3.3 g/cc. The apparent density, or specific gravity, for the friable volumetric shapes of SiC, e.g., pellets, pills, etc., may be significantly lower.

The mass of SiC (e.g., volumetric shape of the granular SiC particles, friable mass) preferably, and typically, has an apparent density that is considerably lower, than its actual density, e.g., actual density of an SiC granule should be about 3.1 g/cc to 3.3 g/cc. In general, and typically, the apparent and actual density of the granular SiC that is obtained from crushing the friable mass are essentially identical. The apparent density for the friable mass (e.g. a puck, pellet, disk or plate) can be less than about 3 g/cc, less than about 2 g/cc. less than about 1 g/cc and lower, and can be from about 0.5 g/cc to about 1.5 g/cc, about 0.4 g/cc to about 2 g/cc. The bulk density for particles of the SiC can be less than about 3.0 g/cc, less than about 2.0 g/cc, less than about 1 g/cc, and from about 0.1 g/cc to about 2 g/cc, 0.5 g/cc to about 1.5 g/cc. Greater and lower apparent densities and bulk densities are also contemplated. Moreover, specific, i.e., predetermined and precise, apparent densities for a friable mass of polymer derived SiC can be provided to match, and preferably enhance and more preferable optimize, later manufacturing processes. For example, in CVD wafer making, the friable mass of SiC granules can have an apparent density that is specifically designed and tailored to match a specific CVD apparatus. In this manner, each CVD apparatus in a facility can have custom feed stock, which enables each apparatus' performance to be optimized by the use of the feed stock (e.g., the friable mass of SiC) having a predetermined and precise apparent density.

The friable SiC volumetric shapes can thus be easily and quickly broken down into much smaller particles of SiC, having the typical strength characteristics of SiC. The smaller particles can be less than about 10 mm in diameter, less than about 1 mm in diameter, less than about 0.01 mm in diameter, less than about 100 µm (microns) in diameter, less than about 10 µm in diameter, and less than about 1 µm, less than about 500 nm (nanometers), to less than about 100 nm it being understood that smaller and larger sizes are contemplated.

Thus, embodiments of the present invention provide for the formation of a friable mass or volumetric shape of SiC, from a SiOC precursor, and from this friable mass of SiC obtain granular SiC. The granular SiC having significantly greater strength than the bulk properties of the friable mass of SiC. For example, the granular SiC can have an elastic modulus that is about 2× greater than the mass of SiC, about 3× greater than the mass of SiC, about 4× greater than the mass of SiC, and greater; the granular SiC can have a hardness that is about 2× greater than the mass of SiC, about 3× greater than the mass of SiC, about 4× greater than the mass of SiC, and greater; the granular SiC can have an compressive strength that is about 2× greater than the mass of SiC, about 3× greater than the mass of SiC, about 4× greater than the mass of SiC, and greater; and combinations and variation of these increased strength related features.

The friable mass of SiC that is obtained from for example the process of the embodiment of FIG. 1 (e.g., 103c of segment 108) can be reduced to granular SiC with crushing equipment such as a ball mill, an attrition mill, a rotor stator mill, a hammer mill, a jet-mill, a roller mill, a bead mill, a media mill, a grinder, a homogenizer, a two-plate mill, a dough mixer, and other types of grinding, milling and processing apparatus.

The friable mass of SiC has an inherent porosity to it. This porosity is preferably open hole, or substantially open hole porosity. In this manner, the friable mass typically provides substantially greater available surface area than granular SiC, because the granules are packed against one another. Thus, for example, if a friable discs of SiC were used in a vapor deposition process to make SiC boules (for subsequent conversion into SiC wafers), these friable SiC discs would provide substantially greater surface area from which to create SiC vapor, and substantially greater paths for movement of the SiC vapor, than could typically be obtained from using granular SiC in such a process. It is theorized that the increase surface area and the increased pathways, provides the ability to increase the rate of growth of the SiC boule, the quality of the SiC boule (and thus the subsequent wafers) and both of these. The friable SiC discs, e.g., the mass of SiC, may be easier to handle, measure, and use than the granular SiC material.

The friable mass of SiC preferably, and typically, has an apparent density that is considerably lower, than its actual density, e.g., actual density should be about 3.2 g/cc. In generally, the granular SiC, which is obtained from crushing the friable mass, has an apparent and actual density that are essentially identical, e.g., about 3.1 to 3.3 g/cc.

The force required to break up the friable mass of SiC to a granular form is minimal, compared to the force that was need with conventional methods of making SiC (e.g., by carbothermal reduction of silica, Acheson type or based). The conventional methods, typically produce a batch of SiC in a monolith, having the strength of SiC, and which typically must be granulized, e.g., ground, cut, shaved, or milled, down to useful sizes. Thus, embodiments of the present inventions avoid the need for such heavy or robust grinding equipment to granulize the monolith of SiC. They further avoid the high cost of power, e.g., electricity, to operate such grinding equipment. They also greatly reduce the time need to granulize the SiC. It could take upwards of week(s), using this heaving grinding equipment, to granulize the monolith SiC to a useful size. While, an embodiment of the friable mass of SiC of the present inventions can be granulized in only a few hours, an hour, less than an hour, less than 30 minutes, a few minutes, and less. This grinding process for example can be, for example, post processing segment 108 of the embodiment of FIG. 1.

The features of the high purity polysicocarb SiC provide several advantages and benefits for use in, e.g., as the Si and C source or starting material, vapor deposition processes, systems and apparatus, among other techniques for growing or creating a SiC mass, structure, article or volumetric shape. These features include: the ability to have high purity levels, a high purity levels, the ability to control particle size distribution (shape, size and both); predetermined particle size distribution; the ability to have volumetric shapes; predetermined volumetric shapes (e.g., pucks, pills, discs, etc.); the ability to have porosity and control porosity; predetermined porosity; the ability to control the amount of carbon; predetermined carbon amounts (both excess, i.e., greater than stoichiometric, starved, i.e., less than stoichiometric and stoichiometric); and combinations and variations of these and other properties. While additional advantages for the present inventions may be seen, presently and by way of example, these advantages in vapor deposition processes would include shortening the time to grow the boule or other structure, longer run times before cleaning, the ability to optimize an apparatus, the ability to grow larger diameter boules or other structures, the ability to increase quality, the ability to reduce problematic areas, problematic regions or problematic occurrences (e.g., pipes, occlusions, imperfections) from the boule or other structure, reduced costs, greater control over the process, and combinations and variations of these.

It should be understood that the use of headings in this specification is for the purpose of clarity, and is not limiting in any way. Thus, the processes and disclosures described under a heading should be read in context with the entirely of this specification, including the various examples. The use of headings in this specification should not limit the scope of protection afford the present inventions.

General Processes for Obtaining a Polysilocarb Precursor

Typically polymer derived ceramic precursor formulations, and in particular polysilocarb precursor formulations can generally be made by three types of processes, although other processes, and variations and combinations of these processes may be utilized. These processes generally involve combining precursors to form a precursor formulation. One type of process generally involves the mixing together of precursor materials in preferably a solvent free process with essentially no chemical reactions taking place, e.g., "the mixing process." The other type of process generally involves chemical reactions, e.g., "the reaction type process," to form specific, e.g., custom, precursor formulations, which could be monomers, dimers, trimers and polymers. A third type of process has a chemical reaction of two or more components in a solvent free environment, e.g., "the reaction blending type process." Generally, in the mixing process essentially all, and preferably all, of the chemical reactions take place during subsequent processing, such as during curing, pyrolysis and both.

It should be understood that these terms—reaction type process, reaction blending type process, and the mixing type process—are used for convenience and as a short hand reference. These terms are not, and should not be viewed as, limiting. For example, the reaction process can be used to create a precursor material that is then used in the mixing process with another precursor material.

These process types are described in this specification, among other places, under their respective headings. It should be understood that the teachings for one process, under one heading, and the teachings for the other processes, under the other headings, can be applicable to each other, as well as, being applicable to other sections, embodiments and teachings in this specification, and vice versa. The starting or precursor materials for one type of process may be used in the other type of processes. Further, it should be understood that the processes described under these headings should be read in context with the entirely of this specification, including the various examples and embodiments.

It should be understood that combinations and variations of these processes may be used in reaching a precursor formulation, and in reaching intermediate, end and final products. Depending upon the specific process and desired features of the product the precursors and starting materials for one process type can be used in the other. A formulation from the mixing type process may be used as a precursor, or component in the reaction type process, or the reaction blending type process. Similarly, a formulation from the reaction type process may be used in the mixing type process and the reaction blending process. Similarly, a formulation from the reaction blending type process may be used in the mixing type process and the reaction type process. Thus, and preferably, the optimum performance and features from the other processes can be combined and utilized to provide a cost effective and efficient process and end product. These processes provide great flexibility to create custom features for intermediate, end, and final products, and thus, any of these processes, and combinations of them, can provide a specific predetermined product. In selecting which type of process is preferable, factors such as cost, controllability, shelf life, scale up, manufacturing ease, etc., can be considered.

In addition to being commercially available the precursors may be made by way of an alkoxylation type process, e.g., an ethoxylation process. In this process chlorosilanes are reacted with ethanol in the presences of a catalyst, e.g., HCl, to provide the precursor materials, which materials may further be reacted to provide longer chain precursors. Other alcohols, e.g., methanol may also be used. Thus, for example $SiC_4$, $SiC_3H$, $SiCl_2(CH_3)_2$, $SiCl_2(CH_3)H$, $Si(CH_3)3Cl$, $Si(CH_3)ClH$, are reacted with ethanol $CH_3CH_2OH$ to form precursors. In some of these reactions phenols may be the source of the phenoxy group, which is substituted for a hydride group that has been placed on the silicon. One, two or more step reactions may need to take place.

Precursor materials may also be obtained byway of an acetylene reaction route. In general there are several known paths for adding acetylene to Si—H. Thus, for example, tetramethylcyclotetrasiloxane can be reacted with acetylene in the presence of a catalyst to produce tetramethyltetravinylcyclotetrasiloxane. This product can then be ring opened and polymerized in order to form linear vinyl, methylsiloxanes. Alternatively, typical vinyl silanes can be produced by reacting methyl, dichlorosilane (obtained from the direct process or Rochow process) with acetylene. These monomers can then be purified (because there maybe some scrambling) to form vinyl, methyl, dichlorosilane. Then the vinyl monomer can be polymerized via hydrolysis to form many cyclic, and linear siloxanes, having various chain lengths, including for example various cyclotetrasiloxanes (e.g., $D_4'$) and various cyclopentasiloxanes (e.g., $D_5'$). These paths, however, are costly, and there has been a long standing and increasing need for a lower cost raw material source to produce vinyl silanes. Prior to the present inventions, it was not believed that MHF could be used in an acetylene addition process to obtain vinyl silanes. MHF is less expensive than vinyl, methyl (either linear or cyclic), and adding acetylene to MHF to make vinyl meets, among other things, the long standing need to provide a more cost effective material and at relatively inexpensive costs. In making this addition the following variables, among others, should be considered and controlled: feed ($D_4'$, linear methyl, hydrogen siloxane fluids); temperature; ratio of acetylene to Si—H; homogeneous catalysts (Karstedt's, Dibutyltindilaureate, no catalyst, Karstedt's with inhibitor, chloroplatinic acid, ashby's); supported catalysts (Pt on carbon, Pt on alumina, Pd on alumina); flow rates (liquid feed, acetylene feed); pressure; and, catalyst concentration. Examples of embodiments of reactions providing for the addition of acetylene to MHF (cyclic and linear) are provided in Tables A and B. Table A are batch acetylene reactions. Table B are continuous acetylene reactions. It should be understood that batch, continuous, counter current flow of MHF and acetylene feeds, continuous recycle of single pass material to achieve higher conversions, and combinations and variations of these and other processes can be utilized.

TABLE A

Batch Acetylene Reactions

| Run | Si—H | Methyl Hydride (grams) | Catalyst % (rel to MeH) | Inhibitor | Solvent | Amount of Solvent (grams) | Temp (° C.) | Acetylene Flow (ccm) | Reaction Time (hrs) | Acetyl Mol % (rel to Total Hydride) |
|---|---|---|---|---|---|---|---|---|---|---|
| 1 | MHF | 400 | 0.48% | 0.00% | — | — | 80-100 | — | 0.20 | — |
| 2 | MHF | 1000 | 0.27% | 0.00% | — | — | 65-75 | 276-328 | 0.75 | 3.4% |
| 3 | MHF | 1000 | 0.00% | 0.00% | — | — | 80 100 120 | 378-729 | 6.33 | 49.4% |
| 4 | MHF | 117 | 0.20% | 0.00% | Hexane | 1000 | 60-66 | 155-242 | 4.50 | 188.0% |
| 5 | MHF | 1000 | 0.40% | 0.40% | — | — | 55-90 | 102 | 7.5 | 15.7% |
| 6 | MHF | 360 | 1.00% | 0.00% | Hexane | 392 | 65 | 102 | 6.4 | 40.3% |
| 7a | MHF | 360 | 0.40% | 0.00% | Hexane | 400 | 65 | — | 2.0 | 23.4% |
| 7b | MHF | 280 | 0.40% | 0.00% | Hexane | 454 | 68 | — | 137.0 | 23.4% |
| 8 | D4' | 1000 | 0.27% | 0.00% | — | — | 79 | 327-745 | 6.5 | 61.3% |
| 9 | MHF | 370 | 0.40% | 0.00% | Hexane | 402 | 65 | 155-412 | 8.0 | 140.3% |

TABLE B

Continuous Acetylene Reactions

| Run | Si—H | Catalyst % (rel to MeH) | Inhibitor | Silane Conc (wt %) | Solvent | Reactor Temp (° C.) | Reactor Pressure (psig) | Acetyl Mol % (rel to Total Hydride) |
|---|---|---|---|---|---|---|---|---|
| 10 | D4' | 5% Pt on Carbon | 0.00% | 100.0% | — | 60-100 | 50 | 40.0% |
| 11 | D4' | 5% Pt on Carbon | 0.00% | 100.0% | — | 50-90 | 100 | 20.0% |
| 12 | D4' | 1% Pt on Alumina | 0.00% | 100.0% | — | 40-50 | 50 | 23.8% |
| 13 | MHF | 5% Pt on Carbon | 0.00% | 100.0% | — | 55-60 | 55-60 | 13.6% |
| 14 | MHF | 0.01% Pt on Alumina | 0.00% | 20.0% | Hexane | 20-25 | 50 | 108.5% |
| 15 | MHF | 0.01% Pt on Alumina | 0.00% | 20.0% | Hexane | 60 | 50-55 | 117.1% |
| 16 | MHF | 0.01% Pt on Alumina | 0.00% | 20.0% | Hexane | 70 | 50 | 125.1% |

TABLE B-continued

Continuous Acetylene Reactions

| Run | Si—H | Catalyst % (rel to MeH) | Inhibitor | Silane Conc (wt %) | Solvent | Reactor Temp (° C.) | Reactor Pressure (psig) | Acetyl Mol % (rel to Total Hydride) |
|---|---|---|---|---|---|---|---|---|
| 17 | MHF | 0.12% Pt on Alumina | 0.00% | 20.0% | Hexane | 60 | 50 | 133.8% |
| 18 | MHF | 0.12% Pt on Alumina | 0.00% | 4.0% | Hexane | 60 | 50 | 456.0% |

(D4' is tetramethyl tetrahydride cyclotetrasiloxane)

Continuous High Pressure Reactor ("CHPR") embodiments may be advantageous for, among other reasons: reaction conversion saving more acetylene needed in liquid phase; tube reactors providing pressures which in turn increases solubility of acetylene; reaction with hexyne saving concentration and time (e.g., 100 hours); can eliminate homogeneous catalyst and thus eliminate hydrosilylation reaction with resultant vinyls once complete; and, using a heterogeneous (Solid) catalyst to maintain product integrity, increased shelf-life, increase pot-life and combinations and variations of these.

In addressing the various conditions in the acetylene addition reactions, some factors may be: crosslinking retardation by dilution, acetylene and lower catalyst concentration; and conversion (using heterogeneous catalyst) may be lower for larger linear molecules compared to smaller molecules.

The presence and quality of vinyl and vinyl conversions can be determined by, among other things: FT-IR for presence of vinyl absorptions, decrease in SiH absorption; $^1$H NMR for presence of vinyls and decrease in SiH; $^{13}$C NMR for presence of vinyls.

As used herein, unless specified otherwise the terms %, weight % and mass % are used interchangeably and refer to the weight of a first component as a percentage of the weight of the total, e.g., formulation, mixture, material or product. As used herein, unless specified otherwise "volume %" and "% volume" and similar such terms refer to the volume of a first component as a percentage of the volume of the total, e.g., formulation, material or product.

The Mixing Type Process

Precursor materials may be methyl hydrogen, and substituted and modified methyl hydrogens, siloxane backbone additives, reactive monomers, reaction products of a siloxane backbone additive with a silane modifier or an organic modifier, and other similar types of materials, such as silane based materials, silazane based materials, carbosilane based materials, phenol/formaldehyde based materials, and combinations and variations of these. The precursors are preferably liquids at room temperature, although they may be solids that are melted, or that are soluble in one of the other precursors. (In this situation, however, it should be understood that when one precursor dissolves another, it is nevertheless not considered to be a "solvent" as that term is used with respect to the prior art processes that employ non-constituent solvents, e.g., solvents that do not form a part or component of the end product, are treated as waste products, and both.)

The precursors are mixed together in a vessel, preferably at room temperature. Preferably, little, and more preferably no solvents, e.g., water, organic solvents, polar solvents, non-polar solvents, hexane, THF, toluene, are added to this mixture of precursor materials. Preferably, each precursor material is miscible with the others, e.g., they can be mixed at any relative amounts, or in any proportions, and will not separate or precipitate. At this point the "precursor mixture" or "polysilocarb precursor formulation" is compete (noting that if only a single precursor is used the material would simply be a "polysilocarb precursor" or a "polysilocarb precursor formulation" or a "formulation"). Although complete, fillers and reinforcers may be added to the formulation. In preferred embodiments of the formulation, essentially no, and more preferably no chemical reactions, e.g., crosslinking or polymerization, takes place within the formulation, when the formulation is mixed, or when the formulation is being held in a vessel, on a prepreg, or over a time period, prior to being cured.

The precursors can be mixed under numerous types of atmospheres and conditions, e.g., air, inert, $N_2$, Argon, flowing gas, static gas, reduced pressure, elevated pressure, ambient pressure, and combinations and variations of these.

Additionally, inhibitors such as cyclohexane, 1-Ethynyl-1-cyclohexanol (which may be obtained from ALDRICH), Octamethylcyclotetrasiloxane, and tetramethyltetravinylcyclotetrasiloxane, may be added to the polysilocarb precursor formulation, e.g., an inhibited polysilocarb precursor formulation. It should be noted that tetramethyltetravinylcyclotetrasiloxane may act as both a reactant and a reaction retardant (e.g., an inhibitor), depending upon the amount present and temperature, e.g., at room temperature it is a retardant and at elevated temperatures it is a reactant. Other materials, as well, may be added to the polysilocarb precursor formulation, e.g., a filled polysilocarb precursor formulation, at this point in processing, including fillers such as SiC powder, carbon black, sand, polymer derived ceramic particles, pigments, particles, nano-tubes, whiskers, or other materials, discussed in this specification or otherwise known to the arts. Further, a formulation with both inhibitors and fillers would be considered an inhibited, filled polysilocarb precursor formulation.

Depending upon the particular precursors and their relative amounts in the polysilocarb precursor formulation, polysilocarb precursor formulations may have shelf lives at room temperature of greater than 12 hours, greater than 1 day, greater than 1 week, greater than 1 month, and for years or more. These precursor formulations may have shelf lives at high temperatures, for example, at about 90° F., of greater than 12 hours, greater than 1 day, greater than 1 week, greater than 1 month, and for years or more. The use of inhibitors may further extend the shelf life in time, for higher temperatures, and combinations and variations of these. The use of inhibitors, may also have benefits in the development of manufacturing and commercial processes, by controlling the rate of reaction, so that it takes place in the desired and intended parts of the process or manufacturing system.

As used herein the term "shelf life" should be given its broadest possible meaning, unless specified otherwise, and would include, for example, the formulation being capable of being used for its intended purpose, or performing, e.g., functioning, for its intended use, at 100% percent as well as a freshly made formulation, at least about 90% as well as a freshly made formulation, at least about 80% as well as a freshly made formulation, and at least about 70% as well as a freshly made formulation.

Precursors and precursor formulations are preferably non-hazardous materials. They have flash points that are preferably above about 70° C., above about 80° C., above about 100° C. and above about 300° C., and above. Preferably, they may be noncorrosive. Preferably, they may have a low vapor pressure, may have low or no odor, and may be non- or mildly irritating to the skin.

A catalyst or initiator may be used, and can be added at the time of, prior to, shortly before, or at an earlier time before the precursor formulation is formed or made into a structure, prior to curing. The catalysis assists in, advances, and promotes the curing of the precursor formulation to form a preform.

The time period where the precursor formulation remains useful for curing after the catalysis is added is referred to as "pot life", e.g., how long can the catalyzed formulation remain in its holding vessel before it should be used. Depending upon the particular formulation, whether an inhibitor is being used, and if so the amount being used, storage conditions, e.g., temperature, low $O_2$ atmosphere, and potentially other factors, precursor formulations can have pot lives, for example, of from about 5 minutes to about 10 days, about 1 day to about 6 days, about 4 to 5 days, about 30 minutes, about 15 minutes, about 1 hour to about 24 hours, and about 12 hours to about 24 hours.

The catalyst can be any platinum (Pt) based catalyst, which can, for example, be diluted to a ranges of: about 0.01 parts per million (ppm) Pt to about 250 ppm Pt, about 0.03 ppm Pt, about 0.1 ppm Pt, about 0.2 ppm Pt, about 0.5 ppm Pt, about 0.02 to 0.5 ppm Pt, about 1 ppm to 200 ppm Pt and preferably, for some applications and embodiments, about 5 ppm to 50 ppm Pt. The catalyst can be a peroxide based catalyst with, for example, a 10 hour half life above 90 C at a concentration of between 0.1% to 3% peroxide, and about 0.5% and 2% peroxide. It can be an organic based peroxide. It can be any organometallic catalyst capable of reacting with Si—H bonds, Si—OH bonds, or unsaturated carbon bonds, these catalysts may include: dibutyltin dilaurate, zinc octoate, peroxides, organometallic compounds of for example titanium, zirconium, rhodium, iridium, palladium, cobalt or nickel. Catalysts may also be any other rhodium, rhenium, iridium, palladium, nickel, and ruthenium type or based catalysts. Combinations and variations of these and other catalysts may be used. Catalysts may be obtained from ARKEMA under the trade name LUPEROX, e.g., LUPEROX 231; and from Johnson Matthey under the trade names: Karstedt's catalyst, Ashby's catalyst, Speier's catalyst.

Further, custom and specific combinations of these and other catalysts may be used, such that they are matched to specific formulations, and in this way selectively and specifically catalyze the reaction of specific constituents. Moreover, the use of these types of matched catalyst-formulations systems may be used to provide predetermined product features, such as for example, pore structures, porosity, densities, density profiles, high purity, ultra high purity, and other morphologies or features of cured structures and ceramics.

In this mixing type process for making a precursor formulation, preferably chemical reactions or molecular rearrangements only take place during the making of the starting materials, the curing process, and in the pyrolizing process. Chemical reactions, e.g., polymerizations, reductions, condensations, substitutions, take place or are utilized in the making of a starting material or precursor. In making a polysilocarb precursor formulation by the mixing type process, preferably no and essentially no, chemical reactions and molecular rearrangements take place. These embodiments of the present mixing type process, which avoid the need to, and do not, utilize a polymerization or other reaction during the making of a precursor formulation, provides significant advantages over prior methods of making polymer derived ceramics. Preferably, in the embodiments of these mixing type of formulations and processes, polymerization, crosslinking or other chemical reactions take place primarily, preferably essentially, and more preferably solely during the curing process.

The precursor may be a siloxane backbone additive, such as, methyl hydrogen (MH), which formula is shown below.

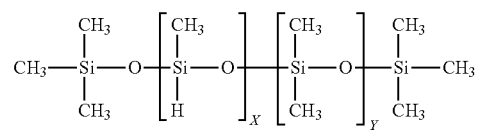

The MH may have a molecular weight ("mw" which can be measured as weight averaged molecular weight in amu or as g/mol) from about 400 mw to about 10,000 mw, from about 600 mw to about 3,000 mw, and may have a viscosity preferably from about 20 cps to about 60 cps. The percentage of methylsiloxane units "X" may be from 1% to 100%. The percentage of the dimethylsiloxane units "Y" may be from 0% to 99%. This precursor may be used to provide the backbone of the cross-linked structures, as well as, other features and characteristics to the cured preform and ceramic material. This precursor may also, among other things, be modified by reacting with unsaturated carbon compounds to produce new, or additional, precursors. Typically, methyl hydrogen fluid (MHF) has minimal amounts of "Y", and more preferably "Y" is for all practical purposes zero.

The precursor may be a siloxane backbone additive, such as vinyl substituted polydimethyl siloxane, which formula is shown below.

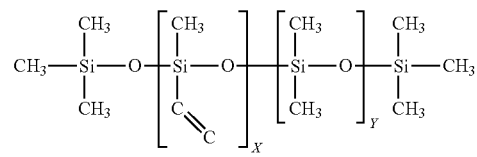

This precursor may have a molecular weight (mw) from about 400 mw to about 10,000 mw, and may have a viscosity preferably from about 50 cps to about 2,000 cps. The percentage of methylvinylsiloxane units "X" may be from 1% to 100%. The percentage of the dimethylsiloxane units "Y" may be from 0% to 99%. Preferably, X is about 100%. This precursor may be used to decrease cross-link density and improve toughness, as well as, other features and characteristics to the cured preform and ceramic material.

The precursor may be a siloxane backbone additive, such as vinyl substituted and vinyl terminated polydimethyl siloxane, which formula is shown below.

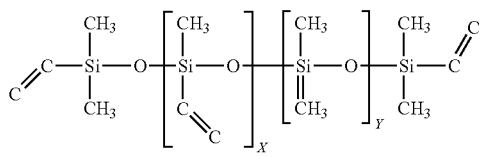

This precursor may have a molecular weight (mw) from about 500 mw to about 15,000 mw, and may preferably have a molecular weight from about 500 mw to 1,000 mw, and may have a viscosity preferably from about 10 cps to about 200 cps. The percentage of methylvinylsiloxane units "X" may be from 1% to 100%. The percentage of the dimethylsiloxane units "Y" may be from 0% to 99%. This precursor may be used to provide branching and decrease the cure temperature, as well as, other features and characteristics to the cured preform and ceramic material.

The precursor may be a siloxane backbone additive, such as vinyl substituted and hydrogen terminated polydimethyl siloxane, which formula is shown below.

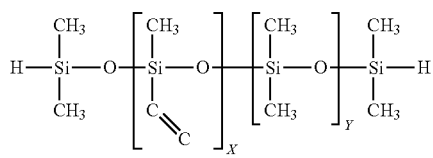

This precursor may have a molecular weight (mw) from about 300 mw to about 10,000 mw, and may preferably have a molecular weight from about 400 mw to 800 mw, and may have a viscosity preferably from about 20 cps to about 300 cps. The percentage of methylvinylsiloxane units "X" may be from 1% to 100%. The percentage of the dimethylsiloxane units "Y" may be from 0% to 99%. This precursor may be used to provide branching and decrease the cure temperature, as well as, other features and characteristics to the cured preform and ceramic material.

The precursor may be a siloxane backbone additive, such as allyl terminated polydimethyl siloxane, which formula is shown below.

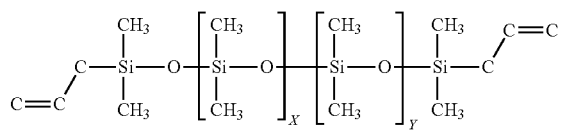

This precursor may have a molecular weight (mw) from about 400 mw to about 10,000 mw, and may have a viscosity preferably from about 40 cps to about 400 cps. The repeating units are the same. This precursor may be used to provide UV curability and to extend the polymeric chain, as well as, other features and characteristics to the cured preform and ceramic material.

The precursor may be a siloxane backbone additive, such as vinyl terminated polydimethyl siloxane, which formula is shown below.

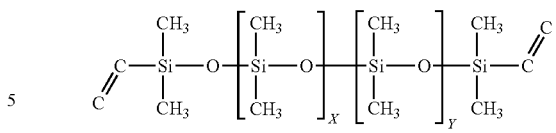

This precursor may have a molecular weight (mw) from about 200 mw to about 5,000 mw, and may preferably have a molecular weight from about 400 mw to 1,500 mw, and may have a viscosity preferably from about 10 cps to about 400 cps. The repeating units are the same. This precursor may be used to provide a polymeric chain extender, improve toughness and to lower cure temperature down to for example room temperature curing, as well as, other features and characteristics to the cured preform and ceramic material.

The precursor may be a siloxane backbone additive, such as silanol (hydroxy) terminated polydimethyl siloxane, which formula is shown below.

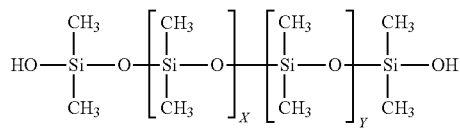

This precursor may have a molecular weight (mw) from about 400 mw to about 10,000 mw, and may preferably have a molecular weight from about 600 mw to 1,000 mw, and may have a viscosity preferably from about 30 cps to about 400 cps. The repeating units are the same. This precursor may be used to provide a polymeric chain extender, a toughening mechanism, can generate nano- and micro-scale porosity, and allows, curing at room temperature, as well as other features and characteristics to the cured preform and ceramic material.

The precursor may be a siloxane backbone additive, such as silanol (hydroxy) terminated vinyl substituted dimethyl siloxane, which formula is shown below.

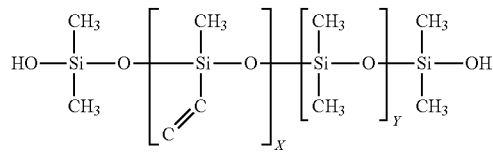

This precursor may have a molecular weight (mw) from about 400 mw to about 10,000 mw, and may preferably have a molecular weight from about 600 mw to 1,000 mw, and may have a viscosity preferably from about 30 cps to about 400 cps. The percentage of methylvinylsiloxane units "X" may be from 1% to 100%. The percentage of the dimethylsiloxane units "Y" may be from 0% to 99%. This precursor may be used, among other things, in a dual-cure system; in this manner the dual-cure can allow the use of multiple cure mechanisms in a single formulation. For example, both condensation type cure and addition type cure can be utilized. This, in turn, provides the ability to have complex cure profiles, which for example may provide for an initial cure via one type of curing and a final cure via a separate type of curing.

The precursor may be a siloxane backbone additive, such as hydrogen (hydride) terminated polydimethyl siloxane, which formula is shown below.

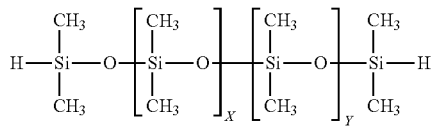

This precursor may have a molecular weight (mw) from about 200 mw to about 10,000 mw, and may preferably have a molecular weight from about 500 mw to 1,500 mw, and may have a viscosity preferably from about 20 cps to about 400 cps. The repeating units are the same. This precursor may be used to provide a polymeric chain extender, as a toughening agent, and it allows lower temperature curing, e.g., room temperature, as well as, other features and characteristics to the cured preform and ceramic material.

The precursor may be a siloxane backbone additive, such as di-phenyl terminated siloxane (which may also be referred to as phenyl terminated), which formula is shown below.

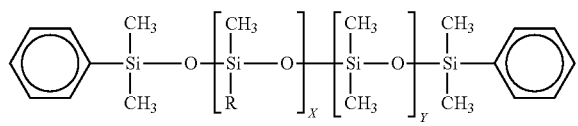

Where here R is a reactive group, such as vinyl, hydroxy, or hydride. This precursor may have a molecular weight (mw) from about 500 mw to about 2,000 mw, and may have a viscosity preferably from about 80 cps to about 300 cps. The percentage of methyl R-siloxane units "X" may be from 1% to 100%. The percentage of the dimethylsiloxane units "Y" may be from 0% to 99%. This precursor may be used to provide a toughening agent, and to adjust the refractive index of the polymer to match the refractive index of various types of glass, to provide for example transparent fiberglass, as well as, other features and characteristics to the cured preform and ceramic material.

The precursor may be a siloxane backbone additive, such as a mono-phenyl terminated siloxane (which may also be referred to as trimethyl terminated, phenyl terminated siloxane), which formulas are shown below.

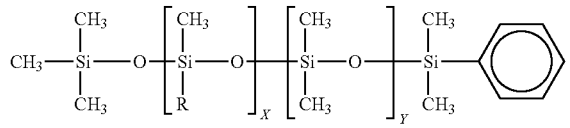

Where R is a reactive group, such as vinyl, hydroxy, or hydride. This precursor may have a molecular weight (mw) from about 500 mw to about 2,000 mw, and may have a viscosity preferably from about 80 cps to about 300 cps. The percentage of methyl-R-siloxane units "X" may be from 1% to 100%. The percentage of the dimethylsiloxane units "Y" may be from 0% to 99%. This precursor may be used to provide a toughening agent and to adjust the refractive index of the polymer to match the refractive index of various types of glass, to provide for example transparent fiberglass, as well as, other features and characteristics to the cured preform and ceramic material.

The precursor may be a siloxane backbone additive, such as diphenyl dimethyl polysiloxane, which formula is shown below.

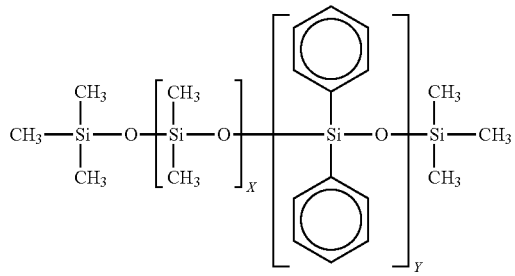

This precursor may have a molecular weight (mw) from about 500 mw to about 20,000 mw, and may have a molecular weight from about 800 to about 4,000, and may have a viscosity preferably from about 100 cps to about 800 cps. The percentage of dimethylsiloxane units "X" may be from 25% to 95%. The percentage of the diphenyl siloxane units "Y" may be from 5% to 75%. This precursor may be used to provide similar characteristics to the mono-phenyl terminated siloxane, as well as, other features and characteristics to the cured preform and ceramic material.

The precursor may be a siloxane backbone additive, such as vinyl terminated diphenyl dimethyl polysiloxane, which formula is shown below.

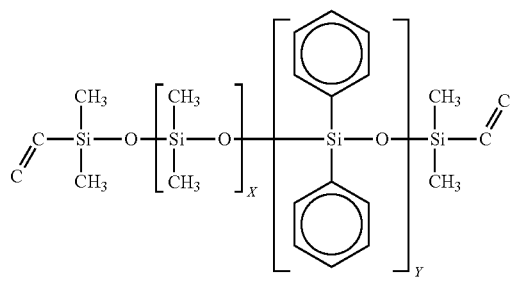

This precursor may have a molecular weight (mw) from about 400 mw to about 20,000 mw, and may have a molecular weight from about 800 to about 2,000, and may have a viscosity preferably from about 80 cps to about 600 cps. The percentage of dimethylsiloxane units "X" may be from 25% to 95%. The percentage of the diphenyl siloxane units "Y" may be from 5% to 75%. This precursor may be used to provide chain extension, toughening agent, changed or altered refractive index, and improvements to high temperature thermal stability of the cured material, as well as, other features and characteristics to the cured preform and ceramic material.

The precursor may be a siloxane backbone additive, such as hydroxy terminated diphenyl dimethyl polysiloxane, which formula is shown below.

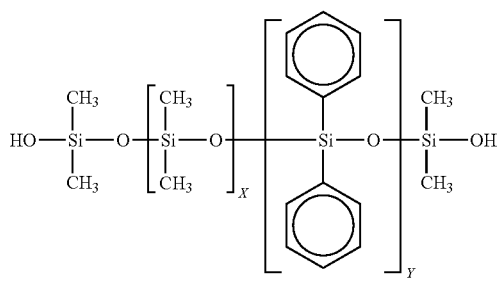

This precursor may have a molecular weight (mw) from about 400 mw to about 20,000 mw, and may have a molecular weight from about 800 to about 2,000, and may have a viscosity preferably from about 80 cps to about 400 cps. The percentage of dimethylsiloxane units "X" may be from 25% to 95%. The percentage of the diphenyl siloxane units "Y" may be from 5% to 75%. This precursor may be used to provide chain extension, toughening agent, changed or altered refractive index, and improvements to high temperature thermal stability of the cured material, can generate nano- and micro-scale porosity, as well as other features and characteristics to the cured preform and ceramic material.

This precursor may be a siloxane backbone additive, such as methyl terminated phenylethyl polysiloxane, (which may also be referred to as styrene vinyl benzene dimethyl polysiloxane), which formula is shown below:

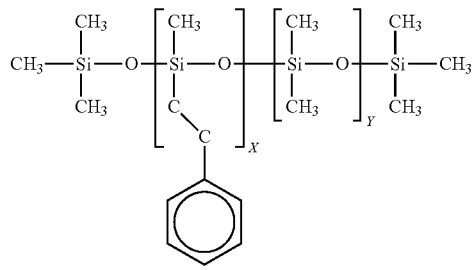

This precursor may have a molecular weight (mw) may be from about 800 mw to at least about 10,000 mw to at least about 20,000 mw, and may have a viscosity preferably from about 50 cps to about 350 cps. The percentage of styrene vinyl benzene siloxane units "X" may be from 1% to 60%. The percentage of the dimethylsiloxane units "Y" may be from 40% to 99%. This precursor may be used to provide improved toughness, decreases reaction cure exotherm, may change or alter the refractive index, adjust the refractive index of the polymer to match the refractive index of various types of glass, to provide for example transparent fiberglass, as well as, other features and characteristics to the cured preform and ceramic material.

A variety of cyclosiloxanes can be used as reactive molecules in the formulation. They can be described by the following nomenclature system or formula: $D_xD^*_y$, where "D" represents a dimethyl siloxy unit and "D*" represents a substituted methyl siloxy unit, where the "*" group could be vinyl, allyl, hydride, hydroxy, phenyl, styryl, alkyl, cyclopentadienyl, or other organic group, x is from 0-8, y is $>=1$, and x+y is from 3-8.

The precursor batch may also contain non-silicon based cross-linking agents, be the reaction product of a non-silicon based cross linking agent and a siloxane backbone additive, and combinations and variation of these. The non-silicon based cross-linking agents are intended to, and provide, the capability to cross-link during curing. For example, non-silicon based cross-linking agents that can be used include: cyclopentadiene (CP), methylcyclopentadiene (MeCP); dicyclopentadiene ("DCPD"), methyldicyclopentadiene (MeDCPD), tricyclopentadiene (TCPD), piperylene, divnylbenzene, isoprene, norbornadiene, vinylnorbornene, propenylnorbornene, isopropenylnorbornene, methylvinylnorbornene, bicyclononadiene, methylbicyclononadiene, propadiene, 4-vinylcyclohexene, 1,3-heptadiene, cycloheptadiene, 1,3-butadiene, cyclooctadiene and isomers thereof. Generally, any hydrocarbon that contains two (or more) unsaturated, C=C, bonds that can react with a Si—H, Si—OH, or other Si bond in a precursor, can be used as a cross-linking agent. Some organic materials containing oxygen, nitrogen, and sulphur may also function as cross-linking moieties.

The precursor may be a reactive monomer. These would include molecules, such as tetramethyltetravinylcyclotetrasiloxane ("TV"), which formula is shown below.

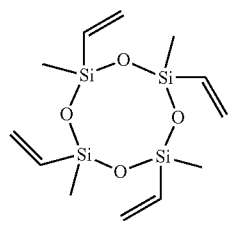 [SMILES: C=C[Si]1(C)O[Si](C)(C=C)O[Si](C)(C=C)O[Si](C)(C=C)O1]

This precursor may be used to provide a branching agent, a three-dimensional cross-linking agent, as well as, other features and characteristics to the cured preform and ceramic material. (It is also noted that in certain formulations, e.g., above 2%, and certain temperatures, e.g., about from about room temperature to about 60° C., this precursor may act as an inhibitor to cross-linking, e.g., in may inhibit the cross-linking of hydride and vinyl groups.)

The precursor may be a reactive monomer, for example, such as trivinyl cyclotetrasiloxane,

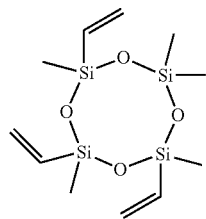 [SMILES: C=C[Si]1(C)O[Si](C)(C)O[Si](C)(C=C)O[Si](C)(C=C)O1]

divinyl cyclotetrasiloxane,

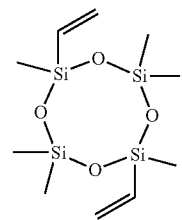

trivinyl monohydride cyclotetrasiloxane,

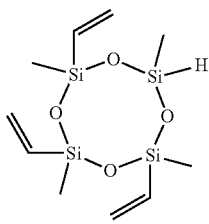 [SMILES: C=C[Si]1(C)O[SiH](C)O[Si](C)(C=C)O[Si](C)(C=C)O1]

divinyl dihydride cyclotetrasiloxane,

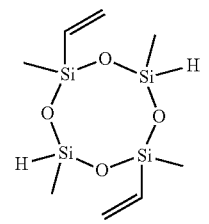 [SMILES: C=C[Si]1(C)O[SiH](C)O[Si](C)(C=C)O[SiH](C)O1]

and a hexamethyl cyclotetrasiloxane, such as,

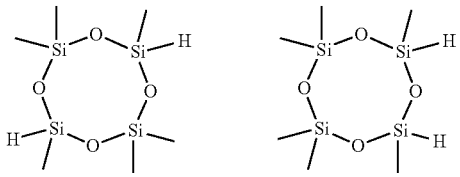

The precursor may be a silane modifier, such as vinyl phenyl methyl silane, diphenyl silane, diphenyl methyl silane, and phenyl methyl silane (some of which may be used as an end capper or end termination group). These silane modifiers can provide chain extenders and branching agents. They also improve toughness, alter refractive index, and improve high temperature cure stability of the cured material, as well as improving the strength of the cured material, among other things. A precursor, such as diphenyl methyl silane, may function as an end capping agent, that may also improve toughness, alter refractive index, and improve high temperature cure stability of the cured material, as well as, improving the strength of the cured material, among other things.

The precursor may be a reaction product of a silane modifier with a vinyl terminated siloxane backbone additive. The precursor may be a reaction product of a silane modifier with a hydroxy terminated siloxane backbone additive. The precursor may be a reaction product of a silane modifier with a hydride terminated siloxane backbone additive. The precursor may be a reaction product of a silane modifier with TV. The precursor may be a reaction product of a silane. The precursor may be a reaction product of a silane modifier with a cyclosiloxane, taking into consideration steric hindrances. The precursor may be a partially hydrolyzed tetraethyl orthosilicate, such as TES 40 or Silbond 40. The precursor may also be a methylsesquisiloxane such as SR-350 available from General Electric Company, Wilton, Conn. The precursor may also be a phenyl methyl siloxane such as 604 from Wacker Chemie AG. The precursor may also be a methylphenylvinylsiloxane, such as H62 C from Wacker Chemie AG.

The precursors may also be selected from the following: SiSiB® HF2020, TRIMETHYLSILYL TERMINATED METHYL HYDROGEN SILICONE FLUID 63148-57-2; SiSiB® HF2050 TRIMETHYLSILYL TERMINATED METHYLHYDROSILOXANE DIMETHYLSILOXANE COPOLYMER 68037-59-2; SiSiB® HF2060 HYDRIDE TERMINATED METHYLHYDROSILOXANE DIMETHYLSILOXANE COPOLYMER 69013-23-6; SiSiB® HF2038 HYDROGEN TERMINATED POLYDIPHENYL SILOXANE; SiSiB® HF2068 HYDRIDE TERMINATED METHYLHYDROSILOXANE DIMETHYLSILOXANE COPOLYMER 115487-49-5; SiSiB® HF2078 HYDRIDE TERMINATED POLY(PHENYLDIMETHYLSILOXY) SILOXANE PHENYL SILSESQUIOXANE, HYDROGEN-TERMINATED 68952-30-7; SiSiB® VF6060 VINYLDIMETHYL TERMINATED VINYLMETHYL DIMETHYL POLYSILOXANE COPOLYMERS 68083-18-1; SiSiB® VF6862 VINYLDIMETHYL TERMINATED DIMETHYL DIPHENYL POLYSILOXANE COPOLYMER 68951-96-2; SiSiB® VF6872 VINYLDIMETHYL TERMINATED DIMETHYL-METHYLVINYL-DIPHENYL POLYSILOXANE COPOLYMER; SiSiB® PC9401 1,1,3,3-TETRAMETHYL-1,3-DIVINYLDISILOXANE 2627-95-4; SiSiB® PF1070 SILANOL TERMINATED POLYDIMETHYLSILOXANE (OF1070) 70131-67-8; SiSiB® OF1070 SILANOL TERMINATED POLYDIMETHYSILOXANE 70131-67-8; OH-ENDCAPPED ENDCAPPED POLYDIMETHYLSILOXANE HYDROXY TERMINATED OLYDIMETHYLSILOXANE 73138-87-1; SiSIB® VF6030 VINYL TERMINATED POLYDIMETHYL SILOXANE 68083-19-2; and, SiSIB® HF2030 HYDROGEN TERMINATED POLYDIMETHYLSILOXANE FLUID 70900-21-9.

Thus, in additional to the forgoing type of precursors, it is contemplated that a precursor may be a compound of the following general formula.

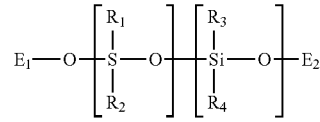

Wherein end cappers $E_1$ and $E_2$ are chosen from groups such as trimethyl silicon (—Si(CH$_3$)$_3$), dimethyl silicon hydroxy (—Si(CH$_3$)$_2$OH), dimethyl silicon hydride (—Si(CH$_3$)$_2$H), dimethyl vinyl silicon (—Si(CH$_3$)$_2$(CH=CH$_2$)), (—Si(CH$_3$)$_2$(C$_6$H$_5$)) and dimethyl alkoxy silicon (—Si(CH$_3$)$_2$(OR). The R groups $R_1$, $R_2$, $R_3$, and $R_4$ may all be different, or one or more may be the same. Thus, for example, $R_2$ is the same as $R_3$, $R_3$ is the same as $R_4$, $R_1$, and $R_2$ are different with $R_3$ and $R_4$ being the same, etc. The R groups are chosen from groups such as hydride (—H), methyl (Me)(—C), ethyl (—C—C), vinyl (—C=C), alkyl (—R)(C$_n$H$_{2n+1}$), allyl (—C—C=C), aryl ('R), phenyl (Ph) (—C$_6$H$_5$), methoxy (—O—C), ethoxy (—O—C—C), siloxy (—O—Si—R$_3$), alkoxy (—O—R), hydroxy (—O—H), phenylethyl (—C—C—C$_6$H$_5$) and methyl, phenyl-ethyl (—C—C(—C)(—C$_6$H$_5$).

In general, embodiments of formulations for polysilocarb formulations may for example have from about 0% to 50% MH, about 20% to about 99% MH, about 0% to about 30% siloxane backbone additives, about 1% to about 60% reactive monomers, about 30% to about 100% TV, and, about 0% to about 90% reaction products of a siloxane backbone additives with a silane modifier or an organic modifier reaction products.

In mixing the formulations sufficient time should be used to permit the precursors to become effectively mixed and dispersed. Generally, mixing of about 15 minutes to an hour is sufficient. Typically, the precursor formulations are relatively, and essentially, shear insensitive, and thus the type of pumps or mixing are not critical. It is further noted that in higher viscosity formulations additional mixing time may be required. The temperature of the formulations, during mixing should preferably be kept below about 45° C., and preferably about 10° C. (It is noted that these mixing conditions are for the pre-catalyzed formulations.)

The Reaction Type Process

In the reaction type process, in general, a chemical reaction is used to combine one, two or more precursors, typically in the presence of a solvent, to form a precursor formulation that is essentially made up of a single polymer that can then be, catalyzed, cured and pyrolized. This process provides the ability to build custom precursor formulations that when cured can provide plastics having unique and desirable features such as high temperature, flame resistance and retardation, strength and other features. The cured materials can also be pyrolized to form ceramics having unique features. The reaction type process allows for the predetermined balancing of different types of functionality in the end product by selecting functional groups for incorporation into the polymer that makes up the precursor formulation, e.g., phenyls which typically are not used for ceramics but have benefits for providing high temperature capabilities for plastics, and styrene which typically does not provide high temperature features for plastics but provides benefits for ceramics.

In general a custom polymer for use as a precursor formulation is made by reacting precursors in a condensation reaction to form the polymer precursor formulation. This precursor formulation is then cured into a preform through a hydrolysis reaction. The condensation reaction forms a polymer of the type shown below.

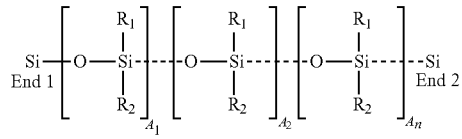

Where $R_1$ and $R_2$ in the polymeric units can be a hydride (—H), a methyl (Me)(—C), an ethyl (—C—C), a vinyl (—C=C), an alkyl (—R)($C_nH_{2n+1}$), an unsaturated alkyl (—$C_nH_{2n-1}$), a cyclic alkyl (—$C_nH_{2n-1}$), an allyl (—C—C=C), a butenyl (—$C_4H_7$), a pentenyl (—$C_5H_9$), a cyclopentenyl (—$C_5H_7$), a methyl cyclopentenyl (—$C_5H_6(CH_3)$), a norbornenyl (—$C_xH_y$, where X=7-15 and Y=9-18), an aryl ('R), a phenyl (Ph)(—$C_6H_5$), a cycloheptenyl (—$C_7H_{11}$), a cyclooctenyl (—$C_8H_{13}$), an ethoxy (—O—C—C), a siloxy (—O—Si—$R_3$), a methoxy (—O—C), an alkoxy, (—O—R), a hydroxy, (—O—H), a phenylethyl (—C—C—$C_6H_5$) a methyl, phenyl-ethyl (—C—C(—C)(—$C_6H_5$)) and a vinylphenyl-ethyl (—C—C($C_6H_4$(—C=C))). $R_1$ and $R_2$ may be the same or different. The custom precursor polymers can have several different polymeric units, e.g., $A_1$, $A_2$, $A_n$, and may include as many as 10, 20 or more units, or it may contain only a single unit, for example, MHF made by the reaction process may have only a single unit.

Embodiments may include precursors, which include among others, a triethoxy methyl silane, a diethoxy methyl phenyl silane, a diethoxy methyl hydride silane, a diethoxy methyl vinyl silane, a dimethyl ethoxy vinyl silane, a diethoxy dimethyl silane. an ethoxy dimethyl phenyl silane, a diethoxy dihydride silane, a triethoxy phenyl silane, a diethoxy hydride trimethyl siloxane, a diethoxy methyl trimethyl siloxane, a trimethyl ethoxy silane, a diphenyl diethoxy silane, a dimethyl ethoxy hydride siloxane, and combinations and variations of these and other precursors, including other precursors set forth in this specification.

The end units, Si End 1 and Si End 2, can come from the precursors of dimethyl ethoxy vinyl silane, ethoxy dimethyl phenyl silane, and trimethyl ethoxy silane. Additionally, if the polymerization process is properly controlled a hydroxy end cap can be obtained from the precursors used to provide the repeating units of the polymer.

In general, the precursors are added to a vessel with ethanol (or other material to absorb heat, e.g., to provide thermal mass), an excess of water, and hydrochloric acid (or other proton source). This mixture is heated until it reaches its activation energy, after which the reaction typically is exothermic. Generally, in this reaction the water reacts with an ethoxy group of the silicon of the precursor monomer, forming a hydroxy (with ethanol as the byproduct). Once formed this hydroxy becomes subject to reaction with an ethoxy group on the silicon of another precursor monomer, resulting in a polymerization reaction. This polymerization reaction is continued until the desired chain length(s) is built.

Control factors for determining chain length, among others, are: the monomers chosen (generally, the smaller the monomers the more that can be added before they begin to coil around and bond to themselves); the amount and point in the reaction where end cappers are introduced; and the amount of water and the rate of addition, among others. Thus, the chain lengths can be from about 180 mw (viscosity about 5 cps) to about 65,000 mw (viscosity of about 10,000 cps), greater than about 1000 mw, greater than about 10,000 mw, greater than about 50,000 mw and greater. Further, the polymerized precursor formulation may, and typically does, have polymers of different molecular weights, which can be predetermined to provide formulation, cured, and ceramic product performance features.

Upon completion of the polymerization reaction the material is transferred into a separation apparatus, e.g., a separation funnel, which has an amount of deionized water that, for example, is from about 1.2x to about 1.5x the mass of the material. This mixture is vigorously stirred for about less than 1 minute and preferably from about 5 to 30 seconds. Once stirred the material is allowed to settle and separate, which may take from about 1 to 2 hours. The polymer is the higher density material and is removed from the vessel. This removed polymer is then dried by either warming in a shallow tray at 90° C. for about two hours; or, preferably, is passed through a wiped film distillation apparatus, to remove any residual water and ethanol. Alternatively, sodium bicarbonate sufficient to buffer the aqueous layer to a pH of about 4 to about 7 is added. It is further understood that other, and commercial, manners of mixing, reacting and separating the polymer from the material may be employed.

Preferably a catalyst is used in the curing process of the polymer precursor formulations from the reaction type process. The same polymers, as used for curing the precursor formulations from the mixing type process can be used. It is noted that, generally unlike the mixing type formulations, a catalyst is not necessarily required to cure a reaction type polymer. Inhibitors may also be used. However, if a catalyst is not used, reaction time and rates will be slower. The curing and the pyrolysis of the cured material from the reaction process is essentially the same as the curing and pyrolysis of the cured material from the mixing process and the reaction blending process.

The reaction type process can be conducted under numerous types of atmospheres and conditions, e.g., air, inert, $N_2$, Argon, flowing gas, static gas, reduced pressure, ambient pressure, elevated pressure, and combinations and variations of these.

The Reaction Blending Type Process

In the reaction blending type process precursor are reacted to from a precursor formulation, in the absence of a solvent. For example, an embodiment of a reaction blending type process has a precursor formulation that is prepared from MHF and Dicyclopentadiene ("DCPD"). Using the reactive blending process a MHF/DCPD polymer is created and this polymer is used as a precursor formulation. (It can be used alone to form a cured or pyrolized product, or as a precursor in the mixing or reaction processes.) MHF of known molecular weight and hydride equivalent mass; "P01" (P01 is a 2% Pt(0) tetravinylcyclotetrasiloxane complex in tetravinylcyclotetrasiloxane, diluted 20× with tetravinylcyclotetrasiloxane to 0.1% of Pt(0) complex. In this manner 10 ppm Pt is provided for every 1% loading of bulk cat.) catalyst 0.20 wt % of MHF starting material (with known active equivalent weight), from 40 to 90%; and Dicyclopentadiene with 83% purity, from 10 to 60% are utilized. In an embodiment of the process, a sealable reaction vessel, with a mixer, can be used for the reaction. The reaction is conducted in the sealed vessel, in air; although other types of atmosphere can be utilized. Preferably, the reaction is conducted at atmospheric pressure, but higher and lower pressures can be utilized. Additionally, the reaction blending type process can be conducted under numerous types of atmospheres and conditions, e.g., air, inert, $N_2$, Argon, flowing gas, static gas, reduced pressure, ambient pressure, elevated pressure, and combinations and variations of these.

In an embodiment, 850 grams of MHF (85% of total polymer mixture) is added to reaction vessel and heated to about 50° C. Once this temperature is reached the heater is turned off, and 0.20% by weight P01 Platinum catalyst is added to the MHF in the reaction vessel. Typically, upon addition of the catalyst bubbles will form and temp will initially rise approximately 2-20° C.

When the temperature begins to fall, about 150 g of DCPD (15 wt % of total polymer mixture) is added to the reaction vessel. The temperature may drop an additional amount, e.g., around 5-7° C.

At this point in the reaction process the temperature of the reaction vessel is controlled to, maintain a predetermined temperature profile over time, and to manage the temperature increase that may be accompanied by an exotherm. Preferably, the temperature of the reaction vessel is regulated, monitored and controlled throughout the process.

In an embodiment of the MHF/DCPD embodiment of the reaction process, the temperature profile can be as follows: let temperature reach about 80° C. (may take ~15-40 min, depending upon the amount of materials present); temperature will then increase and peak at ~104° C., as soon as temperature begins to drop, the heater set temperature is increased to 100° C. and the temperature of the reaction mixture is monitored to ensure the polymer temp stays above 0 for minimum total of about 2 hours and a maximum total of about 4 hours. After 2-4 hours above 80, the heater is turn off, and the polymer is cooled to ambient. It being understood that in larger and smaller batches, continuous, semi-continuous, and other type processes the temperature and time profile may be different.

In larger scale, and commercial operations, batch, continuous, and combinations of these, may be used. Industrial factory automation and control systems can be utilized to control the reaction, temperature profiles and other processes during the reaction.

Table C sets forth various embodiments of reaction blending processes.

TABLE C

| Material Name | degree of polymerization | Equivalents Si/mole | Equivalents O/mole | Equivalents H/mol | Equivalents Vi/mol | Equivalents methyl/mole | Equivalents C/mole | MW | grams/mole of vinyl |
|---|---|---|---|---|---|---|---|---|---|
| tetramethylcyclo-tetrasiloxane ($D_4$) | 4 | 4 | 4 | 4 | 0 | 4 | 4 | 240.51 | |
| MHF | 33 | 35 | 34 | 33 | 0 | 39 | 39 | 2145.345 | |
| VMF | 5 | 7 | 6 | 0 | 5 | 11 | 21 | 592.959 | 118.59 |
| TV | 4 | 4 | 4 | 0 | 4 | 4 | 12 | 344.52 | 86.13 |
| VT 0200 | 125 | 127 | 126 | 0 | 2 | 254 | 258 | 9451.206 | 4725.60 |
| VT 0020 | 24 | 26 | 25 | 0 | 2 | 52 | 56 | 1965.187 | 982.59 |
| VT 0080 | 79 | 81 | 80 | 0 | 2 | 162 | 166 | 6041.732 | 3020.87 |
| Styrene | | | | | 2 | | | 104.15 | 52.08 |
| Dicyclopentadiene | | | | | 2 | | | 132.2 | 66.10 |
| 1,4-divinylbenzene | | | | | 2 | | | 130.19 | 65.10 |
| isoprene | | | | | 2 | | | 62.12 | 31.06 |
| 1,3 Butadiene | | | | | 2 | | | 54.09 | 27.05 |
| Catalyst 10 ppm Pt | | | | | | | | | |
| Catalyst LP 231 | | | | | | | | | |

In the above table, the "degree of polymerization" is the number of monomer units, or repeat units, that are attached together to from the polymer. "Equivalents/mol" refers to the molar equivalents. "Grams/mole of vinyl" refers to the amount of a given polymer needed to provide 1 molar equivalent of vinyl functionality. "VMH" refers to methyl vinyl fluid, a linear vinyl material from the ethoxy process, which can be a substitute for TV. The numbers "0200" etc. for VT are the viscosity in centipoise for that particular VT.

Curing and Pyrolysis

Precursor formulations, including the polysiocarb precursor formulations from the above types of processes, as well as others, can be cured to form a solid, semi-sold, or plastic like material. Typically, the precursor formulations are spread, shaped, or otherwise formed into a preform, which would include any volumetric structure, or shape, including thin and thick films. In curing, the polysilocarb precursor formulation may be processed through an initial cure, to provide a partially cured material, which may also be referred to, for example, as a preform, green material, or green cure (not implying anything about the material's color). The green material may then be further cured. Thus, one or more curing steps may be used. The material may be "end cured," i.e., being cured to that point at which the material has the necessary physical strength and other properties for its intended purpose. The amount of curing may be to a final cure (or "hard cure"), i.e., that point at which all, or essentially all, of the chemical reaction has stopped (as measured, for example, by the absence of reactive groups in the material, or the leveling off of the decrease in reactive groups over time). Thus, the material may be cured to varying degrees, depending upon its intended use and purpose. For example, in some situations the end cure and the hard cure may be the same. Curing conditions such as atmosphere and temperature may effect the composition of the cured material.

In making the precursor formulation into a structure, or preform, the precursor formulation, e.g., polysilocarb formulation, can be, for example, formed using the following techniques: spraying, spray drying, atomization, nebulization, phase change separation, flowing, thermal spraying, drawing, dripping, forming droplets in liquid and liquid-surfactant systems, painting, molding, forming, extruding, spinning, ultrasound, vibrating, solution polymerization, emulsion polymerization, micro-emuslion polymerization, injecting, injection molding, or otherwise manipulated into essentially any volumetric shape. These volumetric shapes may include for example, the following: spheres, pellets, rings, lenses, disks, panels, cones, frustoconical shapes, squares, rectangles, trusses, angles, channels, hollow sealed chambers, hollow spheres, blocks, sheets, coatings, films, skins, particulates, beams, rods, angles, slabs, columns, fibers, staple fibers, tubes, cups, pipes, and combinations and various of these and other more complex shapes, both engineering and architectural.

The forming step, the curing steps, and the pyrolysis steps may be conducted in batch processes, serially, continuously, with time delays (e.g., material is stored or held between steps), and combinations and variations of these and other types of processing sequences. Further, the precursors can be partially cured, or the cure process can be initiated and on going, prior to the precursor being formed into a volumetric shape. These steps, and their various combinations may be, and in some embodiments preferably are, conducted under controlled and predetermined conditions (e.g., the material is exposed to a predetermined atmosphere, and temperature profile during the entirely of its processing, e.g., reduced oxygen, temperature of cured preform held at about 140° C. prior to pyrolysis). It should be further understood that the system, equipment, or processing steps, for forming, curing and pyrolizing may be the same equipment, continuous equipment, batch and linked equipment, and combinations and variations of these and other types of industrial processes. Thus, for example, a spray drying technique could form cured particles that are feed directly into a fluidized bed reactor for pyrolysis.

The polysilocarb precursor formulations can be made into neat, non-reinforced, non-filled, composite, reinforced, and filled structures, intermediates, end products, and combinations and variations of these and other compositional types of materials. Further, these structures, intermediates and end products can be cured (e.g., green cured, end cured, or hard cured), uncured, pyrolized to a ceramic, and combinations and variations of these (e.g., a cured material may be filled with pyrolyzed material derived from the same polysilocarb as the cured material).

The precursor formulations may be used to form a "neat" material, (by "neat" material it is meant that all, and essentially all of the structure is made from the precursor material or unfilled formulation; and thus, there are no fillers or reinforcements).

The polysilocarb precursor formulations may be used to coat or impregnate a woven or non-woven fabric, made from for example carbon fiber, glass fibers or fibers made from a polysilocarb precursor formulation (the same or different formulation), to from a prepreg material. Thus, the polysilocarb precursor formulations may be used to form composite materials, e.g., reinforced products. For example, the formulation may be flowed into, impregnated into, absorbed by or otherwise combined with a reinforcing material, such as carbon fibers, glass fiber, woven fabric, grapheme, carbon nanotubes, thin films, precipitates, sand, non-woven fabric, chopped fibers, fibers, rope, braided structures, ceramic powders, glass powders, carbon powders, graphite powders, ceramic fibers, metal powders, carbide pellets or components, staple fibers, tow, nanostructures of the above, polymer derived ceramics, any other material that meets the temperature requirements of the process and end product, and combinations and variations of these. The reinforcing material may also be made from, or derived from the same material as the formulation that has been formed into a fiber and pyrolized into a ceramic, or it may be made from a different precursor formulation material, which has been formed into a fiber and pyrolized into a ceramic.

The polysilocarb precursor formulation may be used to form a filled material. A filled material would be any material having other solid, or semi-solid, materials added to the polysilocarb precursor formulation. The filler material may be selected to provide certain features to the cured product, the ceramic product and both. These features may relate to, or be, for example, aesthetic, tactile, thermal, density, radiation, chemical, cost, magnetic, electric, and combinations and variations of these and other features. These features may be in addition to strength. Thus, the filler material may not affect the strength of the cured or ceramic material, it may add strength, or could even reduce strength in some situations. The filler material could impart color, magnetic capabilities, fire resistances, flame retardance, heat resistance, electrical conductivity, anti-static, optical properties (e.g., reflectivity, refractivity and iridescence), aesthetic properties (such as stone like appearance in building products), chemical resistivity, corrosion resistance, wear resistance, reduced cost, abrasions resistance, thermal insulation, UV stability, UV protective, and other features that may be desirable, necessary, and both, in the end product or material. Thus, filler materials could include carbon black, copper lead wires, thermal conductive fillers, electrically conductive fillers, lead, optical fibers, ceramic colorants, pigments, oxides, sand, dyes, powders, ceramic fines, polymer derived ceramic particles, pore-formers, carbosilanes, silanes, silazanes, silicon carbide, carbosilazanes, siloxane, powders, ceramic powders, metals, metal complexes, carbon, tow, fibers, staple fibers, boron containing materials, milled fibers, glass, glass fiber, fiber glass, and nanostructures (including nanostructures of the forgoing) to name a few.

The polysilocarb formulation and products derived or made from that formulation may have metals and metal complexes. Filled materials would include reinforced materials. In many cases, cured, as well as pyrolized polysilocarb filled materials can be viewed as composite materials. Generally, under this view, the polysilocarb would constitute the bulk or matrix phase, (e.g., a continuous, or substantially continuous phase), and the filler would constitute the dispersed (e.g., non-continuous), phase. Depending upon the particular application, product or end use, the filler can be evenly distributed in the precursor formulation, unevenly distributed, distributed over a predetermined and controlled distribution gradient (such as from a predetermined rate of settling), and can have different amounts in different formulations, which can then be formed into a product having a predetermined amounts of filler in predetermined areas (e.g., striated layers having different filler concentration). It should be noted, however, that by referring to a material as "filled" or "reinforced" it does not imply that the majority (either by weight, volume, or both) of that material is the polysilcocarb. Thus, generally, the ratio (either weight or volume) of polysilocarb to filler material could be from about 0.1:99.9 to 99.9:0.1.

The polysilocarb precursor formulations may be used to form non-reinforced materials, which are materials that are made of primarily, essentially, and preferably only from the precursor materials; but may also include formulations having fillers or additives that do not impart strength.

The curing may be done at standard ambient temperature and pressure ("SATP", 1 atmosphere, 25° C.), at temperatures above or below that temperature, at pressures above or below that pressure, and over varying time periods. The curing can be conducted over various heatings, rate of heating, and temperature profiles (e.g., hold times and temperatures, continuous temperature change, cycled temperature change, e.g., heating followed by maintaining, cooling, reheating, etc.). The time for the curing can be from a few seconds (e.g., less than about 1 second, less than 5 seconds), to less than a minute, to minutes, to hours, to days (or potentially longer). The curing may also be conducted in any type of surrounding environment, including for example, gas, liquid, air, water, surfactant containing liquid, inert atmospheres, $N_2$, Argon, flowing gas (e.g., sweep gas), static gas, reduced $O_2$, reduced pressure, elevated pressure, ambient pressure, controlled partial pressure and combinations and variations of these and other processing conditions. For high purity materials, the furnace, containers, handling equipment, atmosphere, and other components of the curing apparatus and process are clean, essentially free from, and do not contribute any elements or materials, that would be considered impurities or contaminants, to the cured material. In an embodiment, the curing environment, e.g., the furnace, the atmosphere, the container and combinations and variations of these can have materials that contribute to or effect, for example, the composition, catalysis, stoichiometry, features, performance and combinations and variations of these in the preform, the ceramic and the final applications or products.

Preferably, in embodiments of the curing process, the curing takes place at temperatures in the range of from about 5° C. or more, from about 20° C. to about 250° C., from about 20° C. to about 150° C., from about 75° C. to about 125° C., and from about 80° C. to 90° C. Although higher and lower temperatures and various heating profiles, (e.g., rate of temperature change over time ("ramp rate", e.g., A degrees/time), hold times, and temperatures) can be utilized.

The cure conditions, e.g., temperature, time, ramp rate, may be dependent upon, and in some embodiments can be predetermined, in whole or in part, by the formulation to match, for example the size of the preform, the shape of the preform, or the mold holding the preform to prevent stress cracking, off gassing, or other phenomena associated with the curing process. Further, the curing conditions may be such as to take advantage of, preferably in a controlled manner, what may have previously been perceived as problems associated with the curing process. Thus, for example, off gassing may be used to create a foam material having either open or closed structure. Similarly, curing conditions can be used to create or control the microstructure and the nanostructure of the material. In general, the curing conditions can be used to affect, control or modify the kinetics and thermodynamics of the process, which can affect morphology, performance, features and functions, among other things.

Upon curing the polysilocarb precursor formulation a cross linking reaction takes place that provides in some embodiments a cross-linked structure having, among other things, an —$R_1$—Si—C—C—Si—O—Si—C—C—Si—$R_2$— where $R_1$ and $R_2$ vary depending upon, and are based upon, the precursors used in the formulation. In an embodiment of the cured materials they may have a cross-linked structure having 3-coordinated silicon centers to another silicon atom, being separated by fewer than 5 atoms between silicons.

During the curing process some formulations may exhibit an exotherm, i.e., a self heating reaction, that can produce a small amount of heat to assist or drive the curing reaction, or that may produce a large amount of heat that may need to be managed and removed in order to avoid problems, such as stress fractures. During the cure off gassing typically occurs and results in a loss of material, which loss is defined generally by the amount of material remaining, e.g., cure yield. Embodiments of the formulations, cure conditions, and polysilocarb precursor formulations of embodiments of the present inventions can have cure yields of at least about 90%, about 92%, about 100%. In fact, with air cures the materials may have cure yields above 100%, e.g., about 101-105%, as a result of oxygen being absorbed from the air. Additionally, during curing the material typically shrinks, this shrinkage may be, depending upon the formulation, cure conditions, and the nature of the preform shape, and whether the preform is reinforced, filled, neat or unreinforced, from about 20%, less than 20%, less than about 15%, less than about 5%, less than about 1%, less than about 0.5%, less than about 0.25% and smaller.

Curing of the preform may be accomplished by any type of heating apparatus, or mechanisms, techniques, or morphologies that has the requisite level of temperature and environmental control, for example, heated water baths, electric furnaces, microwaves, gas furnaces, furnaces, forced heated air, towers, spray drying, falling film reactors, fluidized bed reactors, lasers, indirect heating elements, direct heating, infrared heating, UV irradiation, RF furnace, in-situ during emulsification via high shear mixing, in-situ during emulsification via ultrasonication.

The cured preforms, either unreinforced, neat, filled or reinforced, may be used as a stand alone product, an end product, a final product, or a preliminary product for which later machining or processing may be performed on. The preforms may also be subject to pyrolysis, which converts the preform material into a ceramic.

In pyrolizing the preform, or cured structure, or cured material, it is heated to about 600° C. to about 2,300° C.; from about 650° C. to about 1,200° C., from about 800° C. to about 1300° C., from about 900° C. to about 1200° C. and from about 950° C. to 1150° C. At these temperatures typically all organic structures are either removed or combined with the inorganic constituents to form a ceramic.

Typically at temperatures in the about 650° C. to 1,200° C. range the resulting material is an amorphous glassy ceramic. When heated above about 1,200° C. the material typically may from nano crystalline structures, or micro crystalline structures, such as SiC, Si3N4, SiCN, β SiC, and above 1,900° C. an α SiC structure may form, and at and above 2,200° C. α SiC is typically formed. The pyrolized, e.g., ceramic materials can be single crystal, polycrystalline, amorphous, and combinations, variations and subgroups of these and other types of morphologies.

The pyrolysis may be conducted under may different heating and environmental conditions, which preferably include thermo control, kinetic control and combinations and variations of these, among other things. For example, the pyrolysis may have various heating ramp rates, heating cycles and environmental conditions. In some embodiments, the temperature may be raised, and held a predetermined temperature, to assist with known transitions (e.g., gassing, volatilization, molecular rearrangements, etc.) and then elevated to the next hold temperature corresponding to the next known transition. The pyrolysis may take place in reducing atmospheres, oxidative atmospheres, low $O_2$, gas rich (e.g., within or directly adjacent to a flame), inert, $N_2$, Argon, air, reduced pressure, ambient pressure, elevated pressure, flowing gas (e.g., sweep gas, having a flow rate for example of from about from about 15.0 GHSV to about 0.1 GHSV, from about 6.3 GHSV to about 3.1 GHSV, and at about 3.9 GHSV), static gas, and combinations and variations of these.

The pyrolysis is conducted over a time period that preferably results in the complete pyrolysis of the preform. For high purity materials, the furnace, containers, handling equipment, and other components of the pyrolysis apparatus are clean, essentially free from, free from and do not contribute any elements or materials, that would be considered impurities or contaminants, to the pyrolyzed material. A constant flow rate of "sweeping" gas can help purge the furnace during volatile generation. In an embodiment, the pyrolysis environment, e.g., the furnace, the atmosphere, the container and combinations and variations of these, can have materials that contribute to or effect, for example, the composition, stoichiometry, features, performance and combinations and variations of these in the ceramic and the final applications or products.

During pyrolysis material may be lost through off gassing. The amount of material remaining at the end of a pyrolysis step, or cycle, is referred to as char yield (or pyrolysis yield). The formulations and polysilocarb precursor formulations of embodiments of the present formulations can have char yields for SiOC formation of at least about 60%, about 70%, about 80%, and at least about 90%, at least about 91% and greater. In fact, with air pyrolysis the materials may have char yields well above 91%, which can approach 100%. In order to avoid the degradation of the material in an air pyrolysis (noting that typically pyrolysis is conducted in inert atmospheres, reduced oxygen atmosphere, essentially inert atmosphere, minimal oxygen atmospheres, and combinations and variations of these) specifically tailored formulations can be used. For example, formulations high in phenyl content (at least about 11%, and preferably at least about 20% by weight phenyls), formulations high in allyl content (at least about 15% to about 60%) can be used for air pyrolysis to mitigate the degradation of the material.

The initial or first pyrolysis step for SiOC formation, in some embodiments and for some uses, generally yields a structure that is not very dense, and for example, may not reached the density required for its intended use. However, in some examples, such as the use of lightweight spheres, proppants, pigments, and others, the first pyrolysis may be, and is typically sufficient. Thus, generally a reinfiltration process may be performed on the pyrolized material, to add in additional polysilocarb precursor formulation material, to fill in, or fill, the voids and spaces in the structure. This reinfiltrated material may then be cured and repyrolized. (In some embodiments, the reinfiltrated materials is cured, but not pyrolized.) This process of pyrolization, reinfiltration may be repeated, through one, two, three, and up to 10 or more times to obtain the desired density of the final product.

In some embodiments, upon pyrolization, graphenic, graphitic, amorphous carbon structures and combinations and variations of these are present in the Si—O—C ceramic. A distribution of silicon species, consisting of SiOxCy structures, which result in SiO4, SiO3C, SiO2C2, SiOC3, and SiC4 are formed in varying ratios, arising from the precursor choice and their processing history. Carbon is generally bound between neighboring carbons and/or to a Silicon atom. In general, in the ceramic state, carbon is largely not coordinated to an oxygen atom, thus oxygen is largely coordinated to silicon The pyrolysis may be conducted in any heating apparatus that maintains the request temperature and environmental controls. Thus, for example pyrolysis may be done with gas fired furnaces, electric furnaces, direct heating, indirect heating, fluidized beds, kilns, tunnel kilns, box kilns, shuttle kilns, coking type apparatus, lasers, microwaves, and combinations and variations of these and other heating apparatus and systems that can obtain the request temperatures for pyrolysis.

Custom and predetermined control of when chemical reactions, arrangements and rearrangements, occur in the various stages of the process from raw material to final end product can provide for reduced costs, increased process control, increased reliability, increased efficiency, enhanced product features, increased purity, and combinations and variation of these and other benefits. The sequencing of when these transformations take place can be based upon the processing or making of precursors, and the processing or making of precursor formulations; and may also be based upon cure and pyrolysis conditions. Further, the custom and predetermined selection of these steps, formulations and conditions, can provide enhanced product and processing features through the various transformations, e.g., chemical reactions; molecular arrangements and rearrangements; and microstructure arrangements and rearrangements.

At various points during the manufacturing process, the polymer derived ceramic structures, e.g., polysilocarb structures, intermediates and end products, and combinations and variations of these, may be machined, milled, molded, shaped, drilled, etched, or otherwise mechanically processed and shaped.

Starting materials, precursor formulations, polysilocarb precursor formulations, as well as, methods of formulating, making, forming, curing and pyrolizing, precursor materials to form polymer derived materials, structures and ceramics, are set forth in Published US Patent Applications, Publication Nos. 2014/0274658, 2014/0343220, 2014/0326453 and 2015/0175750 and U.S. Patent Application Ser. Nos. 62/106, 094 and 62/193,046, the entire disclosures of each of which are incorporated herein by reference.

Preferred SiOC Derived SiC Curing and Pyrolysis

Preferably, in making SiC, and materials for use in making SiC, in a preferred embodiment the polysilocarb precursors can be mixed at about 1 atmosphere, in cleaned air.

Preferably, in making SiC, and materials for use in making SiC, the curing takes place at temperatures in the range of from about 20° C. to about 150° C., from about 75° C. to about 125° C. and from about 80° C. to 90° C. The curing is conducted over a time period that preferably results in a hard cured material. The curing can take place in air or an inert atmosphere, and preferably the curing takes place in an argon atmosphere at ambient pressure. Most preferably, for high purity materials, the furnace, containers, handling equipment, and other components of the curing apparatus are clean, essentially free from, and do not contribute any elements or materials, that would be considered impurities or contaminants, to the cured material.

Preferably, in making SiC, and materials for use in making SiC, the pyrolysis takes place at temperatures in the range of from about 800° C. to about 1300° C., from about 900° C. to about 1200° C. and from about 950° C. to 1150° C. The pyrolysis is conducted over a time period that preferably results in the complete pyrolysis of the preform. Preferably the pyrolysis takes place in inert gas, e.g., argon, and more preferably in flowing argon gas at or about at atmospheric pressure. The gas can flow from about 1,200 cc/min to about 200 cc/min, from about 800 cc/min to about 400 cc/min, and at about 500 cc/min. Preferably, an initial vacuum evacuation of the processing furnace is completed to a reduced pressure at least below 1E-3 Torr and re-pressurized to greater than 100 Torr with inert gas, e.g., Argon. More preferably, the vacuum evacuation is completed to a pressure below 1E-5 Torr prior to re-pressurizing with inert gas. The vacuum evacuation process can be completed anywhere from zero to >4 times before proceeding. Most preferably, for high purity materials, the furnace, containers, handling equipment, and other components of the curing apparatus are clean, essentially free from, free from and do not contribute any elements or materials, that would be considered impurities or contaminants, to the cured material.

In embodiments were low N and O levels are required, the use of a vacuum, preferably a turbopump, to achieve 10E-6 Torr and backfilling with inert gas is preferable. This purging process can be done once, or multiple times, to achieve low levels. A constant flow rate of "sweeping" gas can help purge the furnace during volatile generation.

Preferably, in making SiC, the ceramic SiOC is converted to SiC in subsequent or continued pyrolysis or conversion steps. The conversion step from SiOC may be a part of, e.g., continuous with, the pyrolysis of the SiOC preform, or it may be an entirely separate step in time, location and both. Depending upon the type of SiC desired the convention step can be carried out from about 1,200° C. to about 2,550° C. and from about 1,300° C. to 1,700° C. Generally, at temperatures from about 1,600° C. to 1900° C., the formation of beta types is favored over time. At temperatures above 1900° C., the formation of alpha types is favored over time. Preferably the conversion takes place in an inert gas, e.g., argon, and more preferably in flowing argon gas at or about at atmospheric pressure. The gas can flow from about 600 cc/min to about 10 cc/min, from about 300 cc/min to about 50 cc/min, and at about 80 cc/min to about 40 cc/min. Most preferably, for high purity materials, the furnace, containers, handling equipment, and other components of the curing apparatus are clean, essentially free from, and do not contribute any elements or materials, that would be considered impurities or contaminants, to the SiC.

The subsequent yields for SiOC derived SiC are generally from about 10% to 50%, typically from 30% to 40%, although higher and lower ranges may be obtained.

Most preferably, when making high purity SiC, the activities associated with making, curing, pyrolizing and converting the material are conducted in, under, clean room conditions, e.g., under an ISO 14644-1 clean room standard of at least ISO 5, of at least ISO 4, of at least ISO 3, of at least ISO 2, and at least ISO 1. In an embodiment the material handling steps are conducted in the cleanroom of at least ISO 5, while a less clean area (ISO>5) is used for the pyrolysis and conversion steps.

The following examples are provided to illustrate various embodiments of, among other things, precursor formulations, processes, methods, apparatus, articles, compositions, and applications of the present inventions. These examples are for illustrative purposes, and should not be viewed as, and do not otherwise limit the scope of the present inventions. The percentages used in the examples, unless specified otherwise, are weight percent of the total batch, preform or structure.

EXAMPLES

Example 1

A polysilocarb formulation using the mixing type method is formulated. The formulation is made by mixing together, at room temperature, 41% MHF and 59% TV. This precursor formulation has 0.68 moles of hydride, 0.68 moles of vinyl, and 1.37 moles of methyl. The precursor formulation has the following molar amounts of Si, C and O based upon 100 g of formulation.

| | Moles | Molar Ratio of Si, C, O (% of total moles in "Moles" Column) |
|---|---|---|
| Si | 1.37 | 25% |
| C | 2.74 | 50% |
| O | 1.37 | 25% |

As calculated, the SiOC derived from this formulation will have a calculated 1.37 moles of C after all CO has been removed, and has 0% excess C.

Example 2

A polysilocarb formulation using the mixing type method is formulated. The formulation is made by mixing together, at room temperature, 90% methyl terminated phenylethyl polysiloxane. (having 27% X) and 10% TV. This precursor formulation has 1.05 moles of hydride, 0.38 moles of vinyl, 0.26 moles of phenyl, and 1.17 moles of methyl. The precursor formulation has the following molar amounts of Si, C and O based upon 100 g of formulation.

| | Moles | Molar Ratio of Si, C, O (% of total moles in "Moles" Column) |
|---|---|---|
| Si | 1.17 | 20% |
| C | 3.47 | 60% |
| O | 1.17 | 20% |

As calculated, the SiOC derived from this formulation will have a calculated 2.31 moles of C after all CO has been removed, and has 98% excess C.

Example 3

A polysilocarb formulation using the mixing type method is formulated. The formulation is made by mixing together at room temperature 70% methyl terminated phenylethyl polysiloxane (having 14% X) and 30% TV. This precursor formulation has 0.93 moles of hydride, 0.48 moles of vinyl, 0.13 moles of phenyl, and 1.28 moles of methyl. The precursor formulation has the following molar amounts of Si, C and O based upon 100 g of formulation.

|    | Moles | Molar Ratio of Si, C, O (% of total moles in "Moles" Column) |
|----|-------|-------------------------------------------------------------|
| Si | 1.28  | 23%                                                         |
| C  | 3.05  | 54%                                                         |
| O  | 1.28  | 23%                                                         |

As calculated, the SiOC derived from this formulation will have a calculated 1.77 moles of C after all CO has been removed, and has 38% excess C.

Example 4

A polysilocarb formulation using the mixing type method is formulated. The formulation is made by mixing together at room temperature 50% methyl terminated phenylethyl polysiloxane (having 20% X) and 50% TV. This precursor formulation has 0.67 moles of hydride, 0.68 moles of vinyl, 0.10 moles of phenyl, and 1.25 moles of methyl. The precursor formulation has the following molar amounts of Si, C and O based upon 100 g of formulation.

|    | Moles | Molar Ratio of Si, C, O (% of total moles in "Moles" Column) |
|----|-------|-------------------------------------------------------------|
| Si | 1.25  | 22%                                                         |
| C  | 3.18  | 56%                                                         |
| O  | 1.25  | 22%                                                         |

As calculated, the SiOC derived from this formulation will have a calculated 1.93 moles of C after all CO has been removed, and has 55% excess C.

Example 5

A polysilocarb formulation using the mixing type method is formulated. The formulation is made by mixing together at room temperature 65% methyl terminated phenylethyl polysiloxane (having 40% X) and 35% TV. This precursor formulation has 0.65 moles of hydride, 0.66 moles of vinyl, 0.25 moles of phenyl, and 1.06 moles of methyl. The precursor formulation has the following molar amounts of Si, C and O based upon 100 g of formulation.

|    | Moles | Molar Ratio of Si, C, O (% of total moles in "Moles" Column) |
|----|-------|-------------------------------------------------------------|
| Si | 1.06  | 18%                                                         |
| C  | 3.87  | 54%                                                         |
| O  | 1.06  | 28%                                                         |

As calculated, the SiOC derived from this formulation will have a calculated 2.81 moles of C after all CO has been removed, and has 166% excess C.

Example 6

A polysilocarb formulation using the mixing type method is formulated. The formulation is made by mixing together at room temperature 65% MHF and 35% dicyclopentadiene (DCPD). This precursor formulation has 1.08 moles of hydride, 0.53 moles of vinyl, 0.0 moles of phenyl, and 1.08 moles of methyl. The precursor formulation has the following molar amounts of Si, C and O based upon 100 g of formulation.

|    | Moles | Molar Ratio of Si, C, O (% of total moles in "Moles" Column) |
|----|-------|-------------------------------------------------------------|
| Si | 1.08  | 18%                                                         |
| C  | 3.73  | 64%                                                         |
| O  | 1.08  | 18%                                                         |

As calculated, the SiOC derived from this formulation will have a calculated 2.65 moles of C after all CO has been removed, and has 144% excess C.

Example 7

A polysilocarb formulation using the mixing type method is formulated. The formulation is made by mixing together at room temperature 82% MHF and 18% dicyclopentadiene (DCPD). This precursor formulation has 1.37 moles of hydride, 0.27 moles of vinyl, 0.0 moles of phenyl, and 1.37 moles of methyl. The precursor formulation has the following molar amounts of Si, C and O based upon 100 g of formulation.

|    | Moles | Molar Ratio of Si, C, O (% of total moles in "Moles" Column) |
|----|-------|-------------------------------------------------------------|
| Si | 1.37  | 25%                                                         |
| C  | 2.73  | 50%                                                         |
| O  | 1.37  | 25%                                                         |

As calculated, the SiOC derived from this formulation will have a calculated 1.37 moles of C after all CO has been removed, and has 0% excess C.

Example 8

A polysilocarb formulation using the mixing type method is formulated. The formulation is made by mixing together at room temperature 46% MHF, 34% TV and 20% VT. This precursor formulation has 0.77 moles of hydride, 0.40 moles of vinyl, 0.0 moles of phenyl, and 1.43 moles of methyl. The precursor formulation has the following molar amounts of Si, C and O based upon 100 g of formulation.

|    | Moles | Molar Ratio of Si, C, O (% of total moles in "Moles" Column) |
|----|-------|-------------------------------------------------------------|
| Si | 1.43  | 30%                                                         |
| C  | 1.95  | 40%                                                         |
| O  | 1.43  | 30%                                                         |

As calculated, the SiOC derived from this formulation will have a calculated 0.53 moles of C after all CO has been removed, and has a 63% C deficit, or is 63% C starved.

Example 9

A polysilocarb formulation using the mixing type method is formulated. The formulation is made by mixing together at room temperature 70% MHF, 20% TV and 10% VT. This precursor formulation has 1.17 moles of hydride, 0.23 moles of vinyl, 0.0 moles of phenyl, and 1.53 moles of methyl. The precursor formulation has the following molar amounts of Si, C and O based upon 100 g of formulation.

|    | Moles | Molar Ratio of Si, C, O (% of total moles in "Moles" Column) |
|----|-------|--------------------------------------------------------------|
| Si | 1.53  | 31%                                                          |
| C  | 1.87  | 38%                                                          |
| O  | 1.53  | 31%                                                          |

As calculated, the SiOC derived from this formulation will have a calculated 0.33 moles of C after all CO has been removed, and has a 78% C deficit, or is 78% C starved.

Example 10

A polysilocarb formulation using the mixing type method is formulated. The formulation is made by mixing together at room temperature 95% MHF AND 5% TV.

Example 11

A polysilocarb formulation using the mixing type method is formulated. The formulation is made by mixing together at room temperature 50% methyl terminated phenylethyl polysiloxane (having 20% X) and 50% TV 95% MHF.

Example 12

A polysilocarb formulation using the mixing type method is formulated. The formulation is made by mixing together at room temperature 54% methyl terminated phenylethyl polysiloxane (having 25% X) and 46% TV.

Example 13

A polysilocarb formulation using the mixing type method is formulated. The formulation is made by mixing together at room temperature 57% methyl terminated phenylethyl polysiloxane (having 30% X) and 43% TV.

Example 14

About 100 grams of a polysilocarb formulation is made. The formulation is blended at room temperature for 15 minutes and then 1% catalyst is added and the mixture is stirred for another 10 minutes. The catalyst has 10 ppm Pt in a short chain vinyl terminated polysiloxane.

The formulation is poured into a Teflon (PTFE, polytetrafluoroehtylene)-coated aluminum foil pan and cured for 2.5 hours at 90° C. in argon or air.

The cured polymer is mechanically broken into sizes that fit into ceramic boats (e.g., crucibles that are 3.5" long×2.5" wide×⅝" deep); and is placed in those ceramic boats. The ceramic boats containing the cured polymer are heated in a stainless steel retort filled with argon gas flowing at 500 cc/min as follows:
  room temp to 82.2° C. at a heating rate of 82.2° C./hr, with a 1 hour hold at 82.2° C.;
  82.2° C. to 182° C. at a heating rate of 48.9° C./hr, with a 1 hour hold at 182° C.;
  182° C. to 210° C. at a heating rate of 48.9° C./hr, with a 2 hour hold at 210° C.;
  210° C. to 1,100° C. at a heating rate of 115.6° C./hr, with a 2 hour hold at 1,10° C.; and,
  cool furnace to 204.4° C. before opening.

The pyrolized material is placed in graphite boats, with the pyrolized material being in powder form or in chunks. The graphite boats are placed into an alumina tube furnace with two end blocks of insulation and caps to allow gas in flow and waist gas outflow. Argon gas at a rate of 50 cc/min is flowed through the tube furnace. The material is then heated to 1,650° C. over a 10 hour period (about 3° C./min heating rate) and is held at this temperature for an additional 10 hours. The furnace is then slowly cooled to 700° C. over a 5 hour period, the furnace is then cooled further, with the end caps being removed when the temperature is at least below 300° C.

The resultant polysilocarb derived SiC is removed from the furnace.

Example 15

A polysilocarb formulation is made in a clean room environment using glassware that has been cleaned so as to essentially remove all potential impurities, including in particular Al, Fe, and B. The formulation is blended at room temperature for about 10 to 20 minutes and then from 0.25% to 2% catalyst solution is added and the mixture is stirred for another 10 minutes. The catalyst solution has 10 ppm Pt. The final catalyzed formulation has between 10 and 50 ppb Pt.

In the clean room environment, the formulation is placed into a PFA (perfluoroalkoxy polymer) bottle or jar, purged with argon, and lid closed. The formulation is cured for from 1.5 hours to 4 hours at from 75° C. to 160° C.

In the clean room environment, the cured polymer is placed into ceramic crucibles. The filled crucibles are then covered with ceramic caps, and placed in a ceramic retort filled with argon gas flowing at 500 cc/min. The crucibles, furnace and all associate apparatus and equipment are clean and essentially contaminate free; and in particular are such that they do not provide a source of Al or B. The crucibles are heated at a rate of increase from about 30° C. to about 180° C./hr as follows:
  room temp to 1,000° C. at a heating rate of 180° C./hr, with a 2 hour hold at 1,000° C.; and,
  cool furnace to 204.4° C. before opening.

The pyrolized material is placed in graphite boats, with the pyrolized material being in powder form or in chunks. The graphite boats are placed into an alumina tube furnace with two end blocks of insulation and caps to allow gas in flow and waste gas outflow. The crucibles, furnace and all associate apparatus and equipment are clean and essentially contaminate free; and in particular, are such that they do not provide a source of Al, Fe, or B. Argon gas at a rate of 50 cc/min is flowed through the tube furnace. The material is then heated to from 1,400° C. to 1,650° C. over a from 7 to 15 hour period (about 3° C./min heating rate) and is held at this temperature for an additional 10 hours. The furnace is then slowly cooled to 700° C. over a 5 hour period, the furnace is then cooled further, with the end caps being removed when the temperature is at least below 300° C.

The resultant polysilocarb derived SiC is removed from the furnace.

Example 15a

A process along the lines of Example 15 is carried out using a graphite vacuum-capable furnace with purified graphite insulation and ports to allow gas in flow and waste gas outflow/vacuum evacuation. Argon gas at a rate of between 1 and 6 volume exchanges of the hot zone per hour is then flowed through the graphite furnace. The material is then heated to from 25° C. to 2100° C. This process can provide 6-nines pure, and purer SiC.

Example 15b

In a process similar to the processes of Examples 15 and 15a, the heating, cooling, and both rates during pyrolysis and during conversion can be from about 1° C./min to about 30° C./min, about 3° C./min to about 20° C./min, about 10° C./min to about 20° C./min, and slower and faster rates, as well as combinations of varied rates, e.g., 1 hour at about 5° C./min and 3 hours at about 10° C./min. The hold times a particular elevated temperature can be from about 0.25 hours to about 24 hours, about 1 hour to about 12 hours, about 3 hours to about 8 hours, less than 24 hours, less than 12 hours, less than 8 hours, longer and shorter times may also be used, as well as combinations and variations of the hold times in a particular heating cycle.

Example 16

A polysilocarb formulation is made in a clean room environment using glassware that has been cleaned so as to essentially remove all potential impurities. The formulation is blended at room temperature until evenly intermixed and then a catalyst is added and the mixture is further stirred to distribute the catalyst. The polysilocarb formulation is then processed into high purity SiC in a continuous process, as follows.

In the clean room environment, the formulation is placed into a graphite container and cured to a hard cure. Without removing the cured material from the furnace, the cured material is transformed to SiOC and then to SiC. During these heatings an inert, non-reactive gas is flowed through the furnace, the cured polymer is placed into ceramic crucibles. (Although $N_2$ is at times viewed as inert, in the making of high purity SiOC and SiC, it is preferably avoided for us in pyrolysis or conversion heatings, because it can react with the Si, forming nitride-containing species such as: silicon oxynitride, silicon nitride, and silicon carbonitrides, for example)

The resultant polysilocarb derived SiC is removed from the furnace.

Example 17

Figure 5:
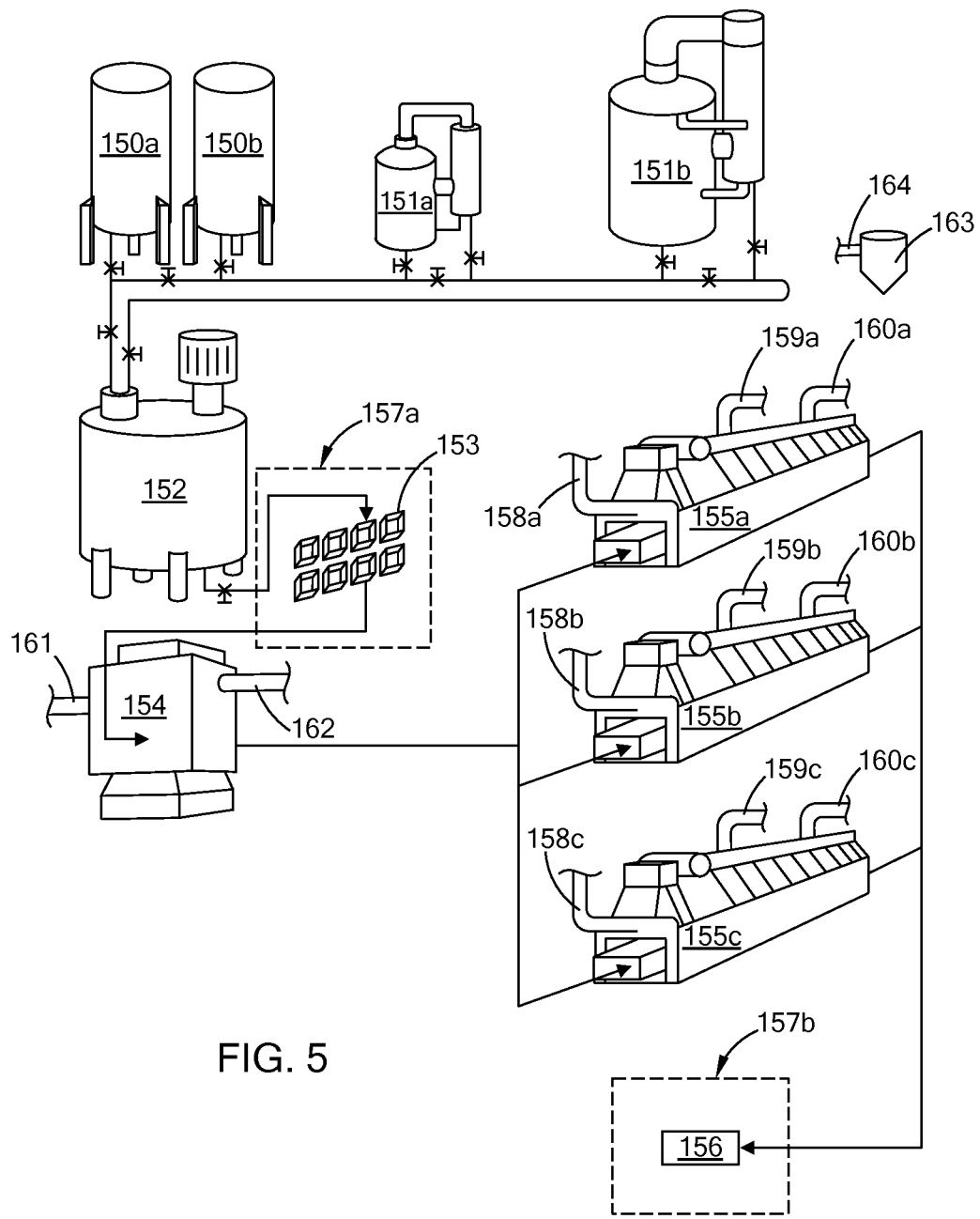
FIG. 5 is a schematic diagram of an embodiment of a system for making polymer derived SiOC and SiC in accordance with the present inventions.

Turning to FIG. 5 there is provided a schematic perspective flow diagram of an embodiment of a system and method for making SiOC derived SiC, and for making such materials in lower purity, and more preferably in higher purity (e.g., 3-nines, 4-nines, 5-nines and more, and preferably 6-nines or more). The lines, valves and interior surfaces of the system containing the precursors and other materials are made from or coated with materials that will not contaminate, e.g., provide a source of impurities, the SiOC and derived SiC. Storage tanks 150*a*, 150*b* hold liquid polysilocarb precursors. In this embodiment one or both or none of the precursors can be taken through a distillation apparatus 151*a* and distillation apparatus 151*b*, to remove any impurities from the liquid precursor. The liquid precursors are then transferred to a mixing vessel 152 where they are mixed to form a precursor batch and catalyzed. In a clean room environment 157*a* the precursor batch is packaged into vessels 153 for placement in a furnace 154. The furnace 154 has sweep gas inlet 161 and off-gas take away line 162. The packaged and cured material is then transferred under clean room conditions, to several pyrolysis furnaces 155*a*, 155*b*, 155*c*, where it is transitioned from SiOC to SiC. The furnaces have sweep gas inlet lines 158*a*, 158*b*, 158*c* respectively, and two off-gas take away lines 159*a* and 160*a*, 159*b* and 160*b*, 169*c* and 160*c* respectively. The resultant SiOC derived SiC is then package 156, in a clean room environment 157*b*, for shipment to or use in other processes. The off-gasses can be processed, cleaned and starting materials recovered in the off-gas processing assembly 163 having an inlet line 164, which collects the off-gasses from various units in the system.

Example 18

Figure 6:
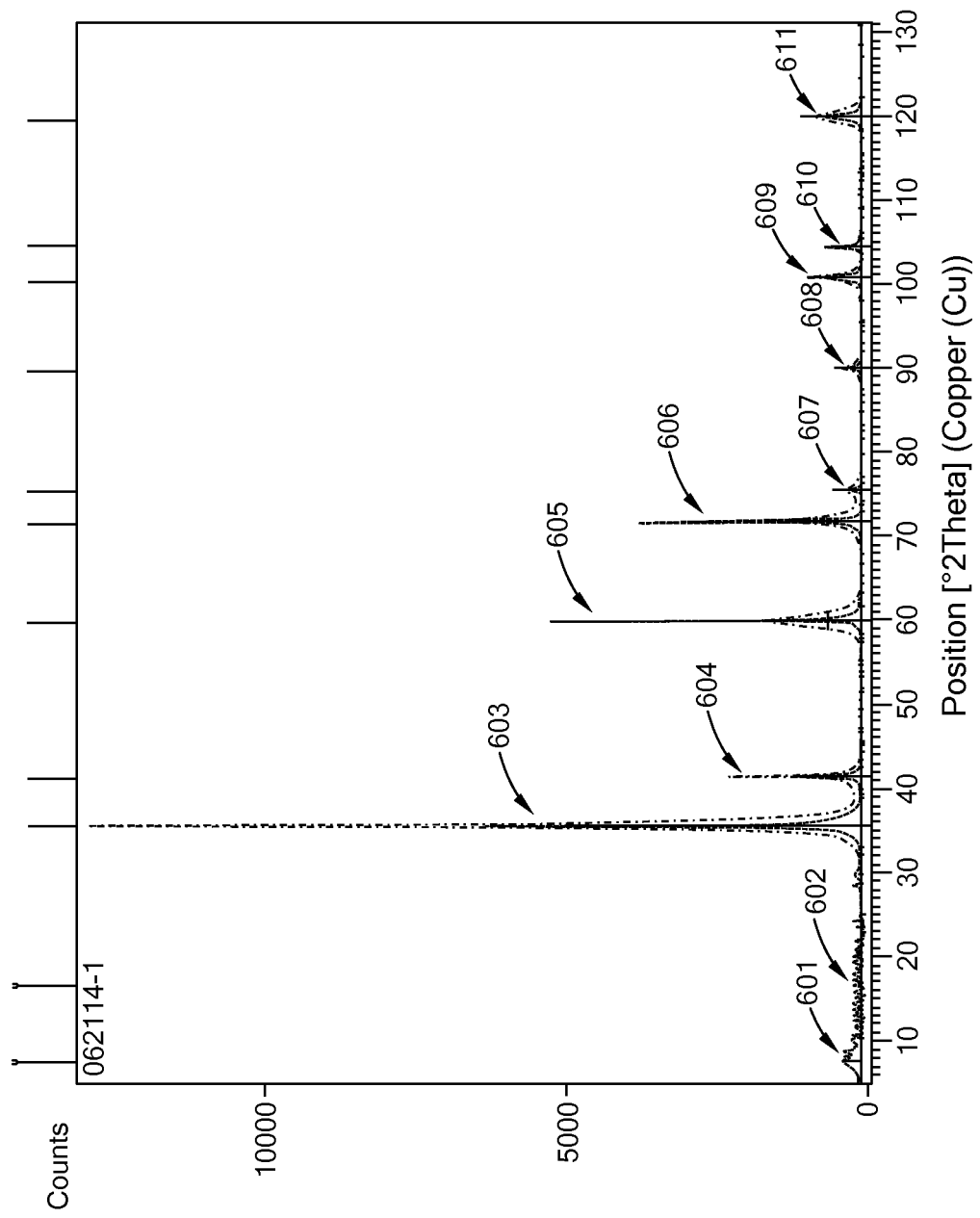
FIG. 6 is a spectrum of a polymer derived SiC in accordance with the present inventions.

SiC made from the process of Example 16, is 99.999 pure and has an X-Ray Diffraction spectrum of FIG. 6. The spectrum is based upon "Position [° 2Theta](Copper)" where area 601 of the spectra corresponds to 7.551-[°]; 2.496[°], where area 602 of the spectra corresponds to 16.737[°]; 3.994[°], where area 603 of the spectra corresponds to 35.644[°]; Si C; 1.498[°], where area 604 of the spectra corresponds to 41.357[°]; Si C; 1.498[°], where area 605 of the spectra corresponds to 59.977[°]; Si C; 1.498[°], where area 606 of the spectra corresponds to 71.730[°]; Si C; 1.498[°], where area 607 of the spectra corresponds to 75.461-[°]; Si C; 1.498[°], where area 608 of the spectra corresponds to 89.958[°]; Si C; 1.498[°], where area 609 of the spectra corresponds to 100.722[°]; Si C; 1.498[°], where area 610 of the spectra corresponds to 104.874[°]; Si C; 1.997[°], and where area 611 of the spectra corresponds to 119.903[°]; Si C; 1.498[°].

Example 19

A polysilocarb formulation having 40% MHF and 60% TV was mixed and a 2% Pt Catalyst. The catalyzed formulation had 97.4 ppb (parts per billion) Al, 108.6 ppb Fe, 214 ppb B, no measurable P, and 96 ppb Pt. The catalyzed formulation was poured into a graphite vessel, which was placed in tube furnace, having an aluminum tube, with a graphite inner. The furnace was heated at a rate of 3° C./min until the temperature reached 1675° C., where the temperature was held for 10 hours. Argon was flowed through the furnace during the entire heating procedure. The SiC obtained was 3 nines pure, (i.e., 99.9% pure), having the following impurities (in ppm): Al 9.8, Fe 3.4, B 4.1, P 0.97, Pt 30, Ca 70, Mg 70, Li 53, Na 26, Ni 1.5, V 0.3, Pr 0.35, Ce 0.08, Cr 0.67, S 0.18, As 0.5.

Example 20

The 3 nines pure SiC material of Example 19, is soaked in an acid wash (10% HNO3+5% HCl solution) and then deionized water rinsed. The washed SiC has a purity of 5 nines.

Example 21

The process of Example 19 was conducted under cleanroom conditions and protocols. The alumina furnace tube was replaced with a ceramic furnace, B, Fe and P were removed from the starting materials, i.e., MHF and TV via ion exchange resin such as Amberlite IRA743, stripped, or distilled. The resulting silicon Carbide is 5 nines pure.

Example 22

The SiC material of Example 21 is washed and rinsed and the cleaned material is 6 nines pure.

Example 23

The starting materials initially have 500 ppb (parts per billion) Al, 5,000 ppb Fe, 500 ppb B, 1,700 ppb P. Using a cleanroom conditions and protocols for this example, the starting materials are cleaned by filtration. A polysilocarb formulation having 40% MHF and 60% TV is made from the cleaned starting materials, mixed, and to which 0.25% Pt Catalyst solution is added. The catalyzed formulation has less than about 50 ppb Al, less than about 50 ppb Fe, less than about 50 ppb B, less than and about 50 ppb P and about 96 ppb Pt. The catalyzed formulation is poured into a graphite vessel, which is placed in a furnace, having a ceramic interior. A shield is place in the furnace to at least partially separate the heating element from the graphite vessel. The furnace is heated at a rate of 2.5° C./min until the temperature reaches 1700° C., where the temperature is held for 12 hours. Argon is flowed through the furnace during the entire heating procedure. The SiC obtained is 5 nines pure, having the following impurities (in ppm): Al 2.1, Fe 0.58, B 0.24, P 0.97, Pt 0.41, Ca<0.5, Mg<0.05, Li<0.01, Na 0.09, Ni 1.5, V<0.01, Pr<0.05, Ce<0.05, Cr<0.1, S<0.1, As <0.5. The SiC is primarily beta type.

Example 24

The SiC material of Example 23 is washed and rinsed and the cleaned material is 6 nines pure.

Example 25

Using a cleanroom conditions and protocols for this example, a polysilocarb formulation having 40% MHF and 60% TV is made from the cleaned starting materials, mixed, and to which a 0.25% Pt Catalyst is added. The catalyzed formulation is poured into a graphite vessel, which is placed in a furnace, having a ceramic interior. The furnace is heated at a rate of 3° C./min until the temperature reaches 2250° C., where the temperature is held for 12 hours. Argon is flowed through the furnace during the entire heating procedure. The SiC obtained is 6 nines pure. The SiC is alpha type.

Example 26

A polysilocarb formulation is made in a clean room environment using glassware that has been cleaned so as to essentially remove all potential impurities. The formulation is blended at room temperature until evenly intermixed and then from a catalyst is added and the mixture is further stirred to distribute the catalyst. The polysilocarb formulation is then processed into high purity SiOC in a continuous process, as follows.

In the clean room environment, the formulation is placed into a graphite container and cured to a hard cure. Without removing the cured material from the furnace, the cured material is transformed to SiOC. During this heating an inert, non-reactive gas, e.g., Ar is flowed through the furnace. The resultant polysilocarb derived SiOC is removed from the furnace. It can be washed, and has a purity of about 99.9999 (e.g., 6 nines), with levels of Al and B being less than 0.1 ppm. The SiOC is stored under cleanroom conditions and protocols to protect it from contamination for later use.

Example 27

A polysilocarb formulation using the mixing type method is formulated. The formulation is made by mixing together 30% of the MHF precursor having a molecular weight of about 800 and 70% of the TV precursor allyl terminated polydimethyl siloxane having a molecular weight of about 500 are mixed together in a vessel and put in storage for later use for making SiOC and SiC. The polysilocarb formulation has good shelf life and room temperature and the precursors have not, and do not react with each other. The polysilocarb formulation has a viscosity of about 10 cps.

Example 28

A polysilocarb formulation using the mixing type method is formulated. The formulation is made by mixing together 10% of the MHF precursor having a molecular weight of about 800 and 73% of methyl terminated phenylethyl polysiloxane (having 10% X) and a molecular weight of about 1,000, and 16% of the TV precursor and 1% of the OH terminated precursor silanol (hydroxy) terminated polydimethyl siloxane, having a molecular weight of about 1,000 are mixed together in a vessel and put in storage for later use in making SiOC and SiC. The polysilocarb formulation has good shelf life and room temperature and the precursors have not, and do not react with each other. The polysilocarb formulation has a viscosity of about 18 cps.

Example 29

A polysilocarb formulation using the mixing type method is formulated. The formulation is made by mixing together 0-90% of the MH precursor having a molecular weight of about 800, and 0-90% of the methyl terminated phenylethyl polysiloxane (having 10% X) and a molecular weight of about 1000, and 0-30% of the TV precursor and 0-30% of the vinyl terminated precursor allyl terminated polydimethyl siloxane having a molecular weight of about 9400 and 0-20% of the OH terminated precursor silanol (hydroxy) terminated polydimethyl siloxane, having a molecular weight of about 800 are mixed together in a vessel and put in storage for later use in forming SiOC and SiC. The polysilocarb formulation has good shelf life and room temperature and the precursors have not, and do not react with each other. The polysilocarb formulation has a viscosity of about 100 cps.

Example 30

A polysilocarb formulation using the mixing type method is formulated. The formulation is made by mixing together 20-80% of the MH precursor having a molecular weight of about 800, and 0-10% of the TV precursor, and 5-80% of the vinyl terminated precursor allyl terminated polydimethyl siloxane having a molecular weight of about are mixed together in a vessel and put in storage for later use to make SiOC and SiC. The polysilocarb formulation has good shelf life and room temperature and the precursors have not, and do not react with each other. The polysilocarb formulation has a viscosity of about 300 cps.

Example 31

Using the reaction type process a precursor formulation was made using the following formulation. The temperature of the reaction was maintained at 61° C. for 21 hours.

| Reactant or Solvent | Mass | % of Total | MW | Moles of Reactant/ solvent | % of Total Moles of Silane | Moles of Si | Moles of EtOH |
|---|---|---|---|---|---|---|---|
| Methyltriethoxysilane | 120.00 | 19.5% | 178.30 | 0.67 | 47.43% | 0.67 | 2.02 |
| Phenylmethyldiethoxysilane | 0.00 | 0.0% | 210.35 | — | 0.00% | — | — |
| Dimethyldiethoxysilane | 70.00 | 11.4% | 148.28 | 0.47 | 33.27% | 0.47 | 0.94 |
| Methyldiethoxysilane | 20.00 | 3.3% | 134.25 | 0.15 | 10.50% | 0.15 | 0.30 |
| Vinylmethyldiethoxysilane | 20.00 | 3.3% | 160.29 | 0.12 | 8.79% | 0.12 | 0.25 |
| Trimethyethoxysilane | 0.00 | 0.0% | 118.25 | — | 0.00% | — | — |
| Hexane in hydrolyzer | 0.00 | 0.0% | 86.18 | — | | | |
| Acetone in hydrolyzer | 320.00 | 52.0% | 58.08 | 5.51 | | | |
| Ethanol in hydrolyzer | 0.00 | 0.0% | 46.07 | — | | | |
| Water in hydrolyzer | 64.00 | 10.4% | 18.00 | 3.56 | | | |
| HCl | 0.36 | 0.1% | 36.00 | 0.01 | | | |
| Sodium bicarbonate | 0.84 | 0.1% | 84.00 | 0.01 | | | |

Example 32

Using the reaction type process a precursor formulation was made using the following formulation. The temperature of the reaction was maintained at 72° C. for 21 hours.

| Reactant or Solvent | Mass | % of Total | MW | Moles of Reactant/ solvent | % of Total Moles of Silane | Moles of Si | Moles of EtOH |
|---|---|---|---|---|---|---|---|
| Phenyltriethoxysilane | 234.00 | 32.0% | 240.37 | 0.97 | 54.34% | 0.97 | 2.92 |
| Phenylmethyldiethoxysilane | 90.00 | 12.3% | 210.35 | 0.43 | 23.88% | 0.43 | 0.86 |
| Dimethyldiethoxysilane | 0.00 | 0.0% | 148.28 | — | 0.00% | — | — |
| Methyldiethoxysilane | 28.50 | 3.9% | 134.25 | 0.21 | 11.85% | 0.21 | 0.42 |
| Vinylmethyldiethoxysilane | 28.50 | 3.9% | 160.29 | 0.18 | 9.93% | 0.18 | 0.36 |
| Trimethyethoxysilane | 0.00 | 0.0% | 118.25 | — | 0.00% | — | — |
| Acetone in hydrolyzer | 0.00 | 0.0% | 58.08 | — | | | |
| Ethanol in hydrolyzer | 265.00 | 36.3% | 46.07 | 5.75 | | | |
| Water in hydrolyzer | 83.00 | 11.4% | 18.00 | 4.61 | | | |
| HCl | 0.36 | 0.0% | 36.00 | 0.01 | | | |
| Sodium bicarbonate | 0.84 | 0.1% | 84.00 | 0.01 | | | |

Example 33

Using the reaction type process a precursor formulation was made using the following formulation. The temperature of the reaction was maintained at 61° C. for 21 hours.

| Reactant or Solvent | Mass | % of Total | MW | Moles of Reactant/ solvent | % of Total Moles of Silane | Moles of Si | Moles of EtOH |
|---|---|---|---|---|---|---|---|
| Phenyltriethoxysilane | 142.00 | 21.1% | 240.37 | 0.59 | 37.84% | 0.59 | 1.77 |
| Phenylmethyldiethoxysilane | 135.00 | 20.1% | 210.35 | 0.64 | 41.11% | 0.64 | 1.28 |
| Dimethyldiethoxysilane | 0.00 | 0.0% | 148.28 | — | 0.00% | — | — |
| Methyldiethoxysilane | 24.00 | 3.6% | 134.25 | 0.18 | 11.45% | 0.18 | 0.36 |
| Vinylmethyldiethoxysilane | 24.00 | 3.6% | 160.29 | 0.15 | 9.59% | 0.15 | 0.30 |
| Trimethyethoxysilane | 0.00 | 0.0% | 118.25 | — | 0.00% | — | — |
| Acetone in hydrolyzer | 278.00 | 41.3% | 58.08 | 4.79 | | | |
| Ethanol in hydrolyzer | 0.00 | 0.0% | 46.07 | — | | | |
| Water in hydrolyzer | 69.00 | 10.2% | 18.00 | 3.83 | | | |
| HCl | 0.36 | 0.1% | 36.00 | 0.01 | | | |
| Sodium bicarbonate | 0.84 | 0.1% | 84.00 | 0.01 | | | |

Example 34

Using the reaction type process a precursor formulation was made using the following formulation. The temperature of the reaction was maintained at 61° C. for 21 hours.

| Reactant or Solvent | Mass | % of Total | MW | Moles of Reactant/ solvent | % of Total Moles of Silane | Moles of Si | Moles of EtOH |
|---|---|---|---|---|---|---|---|
| Phenyltriethoxysilane | 198.00 | 26.6% | 240.37 | 0.82 | 52.84% | 0.82 | 2.47 |
| Phenylmethyldiethoxysilane | 0.00 | 0.0% | 210.35 | — | 0.00% | — | — |
| Dimethyldiethoxysilane | 109.00 | 14.6% | 148.28 | 0.74 | 47.16% | 0.74 | 1.47 |
| Methyldiethoxysilane | 0.00 | 0.0% | 134.25 | — | 0.00% | — | — |
| Vinylmethyldiethoxysilane | 0.00 | 0.0% | 160.29 | — | 0.00% | — | — |
| Trimethyethoxysilane | 0.00 | 0.0% | 118.25 | — | 0.00% | — | — |
| Acetone in hydrolyzer | 365.00 | 49.0% | 58.08 | 6.28 | | | |
| Ethanol in hydrolyzer | 0.00 | 0.0% | 46.07 | — | | | |
| Water in hydrolyzer | 72.00 | 9.7% | 18.00 | 4.00 | | | |
| HCl | 0.36 | 0.0% | 36.00 | 0.01 | | | |
| Sodium bicarbonate | 0.84 | 0.1% | 84.00 | 0.01 | | | |

Example 35

Using the reaction type process a precursor formulation was made using the following formulation. The temperature of the reaction was maintained at 61° C. for 21 hours.

| Reactant or Solvent | Mass | % of Total | MW | Moles of Reactant/ solvent | % of Total Moles of Silane | Moles of Si | Moles of EtOH |
|---|---|---|---|---|---|---|---|
| Phenyltriethoxysilane | 0.00 | 0.0% | 240.37 | — | 0.00% | — | — |
| Phenylmethyldiethoxysilane | 0.00 | 0.0% | 210.35 | — | 0.00% | — | — |
| Dimethyldiethoxysilane | 140.00 | 17.9% | 148.28 | 0.94 | 58.38% | 0.94 | 1.89 |
| Methyldiethoxysilane | 0.00 | 0.0% | 134.25 | — | 0.00% | — | — |
| Vinylmethyldiethoxysilane | 0.00 | 0.0% | 160.29 | — | 0.00% | — | — |
| TES 40 | 140.00 | 17.9% | 208.00 | 0.67 | 41.62% | 0.67 | 2.69 |
| Hexane in hydrolyzer | 0.00 | 0.0% | 86.18 | — | | | |
| Acetone in hydrolyzer | 420.00 | 53.6% | 58.08 | 7.23 | | | |
| Ethanol in hydrolyzer | 0.00 | 0.0% | 46.07 | — | | | |
| Water in hydrolyzer | 84.00 | 10.7% | 18.00 | 4.67 | | | |

Example 35

Figure 7:
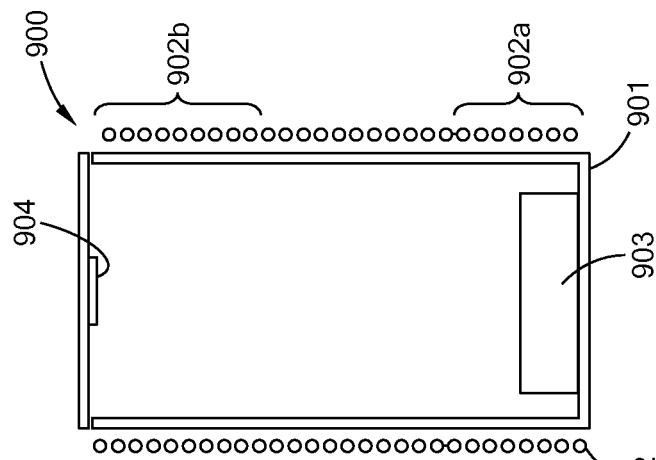
FIG. 7 is a schematic cross sectional diagram of a vapor deposition apparatus in accordance with the present invention.

Turning to FIG. 7 there is shown a schematic cross sectional representation of an apparatus for growing SiC crystals and crystalline structures. The vapor deposition device 700 has a vessel 701 that is associated with, (e.g., thermally associated, positioned to deliver electromagnetic energy, has wrapped around it) various heating elements, e.g., 702. The heating elements are configured and operated to provide at least two different temperature zones, Zone A, 702*a*, and Zone B, 702*b*. Inside of the vessel 701 there is a polymer derived ceramic 703, which is a source of Si and C. Additionally, inside the vessel 701 is a crystal grown initiation article 704.

Thus, in general the polymer derived ceramic 703 is heated to a temperature in Zone A 702*a* to cause the SiC to sublimate, generally a temperature greater than about 2,000° C. The Si C vapors then rise into temperature Zone B, which is cooler than Zone A. The Si C vapors are deposited on the initiation article 704 as SiC.

It being understood that the schematic of the device 700, is a teaching illustration, greatly simplified, and that commercial and industrial devices can have additional components, such as control systems, monitors, gas handling and other devices and can also have different configurations, presently known to those of skill in the art, as well as, new devices and configurations that may be based, in part, upon the teachings of this specification.

Example 35a

In the vapor deposition device 701 the polymer derived ceramic 703 is high purity SiOC. The temperature of Zone A is gradually increased and held at set temperatures to transition the SiOC to SiC and then to cause the SiC to sublimate and form an SiC crystal on the initiation article 704.

Example 35b

In this example the initiation article 704 is a seed crystal and the SiC that is deposited from the polymer derived SiC in Zone A form an alpha mono-crystalline boule. This boule is then sectioned to form polysilocarb derived SiC wafers.

Example 35c

In this example the initiation article 704 is a Si substrate and the SiC from the polymer derived SiC in Zone A is deposited on the substrate as an epitaxial polysilocarb derived SiC layer on the Si substrate.

Example 35d

In the vapor deposition device 701 the polymer derived ceramic 703 is high purity SiOC, having 6 nines purity. The temperature of Zone A is gradually increased and held at set temperatures to transition the SiOC to SiC and then to cause the SiC to sublimate and form an SiC crystal on the initiation article 704.

Example 35e

In the vapor deposition device 701 the polymer derived ceramic 703 is high purity SiOC, having less than 20 ppm Al. The temperature of Zone A is gradually increased and held at set temperatures to transition the SiOC to SiC and then to cause the SiC to sublimate and form an SiC crystal on the initiation article 704.

Example 35f

In the vapor deposition device 701 the polymer derived ceramic 703 is high purity polysilocarb derived SiC, having less than 20 ppm Al. The SiC sublimates to form a SiC crystal on the initiation article 704, which is a seed crystal.

Example 36

The vapor deposition device 701 is a hot wall reactor.

Example 37

The vapor deposition device 701 is a multiwafer reactor.

Example 38

The vapor deposition device 701 is a chimney reactor.

Example 39

A boule of polysilocarb derived SiC having a length of about 1 inch and a diameter of about 4 inches. The boule is alpha type and is free from micropipes. The boule having less than 100, less than 10, and preferable no 1 micropores.

Example 39a

A boule of polysilocarb derived SiC has micropipe density of $<10/cm^2$, $<5/cm^2$, $<1/cm^2$, $<0.5/cm^2$ and most preferably $<0.1/cm^2$.

Example 40

A metal-semiconductor filed effect transistor (MESFET) is made from polysilocarb derived SiC. This MESFET is incorporated into compound semiconductor device, operating in the 45 GHz frequency range.

Example 41

A metal-semiconductor filed effect transistor (MESFET) is made from polysilocarb derived SiC. This MESFET is incorporated into a component of a cellular base station.

Example 42

A boule of polysilocarb derived SiC having a length of about 2 inches and a diameter of about 4 inches. The boule is doped to form p wafers for a semiconductor device.

Example 43

A boule of polysilocarb derived SiC having a length of about 2 inches and a diameter of about 4 inches. The boule is doped to form n wafers for a semiconductor device.

Example 44

Figure 8:
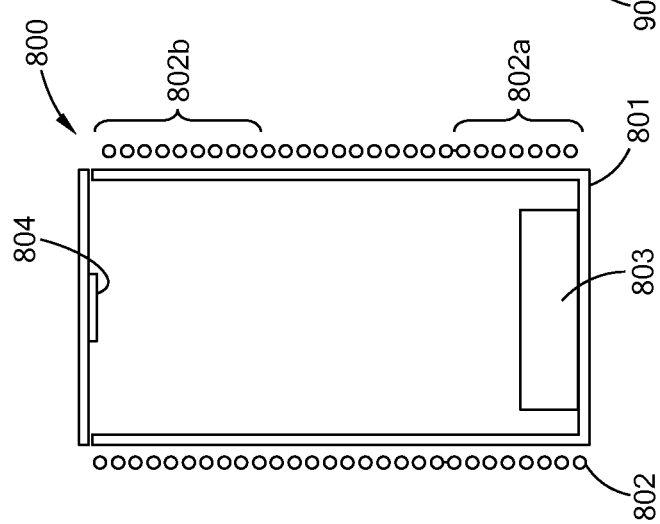
FIG. 8 is a schematic cross sectional diagram of a vapor deposition apparatus in accordance with the present invention.

Turning to FIG. 8 there is shown a schematic cross sectional representation of an apparatus for growing SiC crystals and crystalline structures. The vapor deposition device 800 has a vessel 801 that is associated with heat sources 802. The heat sources, and vessel and heat sources, can be any of the assemblies described in this specification or that are know to the art. The heat sources are configured and operated to provide at least two different temperature zones, Zone A, 802a, and Zone B, 802b. Inside of the vessel 801 there is a polymer derived ceramic 803, which is a source of Si and C. The polymer derived ceramic 803 is the polysilocarb of Example 6 that has been cured and transformed into SiC according to Example 14. Additionally, inside the vessel 801 is a crystal grown initiation article 804.

Thus, in general the polymer derived ceramic 803 is heated to a temperature in Zone A 802a to cause the SiC to sublimate, generally a temperature greater than about 2,400° C. The Si C vapors then rise into temperature Zone B, which is cooler than Zone A. The Si C vapors are deposited on the initiation article 804 as SiC.

It being understood that the schematic of the device 800, is a teaching illustration, greatly simplified, and that commercial and industrial devices can have additional components, such as control systems, monitors, gas handling and other devices and can also have different configurations, presently known to those of skill in the art, as well as, new devices and configurations that may be based, in part, upon the teachings of this specification.

Example 45

Figure 9:
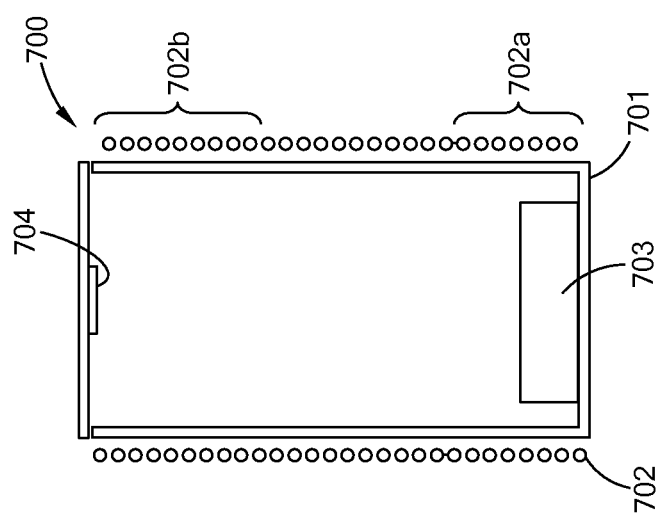
FIG. 9 is a schematic cross sectional diagram of a vapor deposition apparatus in accordance with the present invention.

Turning to FIG. 9 there is shown a schematic cross sectional representation of an apparatus for growing SiC crystals and crystalline structures. The vapor deposition device 900 has a vessel 901 that is associated with heat sources 902. The heat sources, and vessel and heat sources, can be any of the assemblies described in this specification or that are know to the art. The heat sources are configured and operated to provide at least two different temperature zones, Zone A, 902a, and Zone B, 902b. Inside of the vessel 901 there is a polymer derived ceramic 903, which is a source of Si and C. The polymer derived ceramic 903 is the polysilocarb of Example 7 that has been cured and transformed into SiC according to Example 15. Additionally, inside the vessel 901 is a crystal grown initiation article 904.

Thus, in general the polymer derived ceramic 903 is heated to a temperature in Zone A 902a to cause the SiC to sublimate, generally a temperature about 2,500° C. The Si C vapors then rise into temperature Zone B, which is cooler than Zone A. The Si C vapors are deposited on the initiation article 904 as SiC.

It being understood that the schematic of the device 900, is a teaching illustration, greatly simplified, and that commercial and industrial devices can have additional components, such as control systems, monitors, gas handling and other devices and can also have different configurations, presently known to those of skill in the art, as well as, new devices and configurations that may be based, in part, upon the teachings of this specification.

Example 46

It is theorized that excess or added carbon in the polysicocarb derived SiC material functions as a sintering aid. Polysilocarb derived SiC, having a purity of at least about 7-nines, having at about 0.05% to 0.5% excess carbon, is formed into small particles, about 0.1 µm. These particles are then sintered together to form a SiC article. No additional sintering aid is required to form a solid SiC article. This "carbon-sintered" article, is substantially stronger than a similar article that is formed with the use of a traditional sintering aid.

Example 46a

Polysilocarb derived SiC having a purity of at least about 7-nines is formed into small particles, about 0.1 µm. These particles are then sintered together to form a SiC article. No additional sinter aid is required to to form a solid SiC article. This "self" sintered article, is substantially stronger than a similar article that is formed with the use of a traditional sintering aid.

Example 47

High purity polysilocarb derived SiC is formed into small particles. The particle size is small enough so to not affect a preselected wavelength, or wavelength range, of light. The SiC particles are sintered together to form an optical element, that is transmissive to light at the preselected wavelength.

Example 48

A block of polysilocarb derived SiC is porous. The block of polysilocarb material is for use in a vapor deposition apparatus.

Example 49

A polysilocarb derived SiC particle that is essentially free from an oxide layer on its surface.

Example 50

A polysilocarb derived SiC high temperature field effect gas sensor, with the SiC semiconductor material having a band gap of about 3.2 eV. This sensor is capable of operating at temperatures as high as 1,000° C.

Example 51

A polysilocarb derived SiC GTO (gate turnoff thyristor) is a component of a three-phase dc-ac inverter. This device can provide about 1,200-V forward blocking voltage and a controllable density of 500 A/cm$^2$.

Example 52

Polysilocarb derived SiC particles, having an average diameter of less than 0.25 µm, (and preferably about 0.1 µm and smaller) are essential free from an oxide layer on their surface. The SiC particles being ready to press (RTP), e.g., they can be sintered into a volumetric shape with minimal use of sintering aids, and preferably without the need for sintering aids. The "self-sintered SiC article, is substantially stronger than a similar SiC article that is formed with the use of sintering aids.

Example 52a

The SiC particles of Example 52, in which the polysilocarb derived high purity SiC particles are at least 5-nines pure, are sintered to form a SiC optic.

Example 52b

The SiC particles of Example 52, in which the polysilocarb derived high purity SiC particles are at least 3-nines pure, are sintered to form a SiC wafer.

Example 52c

The SiC particles of Example 52, in which the polysilocarb derived high purity SiC particles are 7-nines pure, are sintered to form a SiC wafer, preferably without the use of sintering aids.

Example 53

A precursor formulation was made using polymerization of 20 g of tetravinyltetramethylcyclotetrasiloxane with 0.5% of Luperox 231 peroxide catalyst. The formulation was cured at 115° C. for 60 minutes. The cured polymer was converted to SiC at 1675° C. The final density measured 3.2 g/cc.

Example 54

200 g of tetravinyltetramethylcyclotetrasiloxane was purified by distillation prior to use. A precursor formulation was made using 20 g of distilled tetravinyltetramethylcyclotetrasiloxane and was catalyzed with 0.5% of Luperox 231. The formulation was cured at 115° C. for 60 minutes. The cured polymer was converted to SiC at 1675° C. The final density measured 3.2 g/cc

Example 55

A precursor formulation was made using 2 g MH and 18 g of TV. 0.5% of Luperox 231 was added, as well as 2 ppm Pt catalyst. The formulation was cured at 115° C. for 60 minutes. The cured polymer was converted to SiC at 1675° C. The final density measured 3.2 g/cc

Example 56

A precursor formulation was made using 99% MH and 1% of Pt catalyst solution (10 ppm). The formulation was cured at 115° C. for 60 minutes and pyrolized to 1000° C. for 2 hours.

Example 57

A peroxide catalyst is added to the polysilocarb formulation of Examples 1-3 and these catalyzed formulations are added drop wise (e.g., drops of the formulation are dropped into) to a 50-120° C. hot water bath to cure the formulation. The time in the hot water bath was about 1-2 minutes. The cured drop structures were then pyrolized at 950° C. for about 60 minutes. The pyrolized structures were hollow spheres with densities of less than about 1 g/cc, diameters of about 60 microns to about 2 mm, and crush strengths of about 0.5-2 ksi. These hollow spheres are then milled to a size of less than 1 micron.

Example 58

10 ppm of a platinum catalyst is added to each of the polysilocarb batches of Examples 4-10 and these catalyzed batches are dropped on a tray to form droplets and are cured in an air oven at about 125° C. for about 30 minutes. The cured drop structures were slightly non-round beads with densities of about 1.1-1.7 g/cc, diameters of about 200 microns to about 2 mm, and crush strengths of about 3-7 ksi.

Example 59

A peroxide catalyzed polysilocarb batch is added to a water bath at 50-95° C., under strong agitation and preferably in the presence of a surfactant, which more preferably does not constitute an impurity. Green cured submicron beads (e.g., <1 µm) that are formed in the water bath are then removed from the water bath. The green cured beads are then, cured, pyrolized and converted to SiC.

Example 60

A peroxide catalyzed polysilocarb batch is added to a water bath at 50-95° C., under strong agitation and preferably in the presence of a surfactant, which more preferably does not constitute an impurity. Green cured beads that are formed in the water bath are then removed from the water bath. The green cured beads may then be removed from the water, or kept in the water, for later use, e.g., conversion to SiC.

Example 61

A peroxide catalyzed polysilocarb batch, from Examples 1-13, is added to a water bath at 80° C., under strong agitation and preferably in the presence of a surfactant, which more preferably does not constitute an impurity. Green cured 2 µm beads that are formed in the water bath are then removed from the water bath. The green cured beads are then, cured, and pyrolized.

Example 62

A platinum catalyzed polysilocarb batch, from Examples 1-13, is added to a water bath at 100° C., under agitation. Green cured 2 mm beads that are formed in the water bath are then removed from the water bath. The green cured beads are then, cured, pyrolized and converted to SiC.

Example 63

A peroxide catalyzed polysilocarb batch is added to a water bath at 50-95° C., under strong agitation and preferably in the presence of a surfactant, which more preferably does not constitute an impurity. Green cured 5 µm beads (e.g., <1) that are formed in the water bath are then removed from the water bath. The green cured beads are then, cured, pyrolized and converted to SiC.

Example 64

A peroxide catalyzed polysilocarb batch is added to a water bath at 95° C., under strong agitation and preferably in the presence of a surfactant, which more preferably does not constitute an impurity. Green cured beads that are formed in the water bath are then removed from the water bath. The green cured beads may then be removed from the water, or kept in the water, for later use, e.g., conversion to SiC.

Example 65

A peroxide catalyzed polysilocarb batch, from Examples 1-13, is added to a water bath at 80° C., under strong agitation and preferably in the presence of a surfactant, which more preferably does not constitute an impurity. Green cured 2 µm beads that are formed in the water bath are then removed from the water bath. The green cured beads are then, cured, pyrolized and converted to SiC.

Example 66

A platinum catalyzed polysilocarb batch, from Examples 1-13, is added to a water bath at 100° C., under agitation. Green cured 2 mm beads that are formed in the water bath are then removed from the water bath. The green cured beads are then, cured, pyrolized and converted to SiC.

Example 67

Polysilocarb derived SiC particles, having an average diameter of about 0.4 µm, are essential free from an oxide layer on their surface. The SiC particles being ready to press (RTP), e.g., they can be sintered into a volumetric shape with minimal use of sintering aids, and preferably without the need for sintering aids.

Example 68

Polysilocarb derived SiC particles, having an average diameter of about 0.6 µm, are essential free from an oxide layer on their surface. The SiC particles being ready to press (RTP), e.g., they can be sintered into a volumetric shape with minimal use of sintering aids, and preferably without the need for sintering aids.

Example 69

Polysilocarb derived SiC particles, having an average diameter of about 0.4 to 0.6 µm, are essential free from an oxide layer on their surface. The SiC particles being ready to press (RTP), e.g., they can be sintered into a volumetric shape with minimal use of sintering aids, and preferably without the need for sintering aids.

Example 70

A blast and impact shield is formed using one of more layers of high purity polysilocarb silicon carbide sintered into a sheet material. Layers of polysilocarb derived silicon carbide sheets are bonded to a substrate. The layers are reinforced and can be done so with varied weave patterns between the layers. The composite layers structure provides protection against blasts, projectiles and explosions. This shield can weigh less than conventional shields and armor, while providing equal or better protection.

Example 71

A blast and impact shield is formed using one of more layers of high purity polysilocarb silicon carbide, having 6-nines purity, no oxygen, and a particle size of 0.1 microns is sintered, without the need for a sintering aid, into a sheet material. The polysilocarb derived silicon carbide sheets are used as a component in a blast and impact shield. That may be used in personal body armor and vehicle armor.

Example 72

A ballistic composite structure has 12 Layers of 1200 g/sq. meter fiberglass, 20 layers of unidirectional carbon fiber oriented at 0.45,−45.90 in 5 sections to make 20 layers, and 1 layer of polysilocarb derived silicon carbide as face sheet. The fiberglass can be bonded together using, a polysilocarb batch, and a warm press at 150-160 C for 1-2 hours and a minimum of 500 psi pressure to form a fiberglass plate. The 20 layers of carbon fiber cloth can be bonded together under same conditions to form a carbon fiber plate. The fiberglass plate, the carbon fiber plate and the polysilocarb silicon carbide derived sheet are bonded in one step using a polysilocarb batch as the bonder between the silicon carbide sheet and the carbon fiber plate and between the carbon fiber plate and the fiberglass plate.

Example 73

Ultra pure SiOC, of the formulations provided in this specification and having at least about 5-nines, and preferably about 6-nines purity, is used to make transparent SiOC articles in the processes disclosed and taught in U.S. Pat. No. 5,180,694, the entire disclosure of which is incorporated herein by reference.

Example 74

Ultra pure SiOC, of the formulations provided in this specification and having at least about 5-nines, and preferably about 6-nines purity is used to make SiOC layers and coatings on articles and in the processes disclosed and taught in U.S. Pat. No. 8,981,564.

Example 75

Ultra pure SiOC, of the formulations provided in this specification and having at least about 5-nines, and preferably about 6-nines purity is used to make SiOC layers and coatings on articles and in the processes disclosed and taught in U.S. Pat. No. 8,778,814.

It is noted that there is no requirement to provide or address the theory underlying the novel and groundbreaking processes, materials, performance or other beneficial features and properties that are the subject of, or associated with, embodiments of the present inventions. Nevertheless, various theories are provided in this specification to further advance the art in this area. These theories put forth in this specification, and unless expressly stated otherwise, in no way limit, restrict or narrow the scope of protection to be afforded the claimed inventions. These theories many not be required or practiced to utilize the present inventions. It is further understood that the present inventions may lead to new, and heretofore unknown theories to explain the function-features of embodiments of the methods, articles, materials, devices and system of the present inventions; and such later developed theories shall not limit the scope of protection afforded the present inventions.

The various embodiments of formulations, batches, materials, compositions, devices, systems, apparatus, operations activities and methods set forth in this specification may be used in the various fields where SiC and Si find applicability, as well as, in other fields, where SiC, Si and both, have been unable to perform in a viable manner (either cost, performance or both). Additionally, these various embodiments set forth in this specification may be used with each other in different and various combinations. Thus, for example, the configurations provided in the various embodiments of this specification may be used with each other; and the scope of protection afforded the present inventions should not be limited to a particular embodiment, configuration or arrangement that is set forth in a particular embodiment, example, or in an embodiment in a particular Figure.

The inventions may be embodied in other forms than those specifically disclosed herein without departing from their spirit or essential characteristics. The described embodiments are to be considered in all respects only as illustrative and not restrictive.

What is claimed:

1. A method of making an article comprising ultra pure silicon carbide, the method comprising:
   a. combining a first liquid comprising silicon, carbon and oxygen with a second liquid comprising carbon;
   b. curing the combination of the first and second liquids to provide a cured SiOC solid material, consisting essentially of silicon, carbon and oxygen;
   c. heating the SiOC solid material in an inert atmosphere and at a temperature sufficient to convert SiOC to SiC, thereby converting the SiOC solid material to an ultra pure polymer derived SiC having a purity of at least 99.999%; and,
   d. forming a single crystal SiC structure, comprising a polytype selected from the group consisting of 4H SiC, 6H SiC and 3C SiC, by vapor deposition of the ultra pure polymer derived SiC; wherein the vapor deposed structure is defect free and has a purity of at least 99.9999%.

2. The method of claim 1, wherein the single crystal SiC structure consists essentially of 4H SiC.

3. The method of claim 1, wherein the single crystal SiC structure consists essentially of 6H SiC.

4. The method of claim 1, wherein the single crystal SiC structure consists of 4H SiC.

5. The method of claim 1, wherein the single crystal SiC structure consists of 6H SiC.

6. The method of claim 1, wherein the combination of the first and the second liquids is a polysilocarb precursor formulation having a molar ratio of about 30% to 85% carbon, about 5% to 40% oxygen, and about 5% to 35% silicon.

7. The method of claim 1, wherein the single crystal SiC structure is a boule.

8. The method of claim 1, wherein the single crystal SiC is a layer.

9. The method of claim 1, wherein the single crystal SiC structure is a layer on a substrate.

10. The method of claim 1, wherein the single crystal SiC structure is a layer on a substrate, wherein the substrate is comprised of Si.

11. The method of claim 1, wherein the single crystal SiC structure is a layer on a substrate, wherein the substrate is comprised of SiC.

12. The methods of claim 1, wherein the single crystal SiC is sectioned and thereby manufactured into a wafer.

13. The method of claim 1, wherein the single crystal SiC is sectioned and etched and thereby manufactured into a semiconductor.

14. A method of making a SiC, the method comprising:
a. placing polymer derived SiC particles in a vapor deposition apparatus, wherein the SiC particles have a purity of at least 99.999%, and wherein the SiC particles have the ability to resist, and do not form an oxide layer when exposed to air under standard temperatures and pressures, whereby the SiC particles are free from an oxide layer; and,
b. directly vaporizing the SiC particles and depositing the vapors on a target to form a SiC crystal, comprising a polytype selected from the group consisting of 4H SiC and 6H SiC; wherein the vaporization occurs without the need for a preheating step of the SiC particles.

15. The method of claim 14, wherein the single crystal SiC structure consists essentially of 4H SiC.

16. The method of claim 14, wherein the single crystal SiC structure consists essentially of 6H SiC.

17. The method of claim 14, wherein the single crystal SiC structure consists of 4H SiC.

18. The method of claim 14, wherein the single crystal SiC structure consists of 6H SiC.

19. The method of claim 14, wherein the SiC crystal is a boule.

20. The method of claim 14, wherein the target is a substrate.

21. The method of claim 20, wherein the substrate is comprised of Si.

22. The method of claim 20, wherein the substrate is comprised of SiC.

23. The method of claim 14, wherein the SiC crystal is sectioned and thereby manufactured into a wafer.

24. The method of claim 14, wherein the SiC crystal is a boule and is essentially free from micropipes.

* * * * *